US012635258B2

(12) United States Patent
Yamazaki et al.

(10) Patent No.: US 12,635,258 B2
(45) Date of Patent: May 19, 2026

(54) METHOD FOR MODIFYING INSULATING FILM AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Fumito Isaka, Zama (JP); Yoichi Iikubo, Machida (JP); Yuji Egi, Atsugi (JP); Yasuhiro Jinbo, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 536 days.

(21) Appl. No.: 18/019,924

(22) PCT Filed: Aug. 6, 2021

(86) PCT No.: PCT/IB2021/057243

§ 371 (c)(1),
(2) Date: Feb. 6, 2023

(87) PCT Pub. No.: WO2022/038453

PCT Pub. Date: Feb. 24, 2022

(65) Prior Publication Data

US 2023/0317832 A1     Oct. 5, 2023

(30) Foreign Application Priority Data

Aug. 19, 2020    (JP) ................................. 2020-138573

(51) Int. Cl.
*H10D 99/00* (2025.01)
*H01L 21/02* (2006.01)

(52) U.S. Cl.
CPC ....... *H10D 99/00* (2025.01); *H01L 21/02164* (2013.01); *H01L 21/02178* (2013.01);
(Continued)

(58) Field of Classification Search
CPC ...... H10D 99/00; H10D 30/021; H10D 30/67; H10D 84/00; H10D 84/038;
(Continued)

(56) References Cited

U.S. PATENT DOCUMENTS 8,455,868 B2    6/2013 Yamazaki et al.
8,547,771 B2   10/2013 Koyama
(Continued)

FOREIGN PATENT DOCUMENTS

JP    2011-151383 A    8/2011
JP    2012-257187 A   12/2012
(Continued)

OTHER PUBLICATIONS

International Search Report (Application No. PCT/IB2021/057243) Dated Oct. 19, 2021.
(Continued)

*Primary Examiner* — Julia Slutsker
(74) *Attorney, Agent, or Firm* — Eric J. Robinson; Robinson Intellectual Property Law Office, P.C.

(57)    ABSTRACT

A method for modifying an insulating film is provided. The method includes a first step of preparing an insulating film containing hydrogen, and a second step of performing microwave treatment on the insulating film to release the hydrogen in the insulating film as water molecules, so that a hydrogen concentration in the insulating film is reduced. Note that the microwave treatment is preferably performed using an oxygen gas and an argon gas at a temperature range of higher than or equal to 200° C. and lower than or equal to 300° C., and the proportion of the flow rate of the oxygen gas to the total of the flow rate of the oxygen gas and the flow rate of the argon gas is preferably greater than 0% and less than or equal to 50%.

15 Claims, 37 Drawing Sheets

(52) U.S. Cl.
CPC .... *H01L 21/0228* (2013.01); *H01L 21/02337* (2013.01); *H01L 21/02631* (2013.01)

(58) Field of Classification Search
CPC ................ H10D 84/0126; H10D 84/83; H01L 21/02164; H01L 21/02178; H01L 21/0228; H01L 21/02337; H01L 21/02631; H01L 21/0234; H01L 21/4763; H01L 21/67103; H01L 21/67115; H01L 21/02554; H01L 21/02565; H01L 21/268; H01L 21/31; H10B 12/05
See application file for complete search history.

(56) References Cited

U.S. PATENT DOCUMENTS

| 8,995,174 | B2 | 3/2015 | Koyama | |
| 9,006,733 | B2 | 4/2015 | Yamazaki | |
| 9,349,735 | B2 | 5/2016 | Yamazaki et al. | |
| 9,614,062 | B2 | 4/2017 | Yamazaki | |
| 9,947,777 | B2 | 4/2018 | Yamazaki et al. | |
| 9,991,265 | B2 | 6/2018 | Yamazaki et al. | |
| 9,997,545 | B2 | 6/2018 | Yamazaki | |
| 10,553,589 | B2 | 2/2020 | Yamazaki et al. | |
| 10,741,679 | B2 | 8/2020 | Yamazaki et al. | |
| 11,031,506 | B2 | 6/2021 | Yamazaki et al. | |
| 11,177,792 | B2 | 11/2021 | Koyama | |
| 11,456,296 | B2 | 9/2022 | Yamazaki et al. | |
| 11,508,850 | B2 | 11/2022 | Yamazaki et al. | |
| 2003/0015764 | A1* | 1/2003 | Raaijmakers | H01L 21/3141 |
| | | | | 257/E21.546 |
| 2013/0193493 | A1 | 8/2013 | Yamazaki | |
| 2014/0008647 | A1* | 1/2014 | Yamazaki | H10D 99/00 |
| | | | | 257/43 |
| 2015/0214342 | A1* | 7/2015 | Yamazaki | H10D 86/60 |
| | | | | 438/104 |
| 2015/0280691 | A1 | 10/2015 | Koyama | |
| 2020/0075769 | A1* | 3/2020 | Yamazaki | H10D 30/6734 |
| 2021/0175361 | A1* | 6/2021 | Yamazaki | H10D 30/69 |
| 2021/0320192 | A1* | 10/2021 | Yamazaki | H01L 21/443 |
| 2021/0328580 | A1 | 10/2021 | Koyama | |
| 2023/0047051 | A1 | 2/2023 | Yamazaki et al. | |

FOREIGN PATENT DOCUMENTS

| JP | 2015-146444 | A | 8/2015 | |
| JP | 2017-199900 | A | 11/2017 | |
| JP | 2019-047101 | A | 3/2019 | |
| JP | 2020-053680 | A | 4/2020 | |
| WO | WO-2019111106 | A1 * | 6/2019 | ......... H01L 21/8234 |
| WO | WO-2020/049396 | | 3/2020 | |
| WO | WO-2020/049425 | | 3/2020 | |

OTHER PUBLICATIONS

Written Opinion (Application No. PCT/IB2021/057243) Dated Oct. 19, 2021.

* cited by examiner

FIG. 6A
FIG. 6C
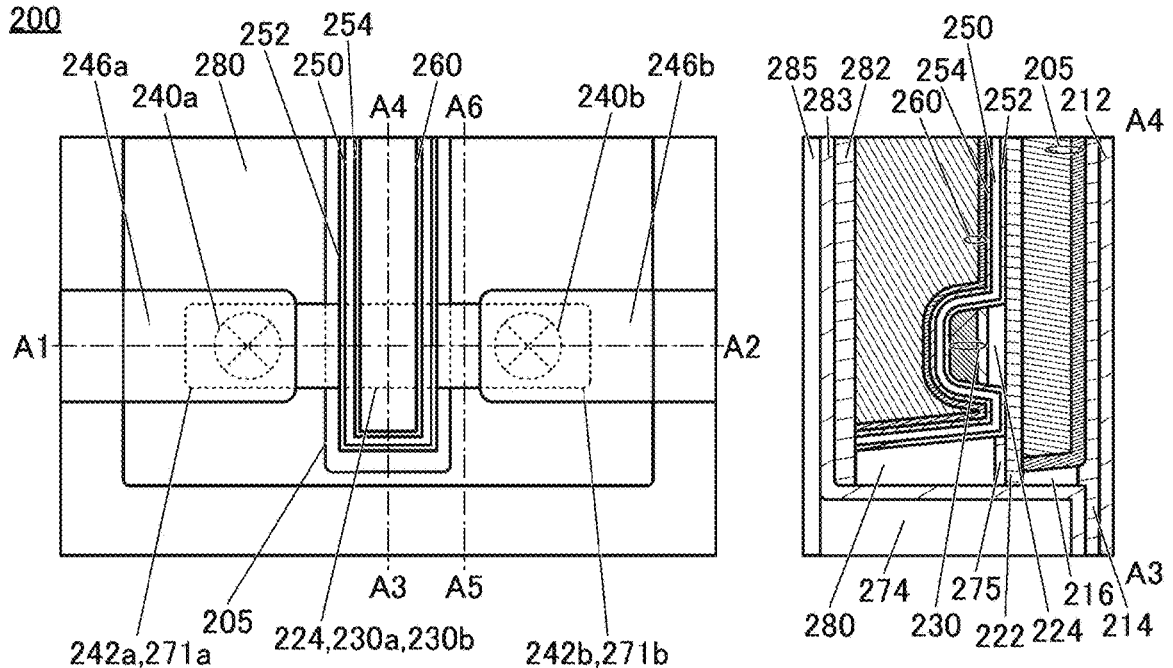
FIG. 6B
FIG. 6D
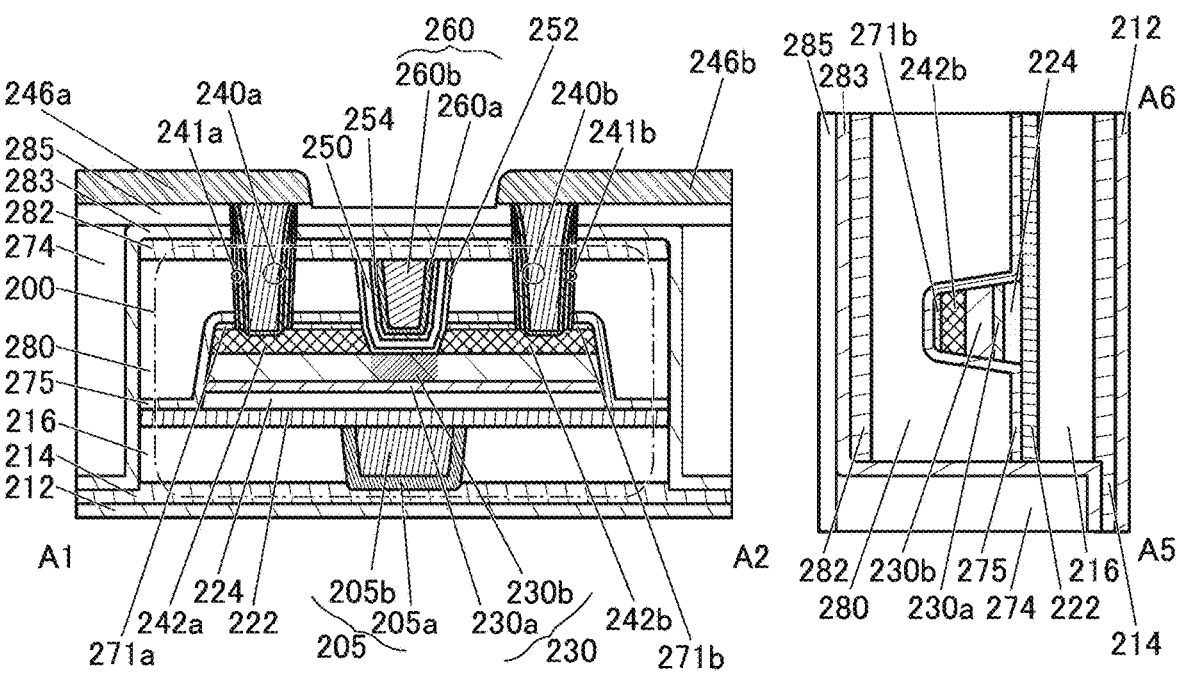

FIG. 8A
Intermediate state
New crystalline phase
| Amorphous | Crystalline | Crystal |
|---|---|---|
| •completely amorphous | •CAAC •nc •CAC  excluding single crystal and poly crystal | •single crystal •poly crystal |
FIG. 8B
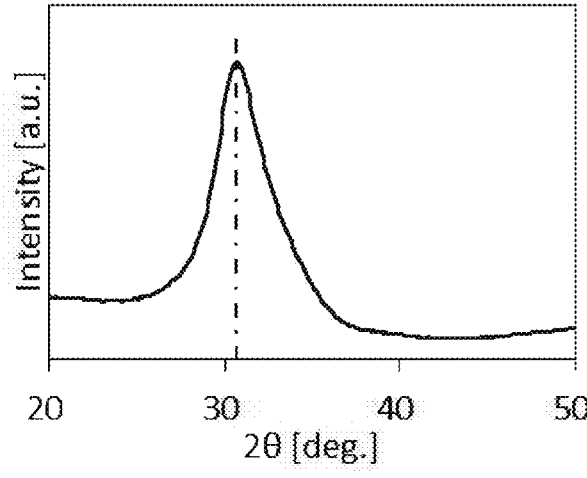
FIG. 8C
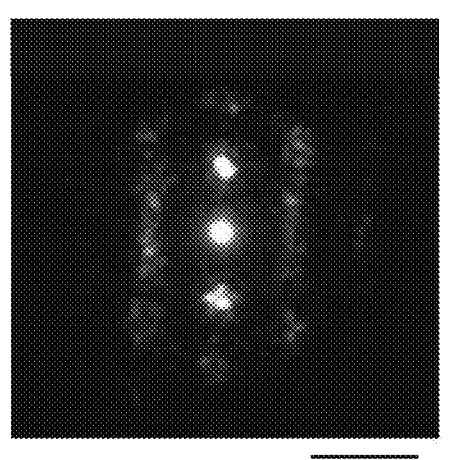
5 nm⁻¹

222,224A,230A,230B,242A,271A

FIG. 10A
FIG. 10C
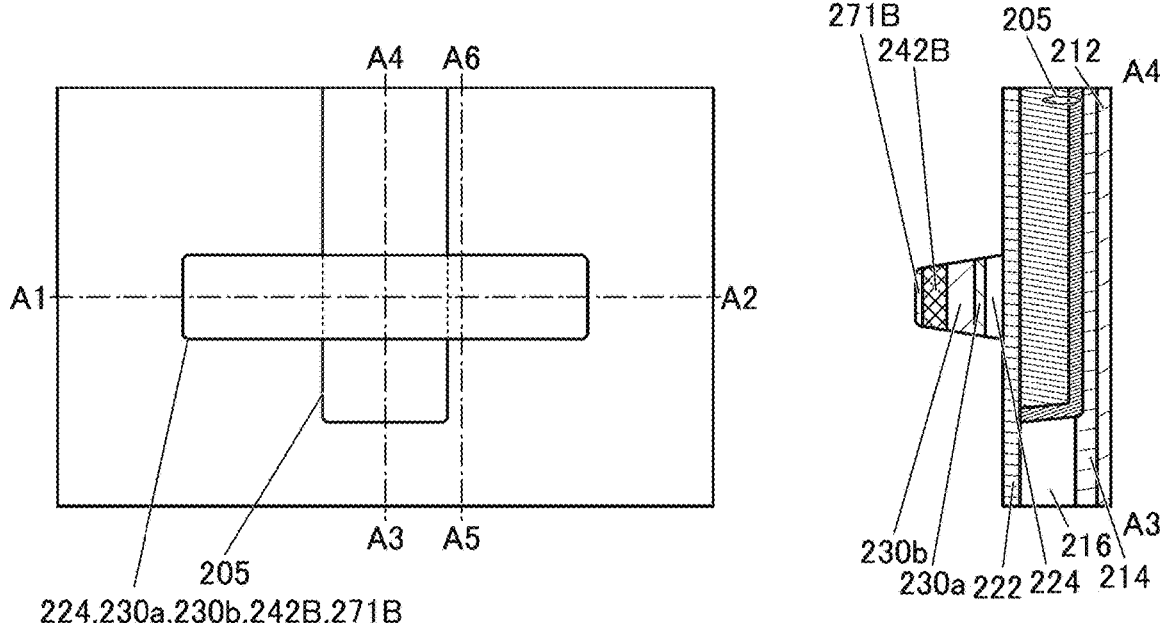
FIG. 10B
FIG. 10D
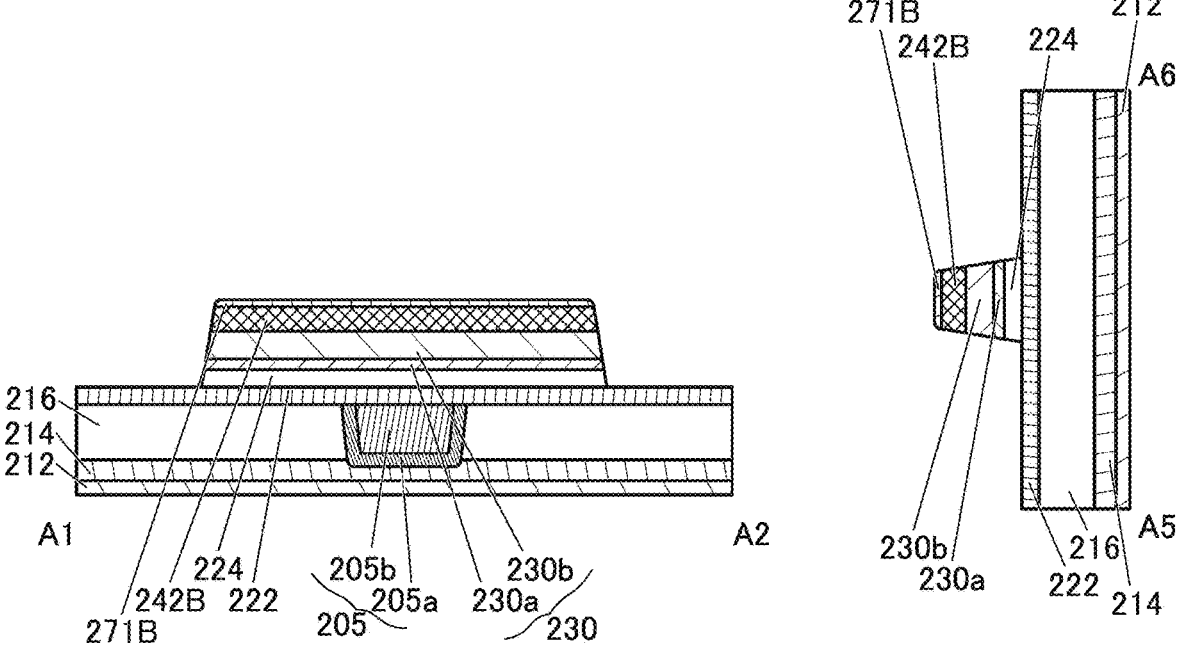

FIG. 12A
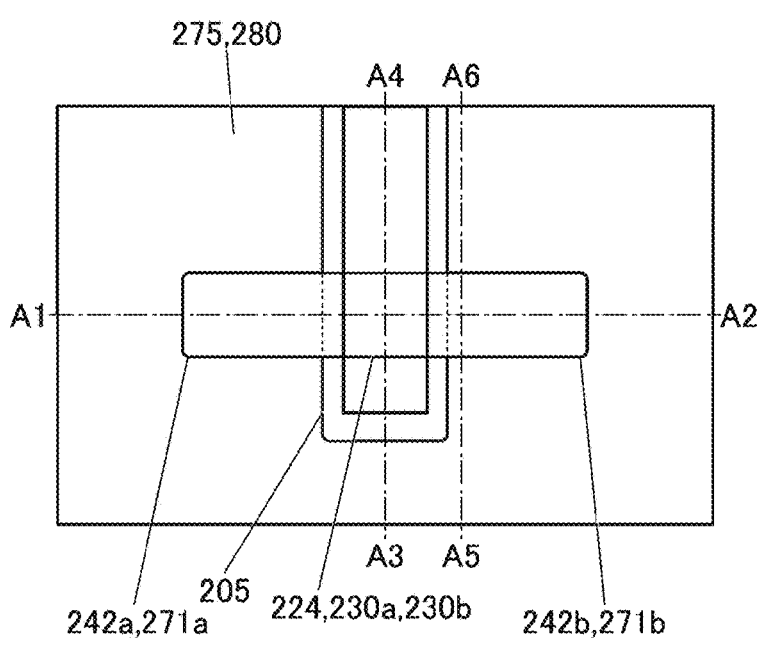
FIG. 12C
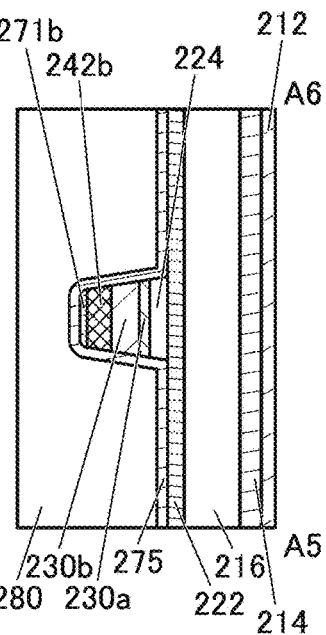
FIG. 12B
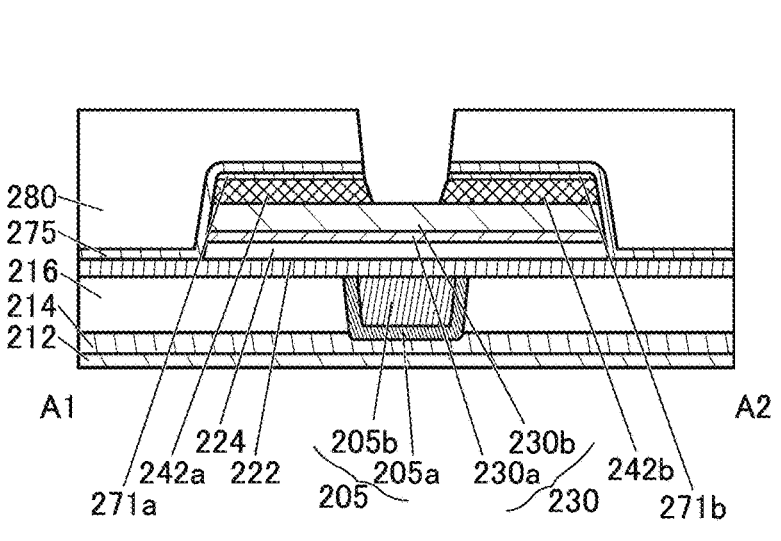
FIG. 12D

FIG. 13A
252A,250A
A4   A6
A1 ———————————————— A2
A3   A5
242a,271a     205     224,230a,230b     242b,271b
FIG. 13C
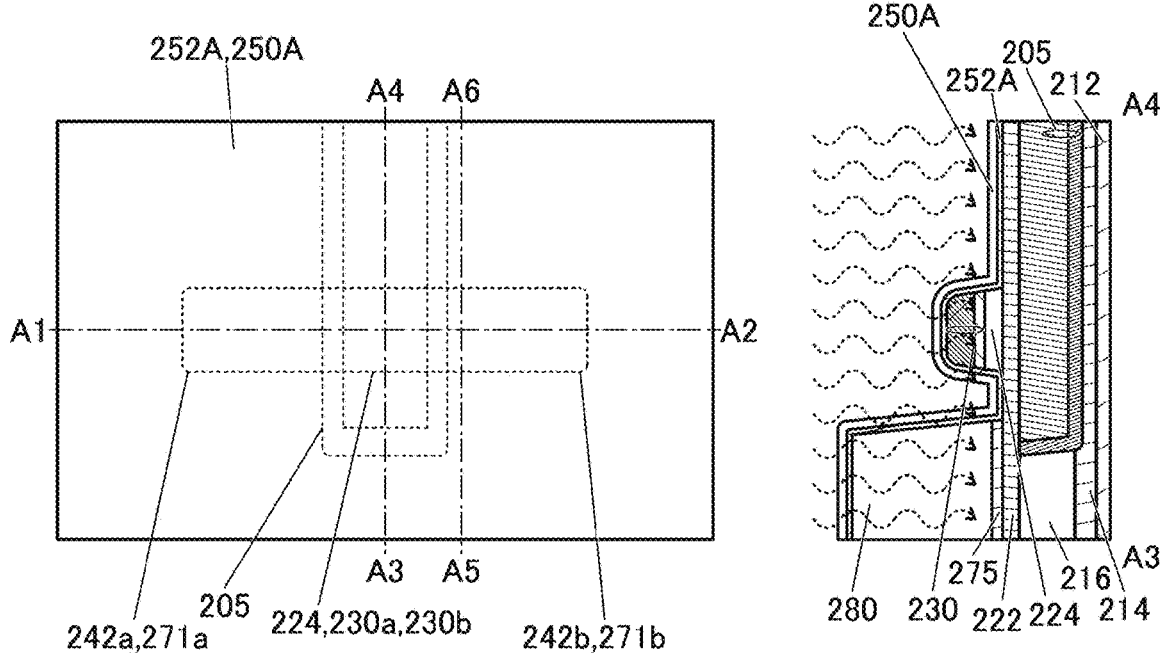
250A
252A   205   212
A4
280   230   275   222   224   216   214   A3
FIG. 13B
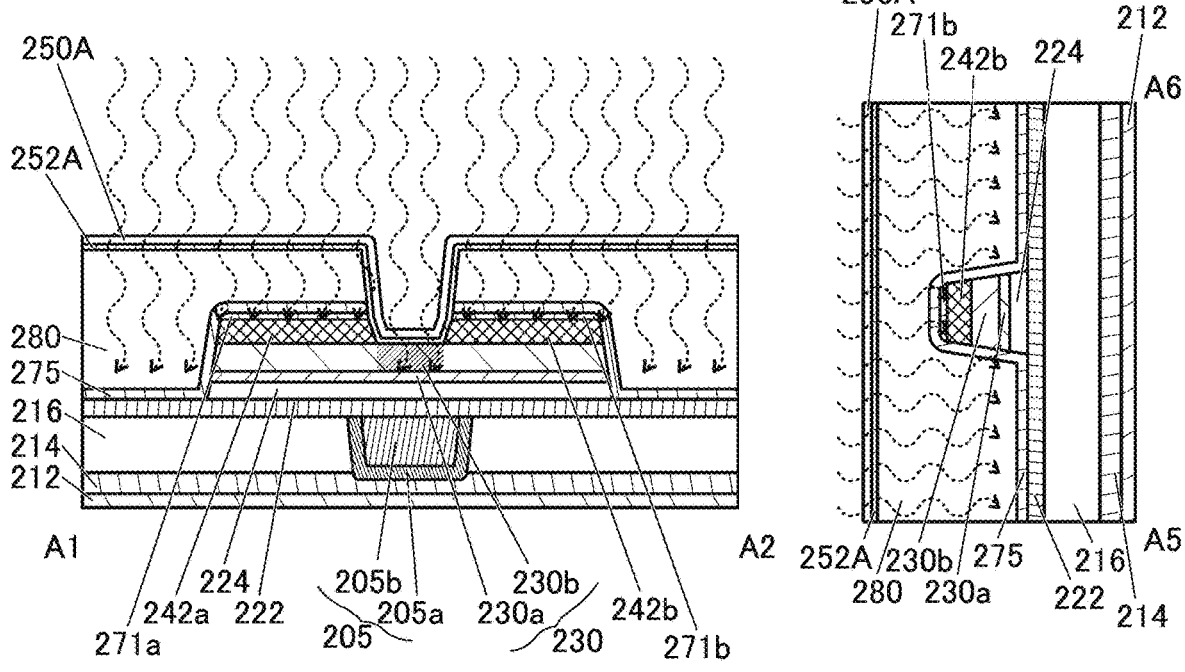
250A
252A
280
275
216
214
212
A1
271a   242a   224   222   205   205b   205a   230a   230b   242b   271b   230
FIG. 13D
250A
271b   242b   224   212
A6
A2   252A   230b   275   216   222   A5
280   230a   214

FIG. 14A
FIG. 14C
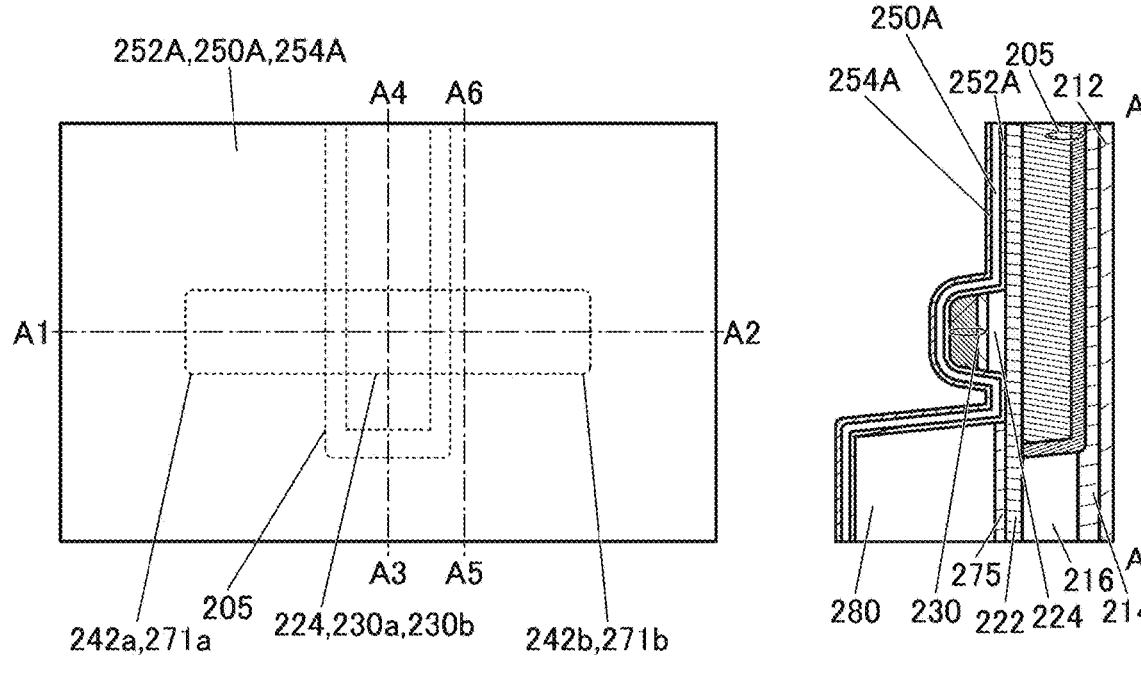
FIG. 14B
FIG. 14D
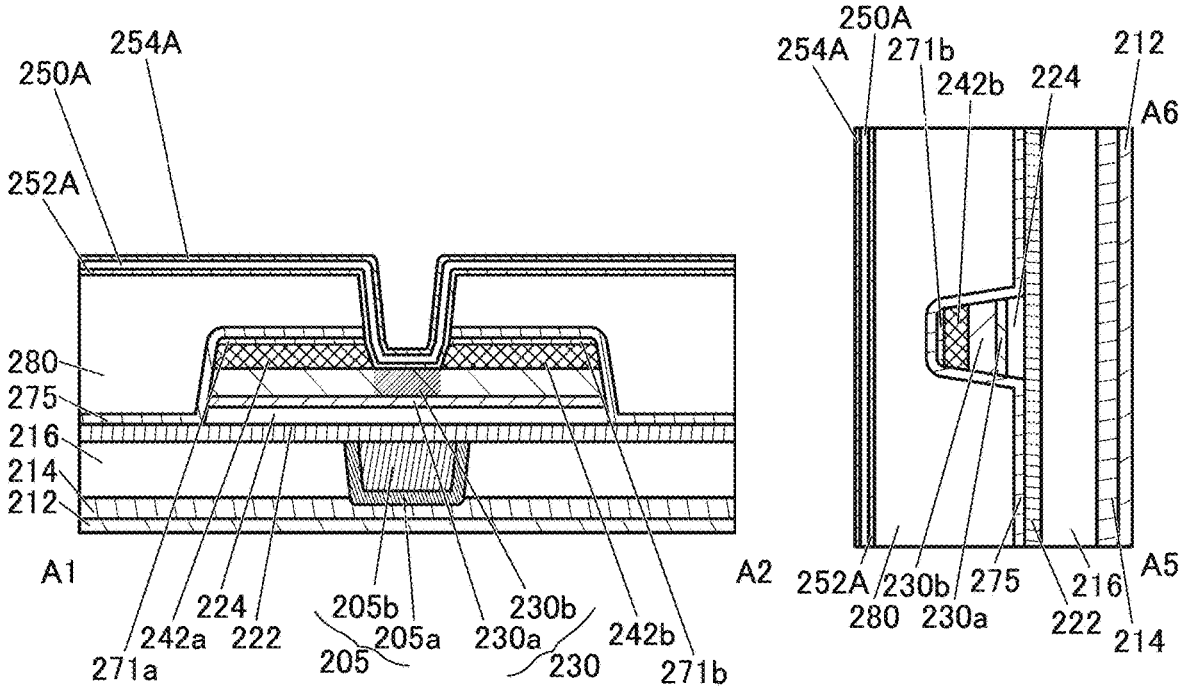

FIG. 15A
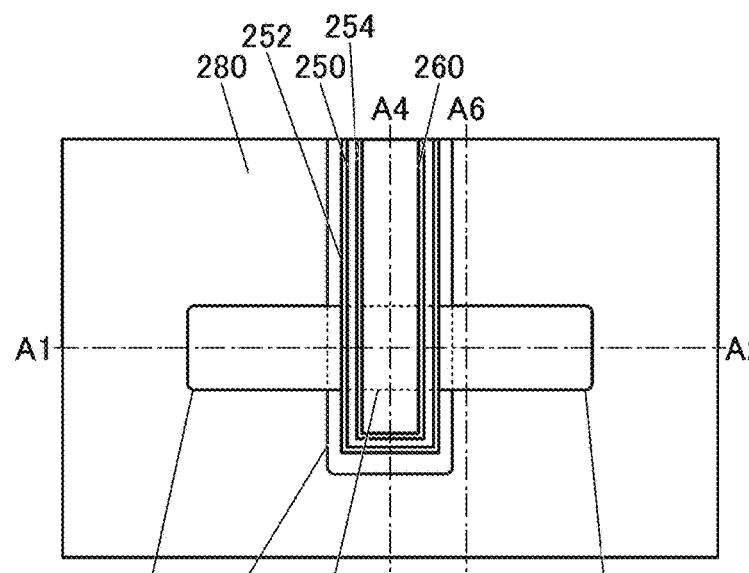
FIG. 15C
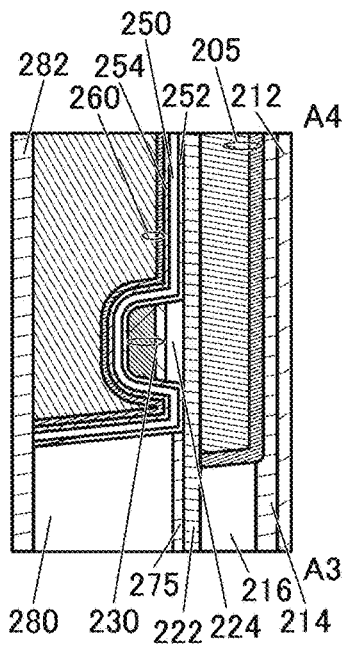
FIG. 15B
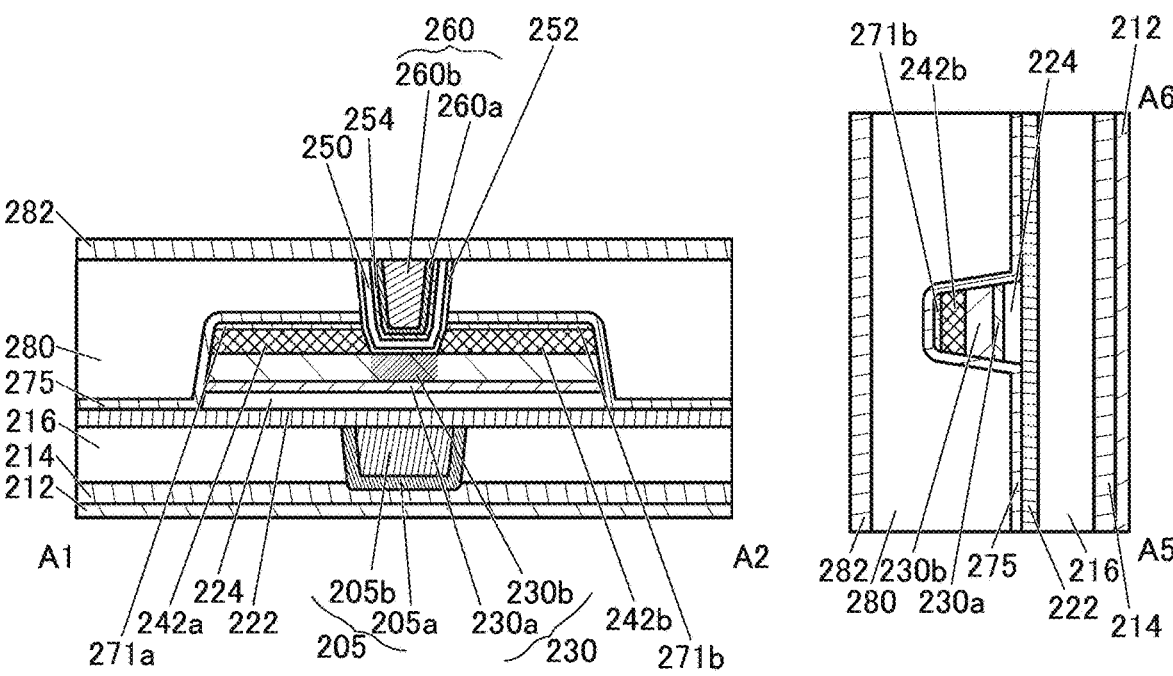
FIG. 15D

FIG. 16A
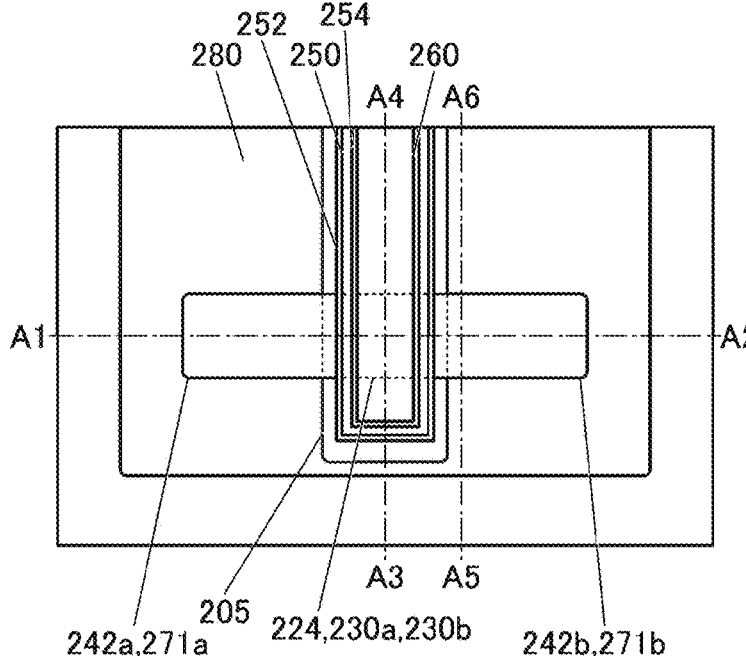
FIG. 16C
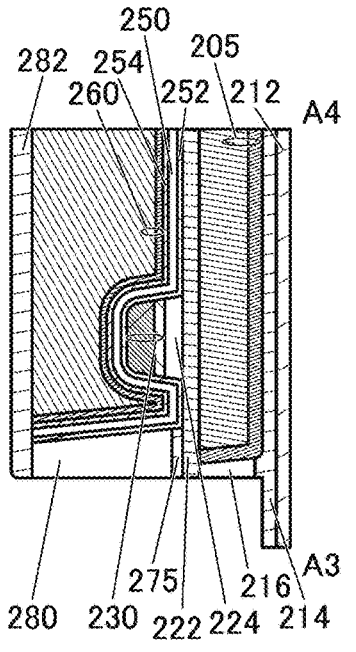
FIG. 16B
FIG. 16D
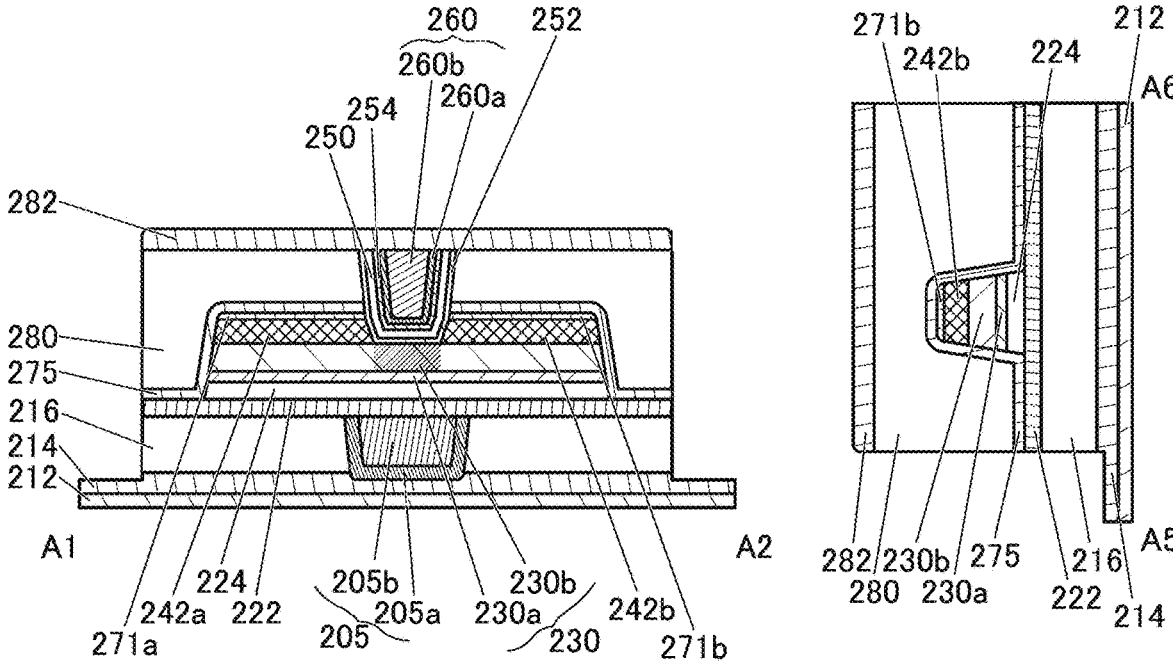

FIG. 17A
FIG. 17C
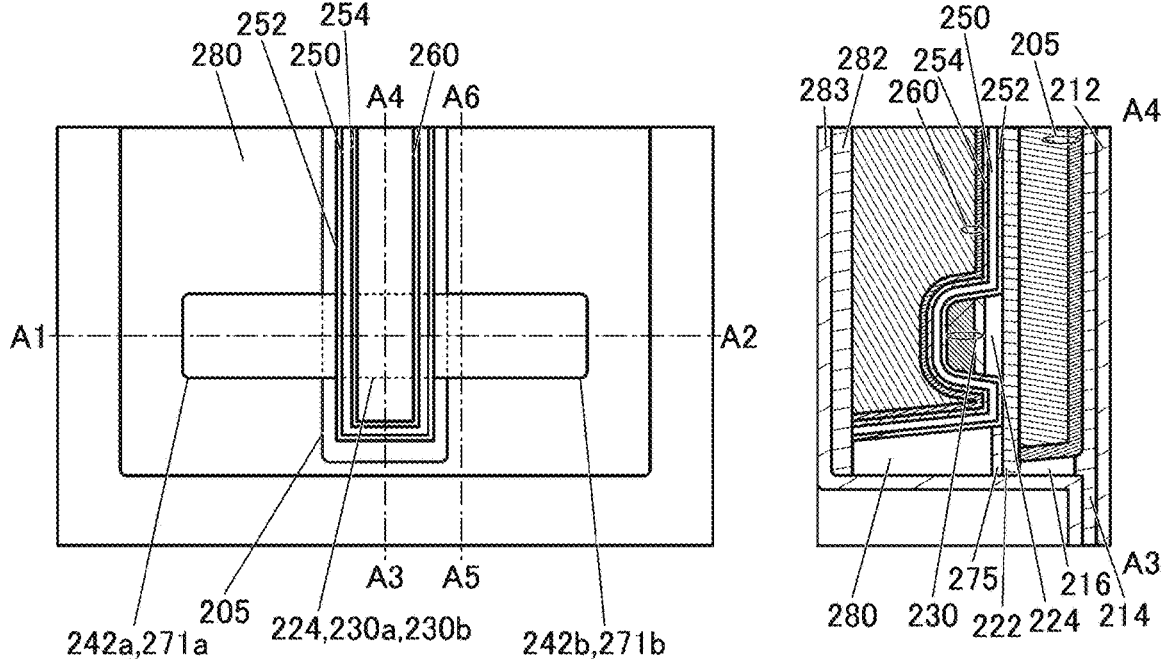
FIG. 17B
FIG. 17D
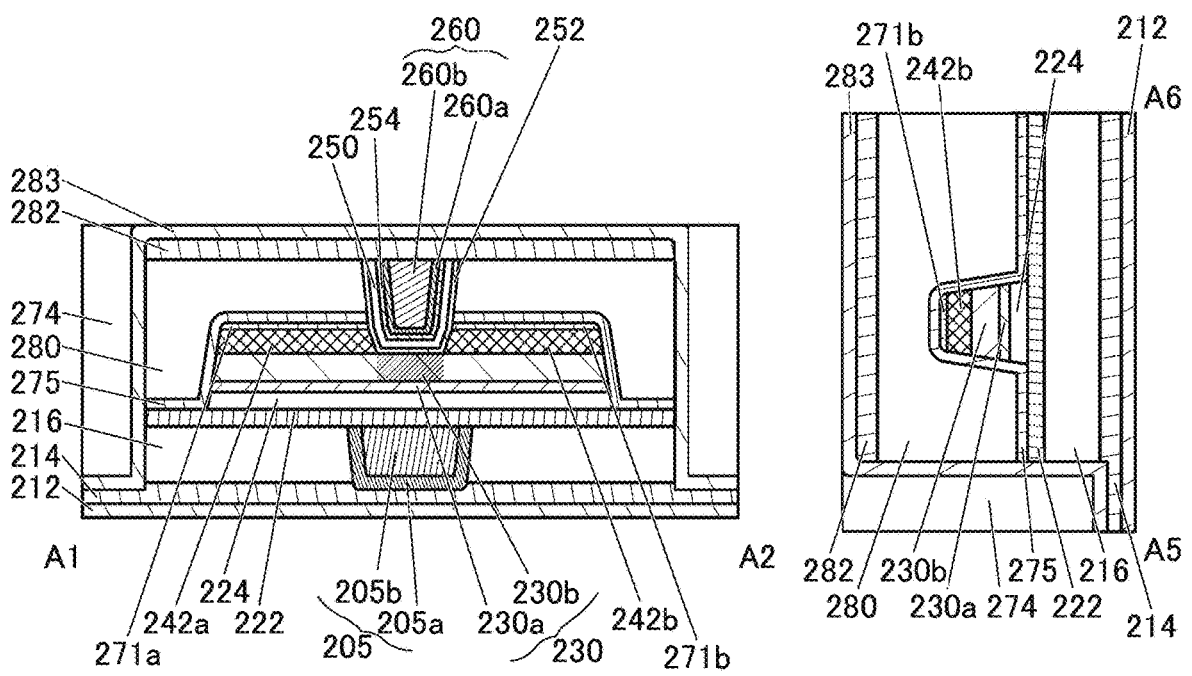

FIG. 18A
FIG. 18C
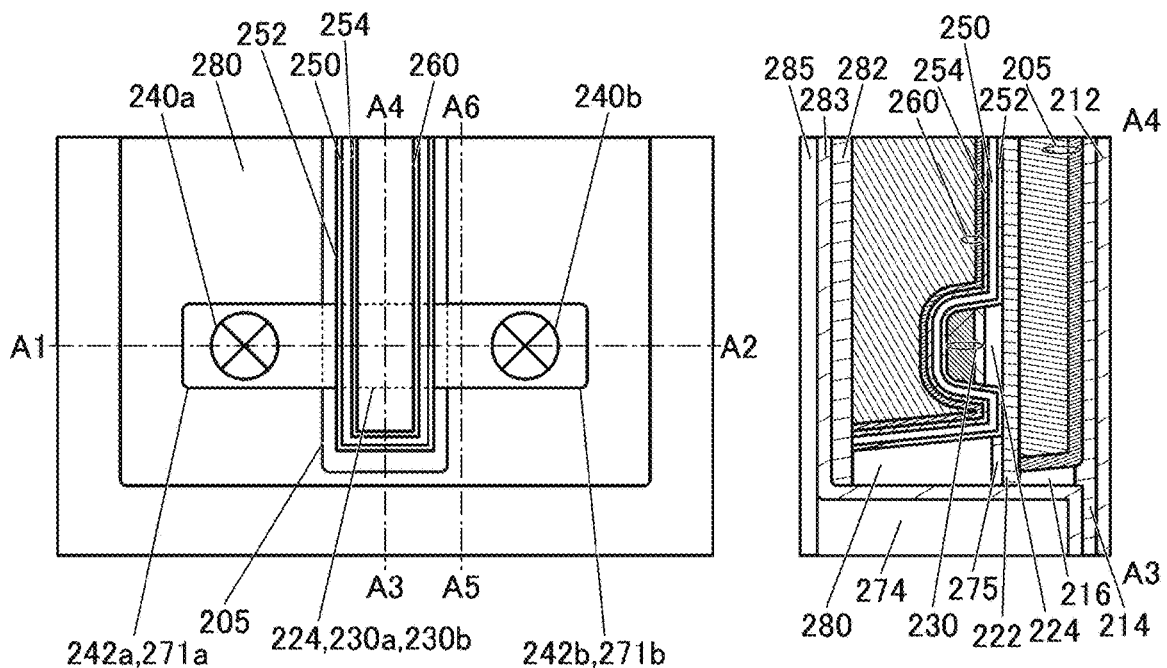
FIG. 18B
FIG. 18D
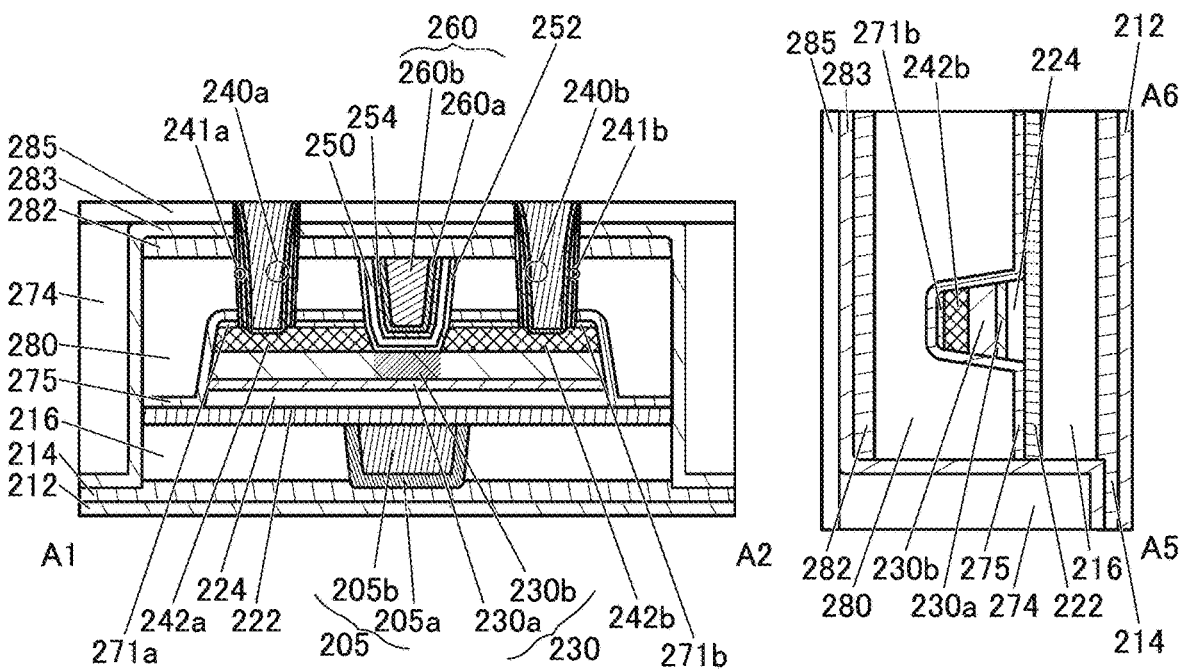

FIG. 19A
FIG. 19C
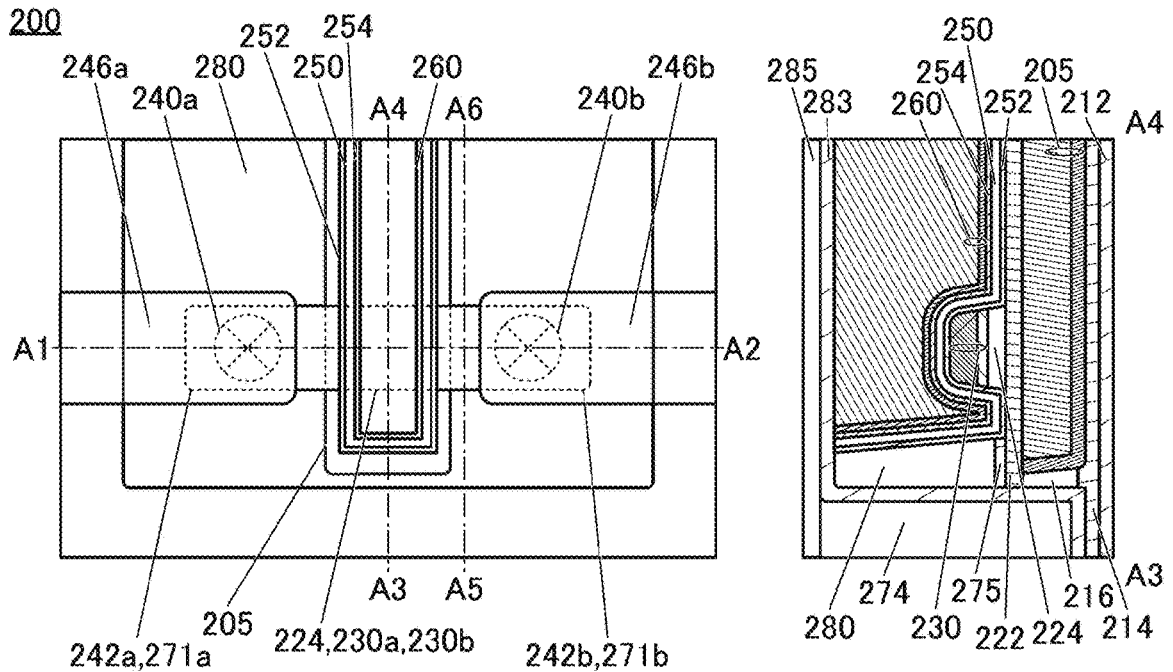
FIG. 19B
FIG. 19D
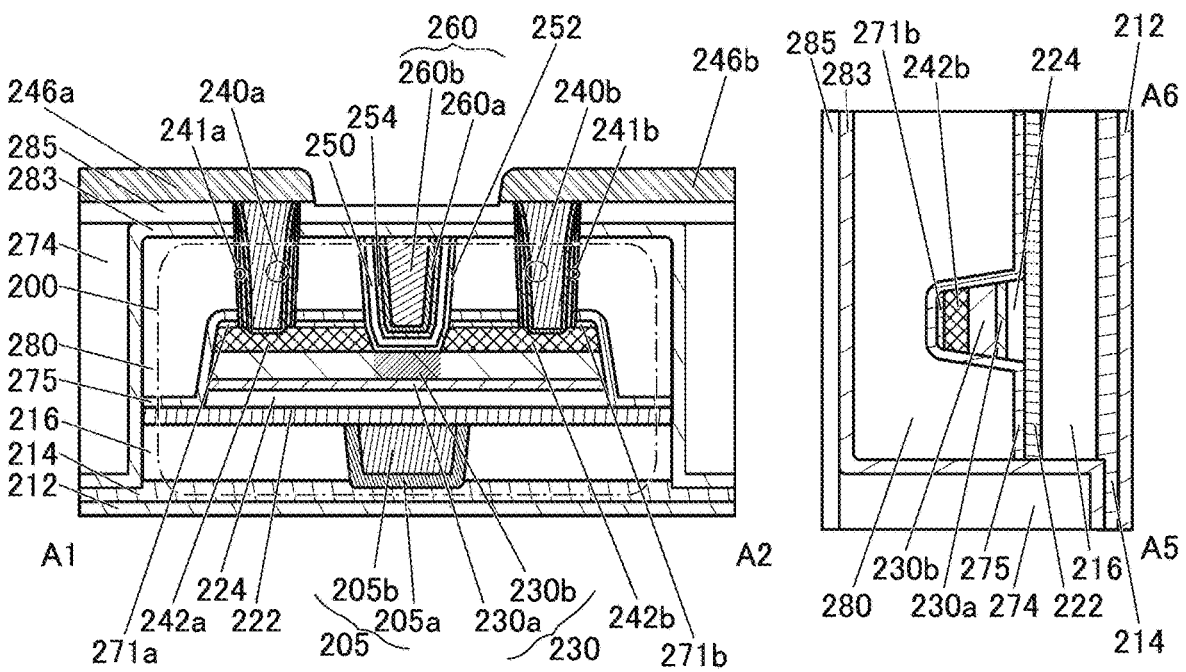

FIG. 20A
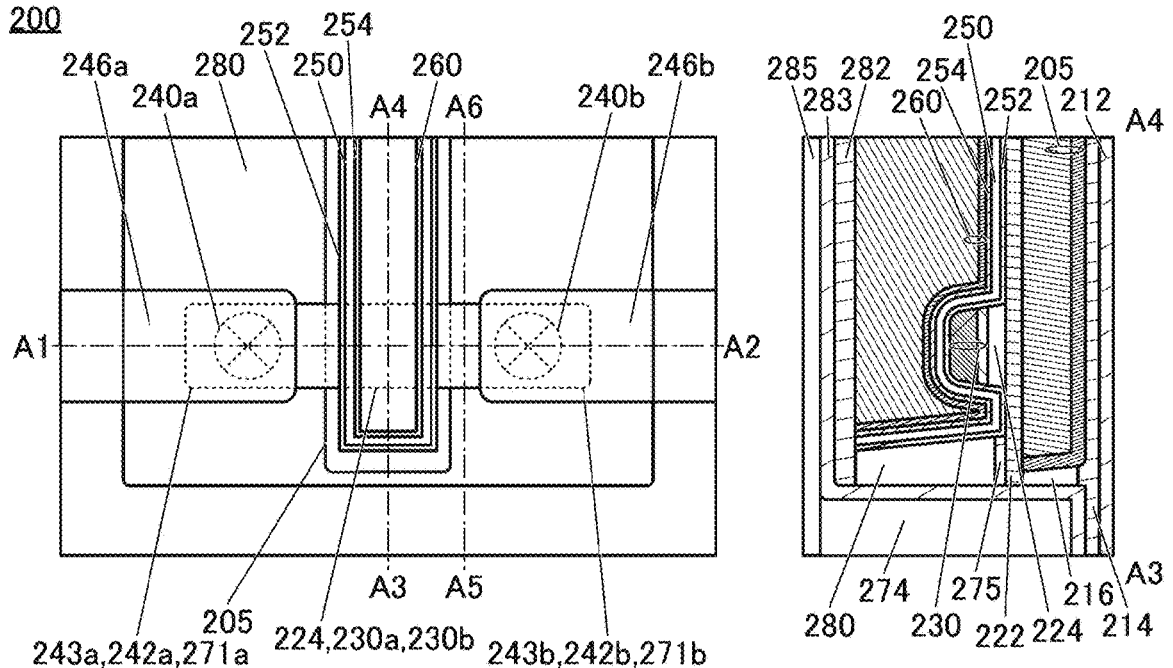
FIG. 20C
FIG. 20B
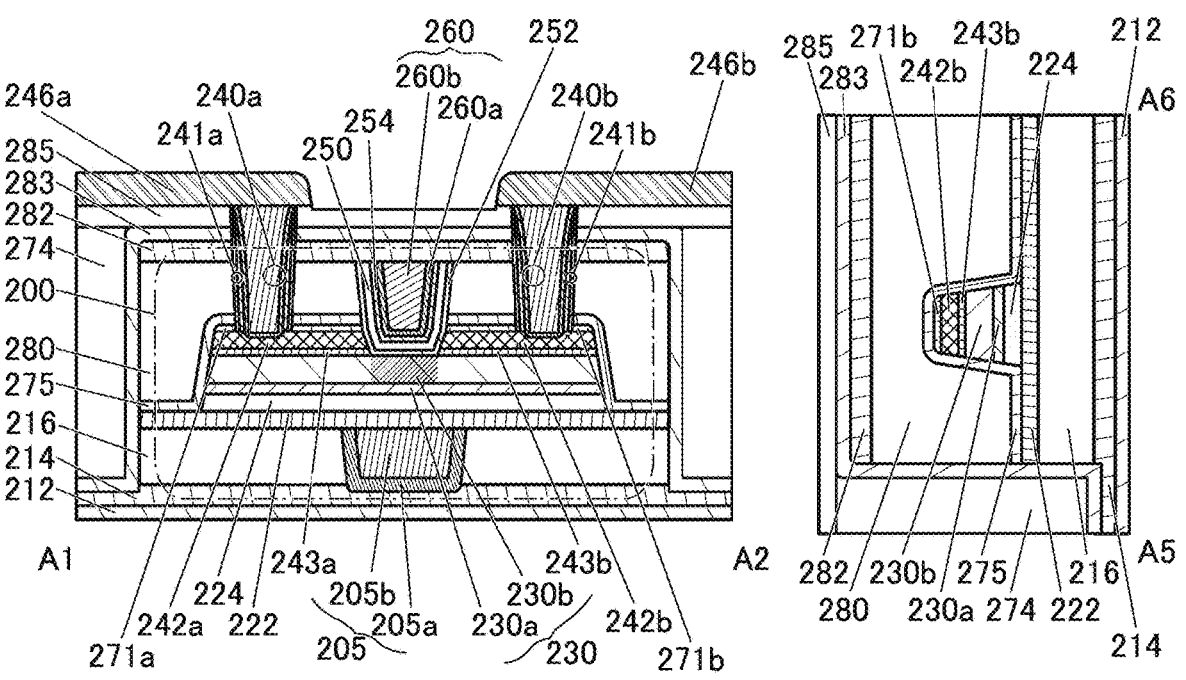
FIG. 20D

FIG. 21A
FIG. 21C
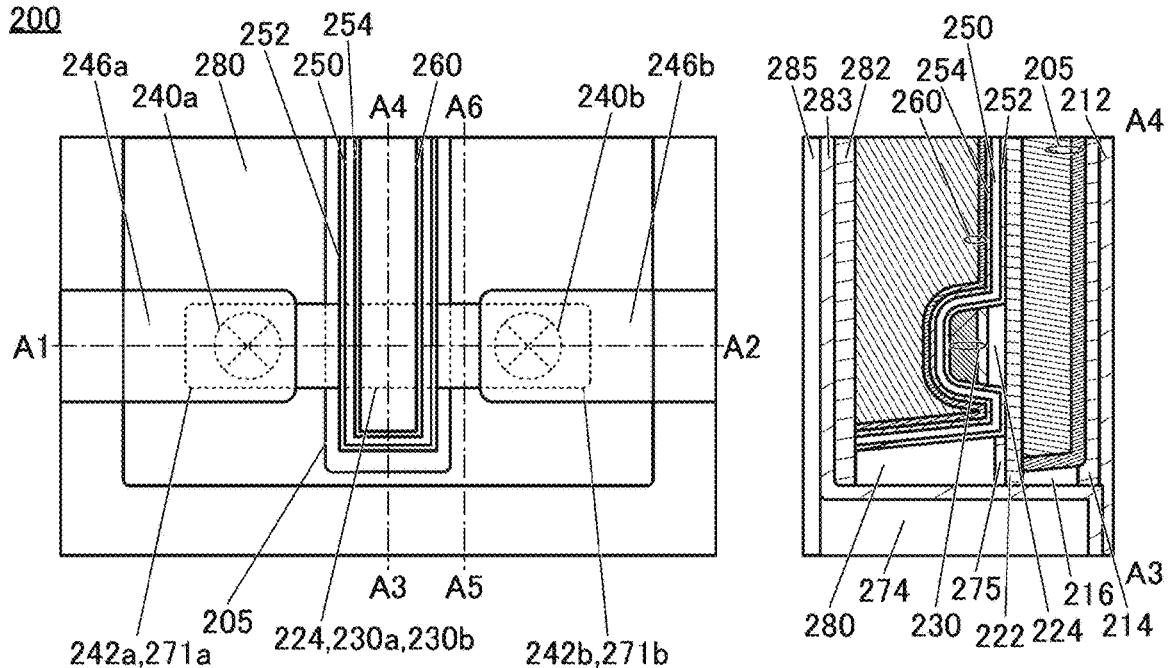
FIG. 21B
FIG. 21D
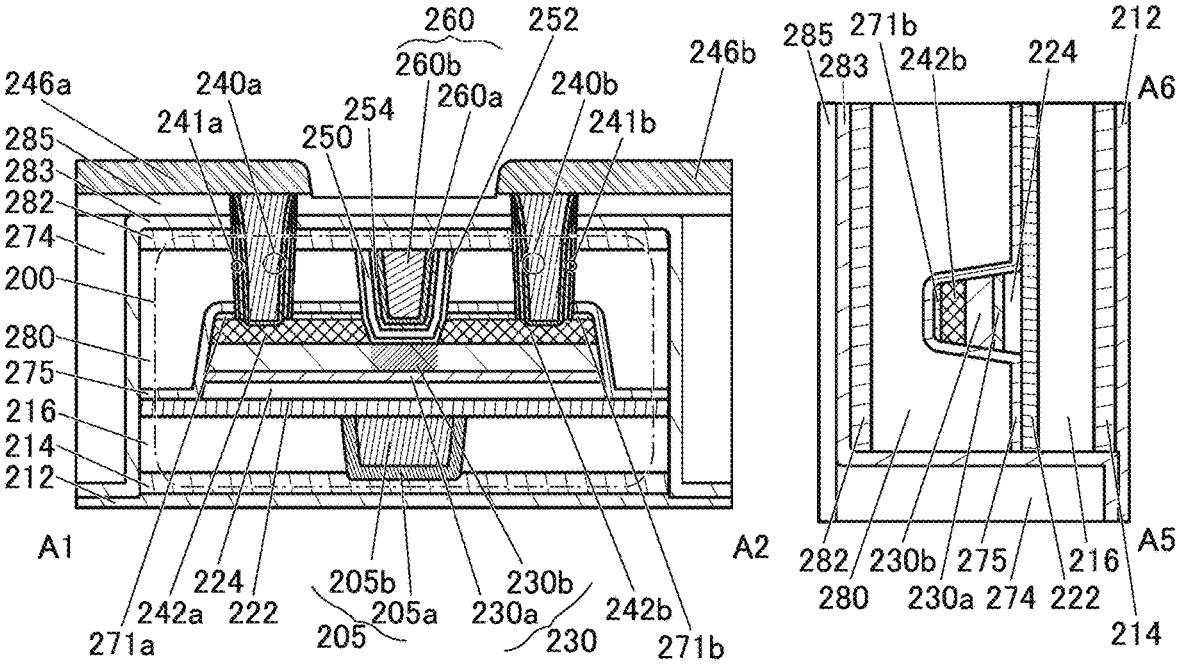

1400

VDD  VIL

1411

1470

MC ...... MC

ADDR

1420

CE

WE

RE

1460

MC ...... MC

1430

1440

WDATA  VSS  RDATA

1400

1470

1411

1471

1472

1473

1474

1475

1476

1477

1478

1200

1204

1100

1103   1106   1105   1104   1101   1102

1112   1111   1110

1115   1113   1114   1110

1152   1151   1150

1152   1155   1156   1153   1150   1154

5100

5102

5101

5200

5202

5201

5203

5300

5301

5304

5303

5302

5306

5305

5400

5402

5500

5501

5502

5502

5504

5703   5704   5701

5702

5800

5801

5802

5803

900

FIG. 36A
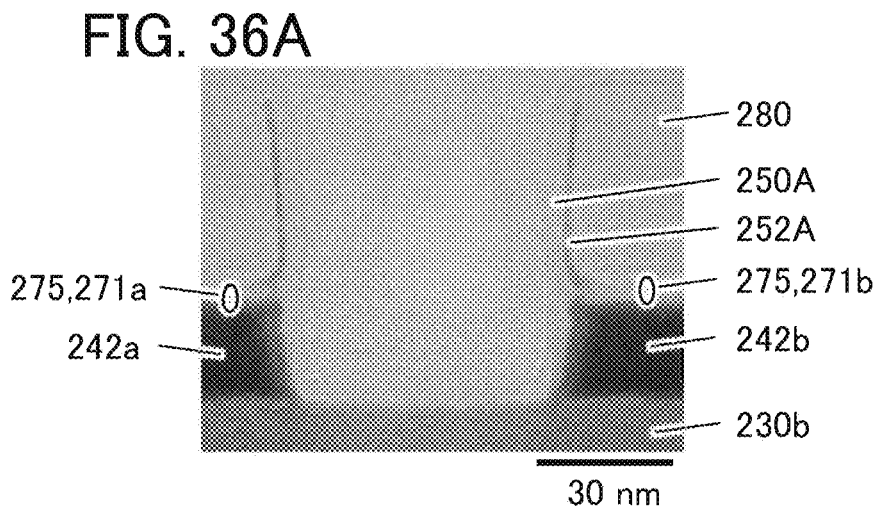
280
250A
252A
275,271a
275,271b
242a
242b
230b
30 nm
FIG. 36B
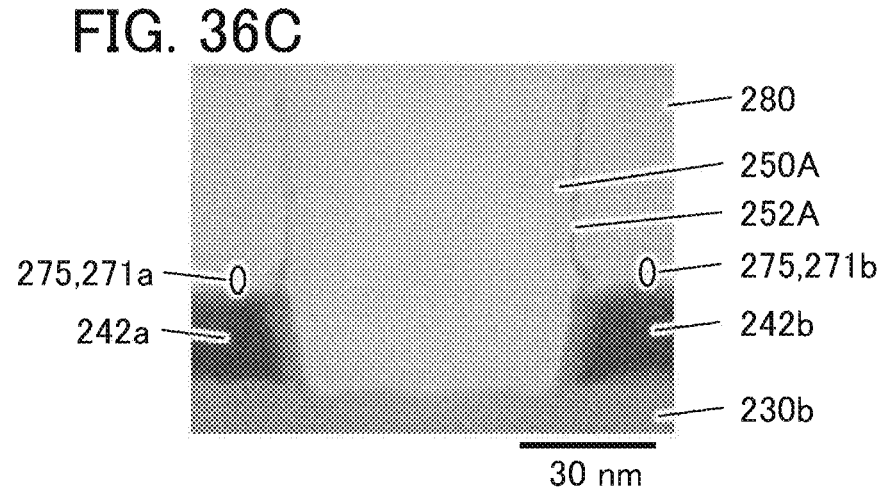
280
250A
252A
275,271a
275,271b
242a
242b
230b
30 nm
FIG. 36C
280
250A
252A
275,271a
275,271b
242a
242b
230b
30 nm

1

METHOD FOR MODIFYING INSULATING FILM AND METHOD FOR MANUFACTURING SEMICONDUCTOR DEVICE

TECHNICAL FIELD

One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed to be mainly used for an LSI, a CPU, a memory, or the like. A CPU is an assembly of semiconductor elements which each include a chip of a semiconductor integrated circuit (including at least a transistor and a memory) processed from a semiconductor wafer and an electrode serving as a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor and further, an oxide semiconductor has been attracting attention as another material.

It is known that a transistor using an oxide semiconductor has an extremely low leakage current in a non-conduction state. For example, Patent Document 1 discloses a low-power-consumption CPU utilizing a feature of a low leakage current of the transistor using an oxide semiconductor. Furthermore, for example, Patent Document 2 discloses a storage device that can retain stored contents for a long time by utilizing a feature of a low leakage current of the transistor using an oxide semiconductor.

In recent years, demand for an integrated circuit with higher density has risen with reductions in size and weight of electronic devices. Furthermore, the productivity of a semiconductor device including an integrated circuit is desired to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a method for modifying an insulating film. Another object of one embodiment of the present invention is to provide a method for reducing the hydrogen concentration in an insulating film. Another object of one embodiment of the present invention is to provide a semiconductor device with a small variation in transistor characteristics and a manufacturing method thereof. An object of one embodiment of the present invention is to provide a semiconductor device with favorable electrical characteristics and a manufacturing method thereof. Another object of one embodiment of the present invention is to provide a highly reliable semiconductor device and a manufacturing method thereof. Another object of one embodiment of the present invention is to provide a semiconductor device with a high on-state current and a manufacturing method thereof. Another object of one embodiment of the present invention is to provide a semiconductor device with high field-effect mobility and a manufacturing method thereof. Another object of one embodiment of the present invention is to provide a semiconductor device with favorable frequency characteristics and a manufacturing method thereof. Another object of one embodiment of the present invention is to provide a semiconductor device that can be miniaturized or highly integrated, and a manufacturing method thereof. Another object of one embodiment of the present invention is to provide a semiconductor device with low power consumption and a manufacturing method thereof.

Note that the description of these objects does not preclude the existence of other objects. In one embodiment of the present invention, there is no need to achieve all these objects. Other objects are apparent from and can be derived from the description of the specification, the drawings, the claims, and the like.

Means for Solving the Problems

One embodiment of the present invention is a method for modifying an insulating film, including a first step of preparing an insulating film comprising hydrogen, and a second step of performing microwave treatment on the insulating film to release the hydrogen in the insulating film as a water molecule, so that a hydrogen concentration in the insulating film is reduced.

Another embodiment of the present invention is a method for modifying an insulating film, including a first step of preparing an insulating film including an OH group bonded to silicon (Si), and a second step of performing microwave treatment on the insulating film to release the OH group in the insulating film as a water molecule, so that a hydrogen concentration in the insulating film is reduced.

One embodiment of the present invention is a method for modifying an insulating film, which includes a first step of preparing an insulating film including a hydrogen-containing atomic group that is bonded to silicon (Si), and a second step of performing microwave treatment on the insulating film to release the hydrogen contained in the atomic group as a water molecule, so that the hydrogen concentration in the insulating film is reduced. In this structure, the hydrogen-containing atomic group is preferably one or more of an OH group, an atomic group containing carbon and hydrogen, an atomic group containing oxygen, carbon, and hydrogen, and an atomic group containing nitrogen and hydrogen.

In the above-described structure, the microwave treatment is preferably performed using an oxygen gas and an argon gas at a temperature range of higher than or equal to 200° C. and lower than or equal to 300° C., and the proportion of the flow rate of the oxygen gas to the total of the flow rate of the oxygen gas and the flow rate of the argon gas is preferably greater than 0% and less than or equal to 50%.

In the above structure, the insulating film is preferably a silicon oxide film deposited by an ALD method at a deposition temperature higher than or equal to 200° C. and lower than or equal to 300° C. The insulating film is further preferably deposited by a PEALD method.

Another embodiment of the present invention is a method for manufacturing a semiconductor device, including a first step of depositing an oxide semiconductor film, a second step of depositing a conductive film over the oxide semiconductor film, a third step of processing the oxide semiconductor film and the conductive film into an island shape to form an oxide semiconductor layer and a conductive layer, a fourth step of forming a first insulating film over the conductive layer, a fifth step of processing the first insulating film and the conductive layer to form a first conductor and a second conductor from the conductive layer and form an opening reaching the oxide semiconductor layer in the first insulating film, a sixth step of depositing a silicon oxide film as a second insulating film by an ALD method to cover the opening; and a seventh step of performing microwave treatment at a temperature range of higher than or equal to 200° C. and lower than or equal to 300° C.

Another embodiment of the present invention is a method for manufacturing a semiconductor device, including a first step of depositing an oxide semiconductor film, a second step of depositing a conductive film over the oxide semiconductor film, a third step of processing the oxide semiconductor film and the conductive film into an island shape to form an oxide semiconductor layer and a conductive layer, a fourth step of forming a first insulating film over the conductive layer, a fifth step of processing the first insulating film and the conductive layer to form a first conductor and a second conductor from the conductive layer and form an opening reaching the oxide semiconductor layer in the first insulating film, a sixth step of depositing an aluminum oxide film as a third insulating film by an ALD method to cover the opening, a seventh step of depositing a silicon oxide film as a second insulating film over the third insulating film by an ALD method at a deposition temperature higher than or equal to 200° C. and lower than or equal to 300° C., and an eighth step of performing microwave treatment at a temperature range of higher than or equal to 200° C. and lower than or equal to 300° C. In the above structure, the second insulating film preferably includes a region having a larger thickness than the third insulating film.

In the above structure, the microwave treatment is preferably performed using an oxygen gas and an argon gas, and the proportion of the flow rate of the oxygen gas to the total of the flow rate of the oxygen gas and the flow rate of the argon gas is preferably greater than 0% and less than or equal to 50%.

In the above structure, the second insulating film is preferably deposited by a PEALD method.

In the above structure, the oxide semiconductor film is preferably deposited by a sputtering method using a target including one or more of In, Ga, and Zn.

In the above structure, each of the first conductor and the second conductor preferably contains tantalum and nitrogen.

In the above structure, an interface between a side surface of the first conductor and the second insulating film, a vicinity of the interface, an interface between a side surface of the second conductor and the second insulating film, and a vicinity of the interface preferably contain metal oxide, the metal oxide preferably contains tantalum and nitrogen, and the metal oxide preferably includes a region with a thickness greater than or equal to 1.0 nm and less than or equal to 4.0 nm.

Another embodiment of the present invention is a method for manufacturing a semiconductor device, which includes a first step of forming an oxide semiconductor layer, a second step of forming a first conductor and a second conductor over the oxide semiconductor layer, a third step of depositing an insulating film over the oxide semiconductor layer, and a fourth step of performing microwave treatment at a temperature range of higher than or equal to 200° C. and lower than or equal to 300° C.

Effect of the Invention

According to one embodiment of the present invention, a method for modifying an insulating film can be provided. According to another embodiment of the present invention, a method for reducing the hydrogen concentration in an insulating film can be provided. According to one embodiment of the present invention, a semiconductor device with a small variation in transistor characteristics and a manufacturing method thereof can be provided. According to one embodiment of the present invention, a semiconductor device with favorable electrical characteristics and a manufacturing method thereof can be provided. According to one embodiment of the present invention, a highly reliable semiconductor device and a manufacturing method thereof can be provided. According to one embodiment of the present invention, a semiconductor device with a high on-state current and a manufacturing method thereof can be provided. According to one embodiment of the present invention, a semiconductor device with high field-effect mobility and a manufacturing method thereof can be provided. According to one embodiment of the present invention, a semiconductor device with favorable frequency characteristics and a manufacturing method thereof can be provided. According to one embodiment of the present invention, a semiconductor device that can be miniaturized or highly integrated and a manufacturing method thereof can be provided. According to one embodiment of the present invention, a semiconductor device with low power consumption and a manufacturing method thereof can be provided.

Note that the description of these effects does not preclude the existence of other effects. One embodiment of the present invention does not have to have all these effects.

Other effects will be apparent from and can be derived from the description of the specification, the drawings, the claims, and the like.

BRIEF DESCRIPTION OF THE DRAWINGS

FIG. 6A is a top view of a semiconductor device of one embodiment of the present invention.

FIG. 6B to FIG. 6D are cross-sectional views of the semiconductor device of one embodiment of the present invention.

FIG. 8A is a diagram showing a classification of crystal structures of IGZO. FIG. 8B is a diagram showing an XRD spectrum of a CAAC-IGZO film. FIG. 8C is a diagram showing nanobeam electron diffraction patterns of the CAAC-IGZO film.

FIG. 10A is a top view illustrating the method for manufacturing a semiconductor device that is one embodiment of the present invention. FIG. 10B to FIG. 10D are cross-sectional views illustrating the method for manufacturing a semiconductor device that is one embodiment of the present invention.

FIG. 12A is a top view illustrating the method for manufacturing a semiconductor device that is one embodiment of the present invention. FIG. 12B to FIG. 12D are cross-sectional views illustrating the method for manufacturing a semiconductor device that is one embodiment of the present invention.

FIG. 13A is a top view illustrating the method for manufacturing a semiconductor device that is one embodiment of the present invention. FIG. 13B to FIG. 13D are cross-sectional views illustrating the method for manufacturing a semiconductor device that is one embodiment of the present invention.

FIG. 14A is a top view illustrating the method for manufacturing a semiconductor device that is one embodiment of the present invention. FIG. 14B to FIG. 14D are cross-sectional views illustrating the method for manufacturing a semiconductor device that is one embodiment of the present invention.

FIG. 15A is a top view illustrating the method for manufacturing a semiconductor device that is one embodiment of the present invention. FIG. 15B to FIG. 15D are cross-sectional views illustrating the method for manufacturing a semiconductor device that is one embodiment of the present invention.

FIG. 16A is a top view illustrating the method for manufacturing a semiconductor device that is one embodiment of the present invention. FIG. 16B to FIG. 16D are cross-sectional views illustrating the method for manufacturing a semiconductor device that is one embodiment of the present invention.

FIG. 17A is a top view illustrating the method for manufacturing a semiconductor device that is one embodiment of the present invention. FIG. 17B to FIG. 17D are cross-sectional views illustrating the method for manufacturing a semiconductor device that is one embodiment of the present invention.

FIG. 18A is a top view illustrating the method for manufacturing a semiconductor device that is one embodiment of the present invention. FIG. 18B to FIG. 18D are cross-sectional views illustrating the method for manufacturing a semiconductor device that is one embodiment of the present invention.

FIG. 19A is a top view of a semiconductor device of one embodiment of the present invention.

FIG. 19B to FIG. 19D are cross-sectional views of the semiconductor device of one embodiment of the present invention.

FIG. 20A is a top view of a semiconductor device of one embodiment of the present invention.

FIG. 20B to FIG. 20D are cross-sectional views of the semiconductor device of one embodiment of the present invention.

FIG. 21A is a top view of a semiconductor device of one embodiment of the present invention.

FIG. 21B to FIG. 21D are cross-sectional views of the semiconductor device of one embodiment of the present invention.

FIG. 36A to FIG. 36C are cross-sectional STEM images of samples in Example.

MODE FOR CARRYING OUT THE INVENTION

Figure 1:
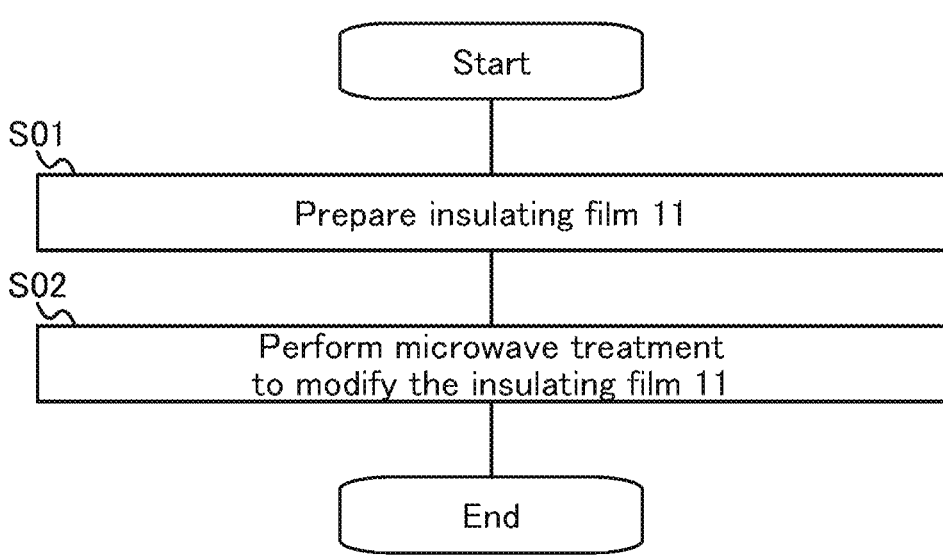
FIG. 1 is a flow chart showing an example of a procedure of a method for modifying an insulating film of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relation between components with reference to drawings. The positional relation between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of current is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to a channel length direction in a region where a semiconductor (or a portion where current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases or the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition. In addition, silicon nitride oxide is a material that contains more nitrogen than oxygen in its composition. Aluminum oxynitride refers to a material that contains more oxygen than nitrogen in its composition. Moreover, aluminum nitride oxide refers to a material that contains more nitrogen than oxygen in its composition. Hafnium oxynitride refers to a material that contains more oxygen than nitrogen in its composition. Moreover, a hafnium nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

In this specification, in the case where the maximum value and the minimum value are specified, a structure in which the maximum value and the minimum value are freely combined is disclosed.

Embodiment 1

In this embodiment, a method for modifying an insulating film, which is one embodiment of the present invention, will be described with reference to FIG. 1 to FIG. 5.

FIG. 1 is a flow chart showing an example of a procedure in the method for modifying an insulating film. The method for modifying an insulating film includes Step S01 and Step S02 as shown in FIG. 1.

Step S01 is a step of preparing an insulating film 11. The insulating film 11 is preferably provided over a substrate.

Step S02 is a step of performing microwave treatment on the insulating film 11. The insulating film 11 can be modified by this step. Note that as the modification of the insulating film 11, for example, a reduction in impurity concentration in the insulating film 11, a reduction in density of defect states in the insulating film 11, and an increase in density of the insulating film 11 can be given.

Here, the microwave treatment is described.

The microwave treatment is preferably performed with a microwave treatment apparatus including a power source for generating high-density plasma using microwaves, for example. Here, the frequency of the microwave treatment apparatus is set to greater than or equal to 300 MHz and less than or equal to 300 GHz, preferably greater than or equal to 2.4 GHz and less than or equal to 2.5 GHz, for example, 2.45 GHz. Oxygen radicals at a high density can be generated with high-density plasma. The electric power of the power source that applies microwaves of the microwave treatment apparatus is set to higher than or equal to 1000 W and lower than or equal to 10000 W, preferably higher than or equal to 2000 W and lower than or equal to 5000 W. A power source may be provided to the microwave treatment apparatus to apply RF to the substrate side.

The processing time of the microwave treatment is longer than or equal to 3 minutes and shorter than or equal to 24 hours, preferably longer than or equal to 5 minutes and shorter than or equal to 2 hours, further preferably longer than or equal to 10 minutes and shorter than or equal to 1 hours. Microwave treatment for over 24 hours causes a reduction in productivity and thus is not preferable.

The microwave treatment is preferably performed under reduced pressure, and the pressure of a deposition chamber may be higher than or equal to 10 Pa and lower than or equal to 1000 Pa, preferably higher than or equal to 300 Pa and lower than or equal to 700 Pa.

The microwave treatment is preferably performed in an oxygen-containing atmosphere. For the oxygen-containing atmosphere, an oxygen gas and an argon gas, a helium gas, or a krypton gas are used, for example. In the case where an oxygen gas and an argon gas are used for the oxygen-containing atmosphere, the proportion of the oxygen gas flow rate to the total of the oxygen gas flow rate and the argon gas flow rate is represented as an oxygen flow rate ratio ($O_2/(O_2+Ar)$). The oxygen flow rate ratio ($O_2/(O_2+Ar)$) is greater than 0% and less than or equal to 100%, preferably greater than 0% and less than or equal to 50%, further preferably greater than or equal to 10% and less than or equal to 40%, still further preferably greater than or equal to 10% and less than or equal to 30%. Similarly, in the case of using an oxygen gas and a helium gas or a krypton gas for the oxygen-containing gas, the oxygen flow rate ratio ($O_2/(O_2+He)$ or $O_2/(O_2+Kr)$) is greater than 0% and less than or equal to 100%, preferably greater than 0% and less than or equal to 50%, further preferably greater than or equal to 10% and less than or equal to 40%, still further preferably greater than or equal to 10% and less than or equal to 30%.

The above is the description of the microwave treatment.

Next, modification of the insulating film 11 is described.

An oxide insulating film can be given as an insulating film that can be used as the insulating film 11. As the oxide insulating film, an oxide insulating film containing one kind or a plurality of kinds selected from silicon, aluminum, hafnium, zirconium, and the like can be given, for example. Specifically, a silicon oxide film, an aluminum oxide film, a hafnium oxide film, a zirconium oxide film, an oxide film including aluminum and hafnium, an oxide film including hafnium and zirconium, an oxide film including silicon and hafnium, and the like can be given.

In the case where the insulating film 11 is a silicon oxide film, the insulating film 11 can be modified when subjected to microwave treatment in an oxygen-containing atmosphere. Specifically, OH groups that exist in the insulating film 11 and are bonded to silicon (Si) can be reduced by the microwave treatment. More specifically, at least hydrogen of OH groups bonded to silicon (Si) can be released as a water molecule. In other words, the microwave treatment makes it possible to release hydrogen in the insulating film 11 as a water molecule. Thus, the hydrogen concentration in the insulating film 11 can be reduced. Note that in the case where the insulating film 11 is a silicon oxide film, the insulating film 11 is an insulating film including at least oxygen and silicon. Note that as the oxygen-containing atmosphere, for example, a mixed atmosphere of an oxygen gas and an argon gas is preferable.

Hydrogen in the silicon oxide film exists as adsorbed water, an OH group bonded to silicon (Si), or the like. The amounts of adsorbed water and OH groups bonded to silicon (Si), which exist in a silicon oxide film, can be measured by TDS (Thermal Desorption Spectroscopy) analysis or the like. For example, in a desorption gas profile with a mass-to-charge ratio $m/z=18$, which is obtained by TDS analysis on the silicon oxide film, a peak of desorption at a range of up to approximately 200° C., a peak of desorption at a range of up to approximately 400° C., a peak of desorption at a range of up to approximately 750° C., and the like are detected in some cases. It is said that the peak of desorption at a range of up to approximately 200° C. and the peak of desorption at a range of up to approximately 400° C. are related to adsorbed water. Furthermore, it is said that the peak of desorption at a range of up to approximately 750° C. is related to OH groups bonded to silicon (Si). In the following description, the peak of desorption at a range of up to approximately 200° C., the peak of desorption at a range of up to approximately 400° C., and the peak of desorption at a range of up to approximately 750° C. in the desorption gas profile with a mass-to-charge ratio $m/z=18$, which is obtained by TDS analysis on the silicon oxide film, are sometimes referred to as an α peak, a β peak, and a γ peak, respectively, for convenience.

The γ peak, which is a peak of desorption at 400° C. or higher, can be lowered by performing microwave treatment on the silicon oxide film in an oxygen-containing atmosphere even at a treatment temperature of 400° C. or lower. In other words, OH groups bonded to silicon (Si) can be reduced. Thus, the hydrogen concentration in the silicon oxide film can be reduced. Although the γ peak can be lowered more efficiently at a higher temperature in the microwave treatment, the effect of lowering the γ peak can be obtained even at a relatively low temperature in the microwave treatment. For example, the temperature range of the microwave treatment may be higher than or equal to 150° C. and lower than or equal to 400° C. or higher than or equal to 200° C. and lower than or equal to 300° C., for example, approximately 250° C.

The silicon oxide film subjected to microwave treatment in an oxygen-containing atmosphere is sometimes denser than a silicon oxide film not subjected to the microwave treatment. Specifically, the etching rate of the silicon oxide film subjected to the microwave treatment is sometimes lower than that of a silicon oxide film not subjected to the microwave treatment. The dense silicon oxide film can inhibit impurity diffusion through the silicon oxide film.

Note that in the case where the silicon oxide film is deposited by an atomic layer deposition (ALD) method using a precursor formed with an organic matter (referred to as an organic precursor), hydrogen in the organic precursor is mixed into the silicon oxide film, so that the hydrogen concentration in the silicon oxide film tends to be high. Hydrogen in the silicon oxide film exists as absorbed water or a hydrogen-containing atomic group bonded to silicon (Si). Examples of the hydrogen-containing atomic group include an OH group (hydroxy group), an atomic group containing carbon and hydrogen, such as an alkyl group, an atomic group containing oxygen, carbon, and hydrogen, such as an alkoxy group, and an atomic group containing nitrogen and hydrogen, such as an amino group. Then, microwave treatment is performed on the silicon oxide film, whereby hydrogen contained in the atomic group is released as a water molecule, so that the silicon oxide film can be modified more effectively. Furthermore, the hydrogen concentration in the silicon oxide film can be reduced.

In the case where the silicon oxide film is deposited by an ALD method using an oxidizer containing hydrogen, hydrogen contained in the oxidizer is mixed into the silicon oxide film, so that the hydrogen concentration in the silicon oxide film tends to be high. As the oxidizer containing hydrogen, water ($H_2O$) can be given, for example. In that case, microwave treatment is performed on the silicon oxide film, whereby the silicon oxide film can be modified more effectively. Moreover, the hydrogen concentration in the silicon oxide film can be reduced.

In the case where the silicon oxide film is deposited at a deposition temperature of, for example, higher than or equal to 200° C. and lower than or equal to 300° C., the hydrogen concentration in the silicon oxide film tends to be high. In that case, microwave treatment is performed on the silicon oxide film, whereby the silicon oxide film can be modified more effectively. Moreover, the hydrogen concentration in the silicon oxide film can be reduced.

The above is the description of the modification of the insulating film 11 with the silicon oxide film used as an example. Note that in the case where the insulating film 11 is an oxide insulating film containing at least silicon, the insulating film 11 can be modified when subjected to micro-wave treatment. Furthermore, a similar effect can be expected for an oxide insulating film other than a silicon oxide film when microwave treatment is performed on the oxide insulating film. That is, in the case where the insulating film 11 is an oxide insulating film containing one kind or a plurality of kinds selected from silicon, aluminum, hafnium, zirconium, and the like, it is presumed that hydrogen-containing atomic groups (e.g., OH groups, atomic groups containing carbon and hydrogen, such as alkyl groups, atomic groups containing oxygen, carbon, and hydrogen, such as alkoxy groups, or atomic groups containing nitrogen and hydrogen, such as amino groups) which exist in the oxide insulating film and are bonded to metal (aluminum, hafnium, or zirconium) can be reduced. Therefore, it is presumed that the hydrogen concentration in the oxide insulating film can be reduced.

Note that the insulating film that can be used as the insulating film 11 may be an oxynitride film such as a silicon oxynitride film. Microwave treatment is performed on the oxynitride film, whereby OH groups that exist in the oxynitride film and are bonded to silicon (Si) can be reduced. Therefore, the hydrogen concentration in the silicon oxynitride film can be reduced.

The insulating film 11 may have a stacked-layer structure of two or more layers. In that case, without limitation to a stacked-layer structure formed of the same material, a stacked-layer structure formed of different materials may be employed. In the case where the insulating film 11 has a stacked-layer structure of two or more layers, at least one layer of the stacked-layer structure includes the above-described insulating film.

Furthermore, microwave treatment may be performed on a structure body in which a metal oxide film functioning as a semiconductor is provided in the vicinity of the insulating film 11. The metal oxide is a film that includes metal and oxygen and in which hydrogen is regarded as an impurity. Thus, when microwave treatment is performed on the insulating film 11 and the metal oxide film, modification of the metal oxide film is expected. For example, a reduction in hydrogen concentration in the metal oxide is expected. Note that as the metal oxide film, an oxide film containing indium or zinc can be given, for example.

The above is the description of the modification of the insulating film 11.

<Microwave Treatment Apparatus>

A microwave treatment apparatus that can be used for the above-described method for modifying an insulating film and a method for manufacturing a semiconductor device that will be described later is described below.

First, a structure of a manufacturing apparatus that hardly allows entry of impurities in manufacturing a semiconductor device or the like is described with reference to FIG. 2 to FIG. 5.

Figure 2:
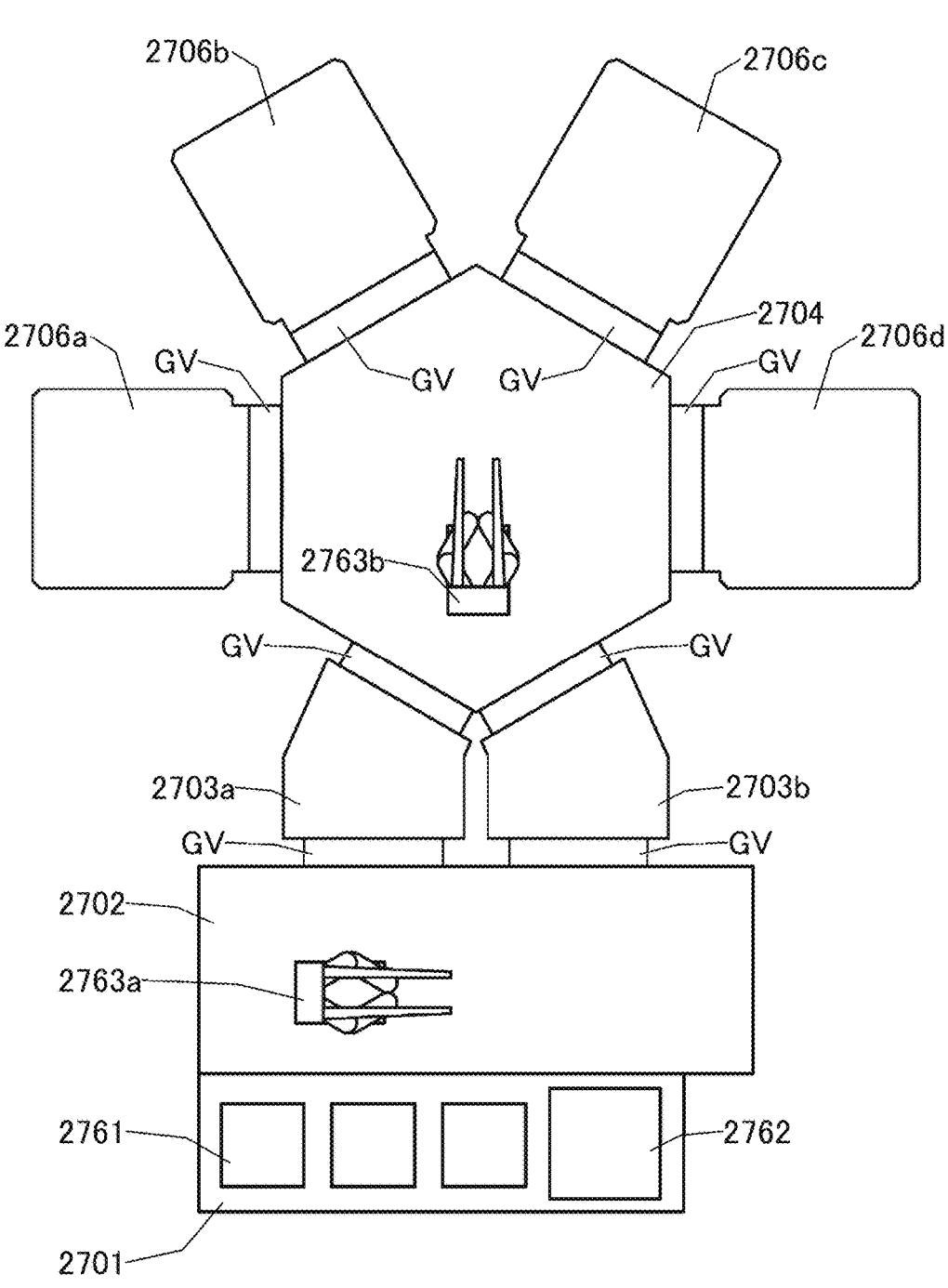
FIG. 2 is a top view illustrating a microwave treatment apparatus of one embodiment of the present invention.

FIG. 2 schematically illustrates a top view of a single wafer multi-chamber manufacturing apparatus 2700. The manufacturing apparatus 2700 includes an atmosphere-side substrate supply chamber 2701 including a cassette port 2761 for storing a substrate and an alignment port 2762 for performing alignment of a substrate; an atmosphere-side substrate transfer chamber 2702 for transferring a substrate from the atmosphere-side substrate supply chamber 2701; a load lock chamber 2703a for carrying in a substrate and switching the pressure inside the chamber from atmospheric pressure to reduced pressure or from reduced pressure to atmospheric pressure; an unload lock chamber 2703b for carrying out a substrate and switching the pressure inside the chamber from reduced pressure to atmospheric pressure or from atmospheric pressure to reduced pressure; a transfer chamber 2704 for transferring a substrate in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that the chambers other than the atmosphere-side substrate supply chamber 2701 and the atmosphere-side substrate transfer chamber 2702 can be each independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1 \times 10^{-4}$ Pa, preferably lower than or equal to $3 \times 10^{-5}$ Pa, further preferably lower than or equal to $1 \times 10^{-5}$ Pa. Furthermore, the partial pressure of a gas molecule (atom) having a mass-to-charge ratio (m/z) of 18 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 28 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa. Furthermore, the partial pressure of a gas molecule (atom) having m/z of 44 in the transfer chamber 2704 and each of the chambers is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers can be measured using an ionization vacuum gauge, a mass analyzer, or the like.

Furthermore, the transfer chamber 2704 and the chambers each desirably have a structure in which the amount of external leakage or internal leakage is small. For example, the leakage rate of the transfer chamber 2704 is less than or equal to $1 \times 100$ Pa/min., preferably less than or equal to $5 \times 10^{-1}$ Pa/min. In addition, the leakage rate of each chamber is less than or equal to $1 \times 10^{-1}$ Pa/min., preferably less than or equal to $5 \times 10^{-2}$ Pa/min.

Note that a leakage rate can be derived from the total pressure and partial pressure measured using the ionization vacuum gauge, the mass analyzer, or the like. For example, the leakage rate is preferably derived from the total pressure at the time when 10 minutes have passed from the start of evacuation to a vacuum using a vacuum pump such as a turbo molecular pump and the total pressure at the time when 10 minutes have passed from the operation of closing the valve. Note that the total pressure at the time of 10 minutes passing from the start of evacuation to a vacuum is preferably an average value of total pressures measured a plurality of times.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of passive metal covered with iron fluoride, aluminum oxide, chromium oxide, or the like, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described metal, which releases a small amount of gas containing impurities, may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump having high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Figure 3:
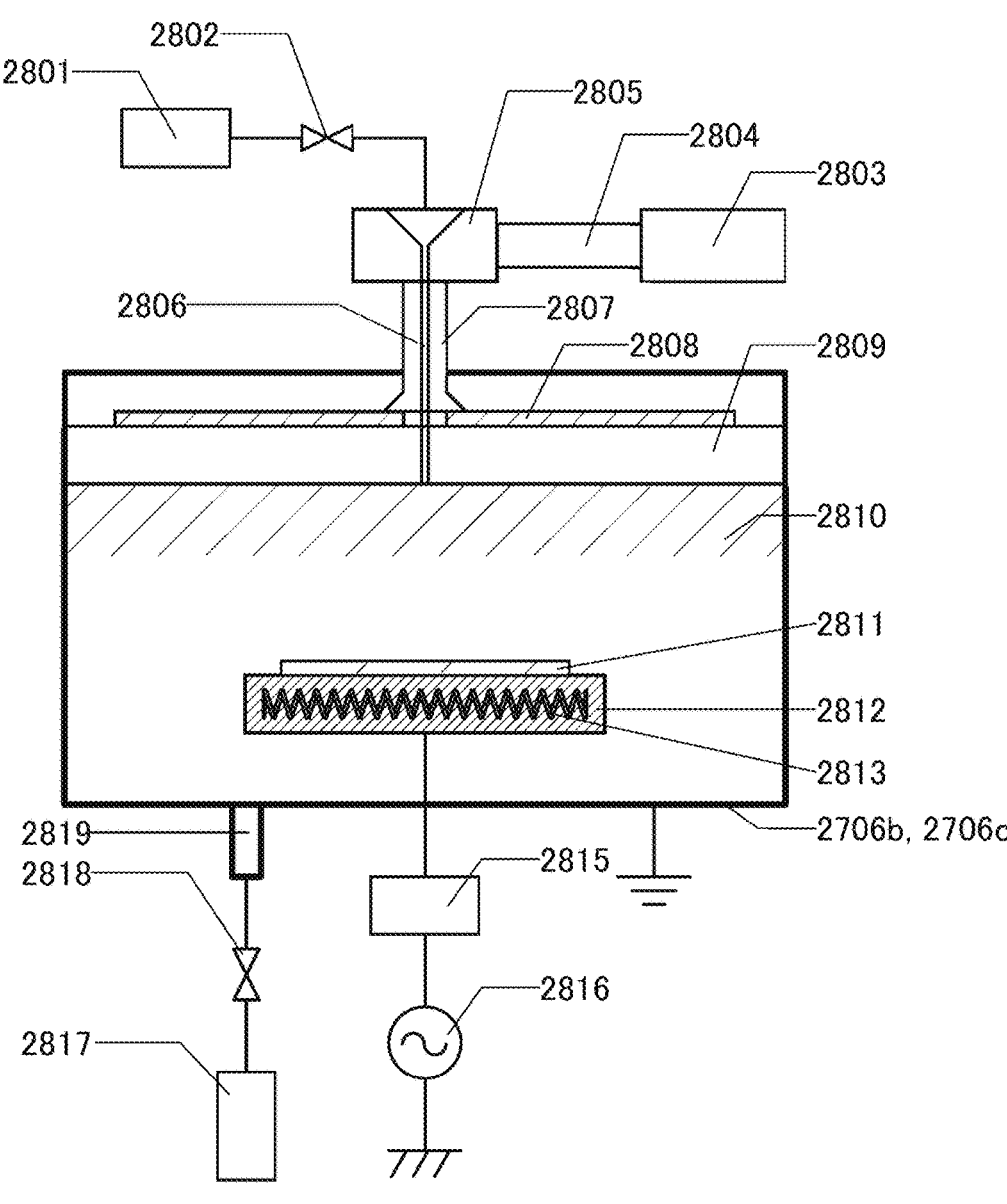
FIG. 3 is a cross-sectional view illustrating a microwave treatment apparatus of one embodiment of the present invention.

Next, the chamber 2706b and the chamber 2706c are described with reference to a schematic cross-sectional view of FIG. 3.

The chamber 2706b and the chamber 2706c are chambers in which microwave treatment can be performed on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is placed in contact with the dielectric plate 2809. Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. Furthermore, the substrate holder 2812 has a function of an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 may be a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating a microwave at, for example, higher than or equal to 0.3 GHz and lower than or equal to 3.0 GHZ, higher than or equal to 0.7 GHz and lower than or equal to 1.1 GHZ, or higher than or equal to 2.2 GHz and lower than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like may be used, for example. The application of a bias to the substrate side allows ions in the high-density plasma 2810 to efficiently reach a deep portion of an opening portion formed in the film or the like over the substrate 2811.

For example, in the chamber 2706*b* or the chamber 2706*c*, oxygen radical treatment using the high-density plasma 2810 can be performed by introducing oxygen from the gas supply source 2801.

Figure 4:
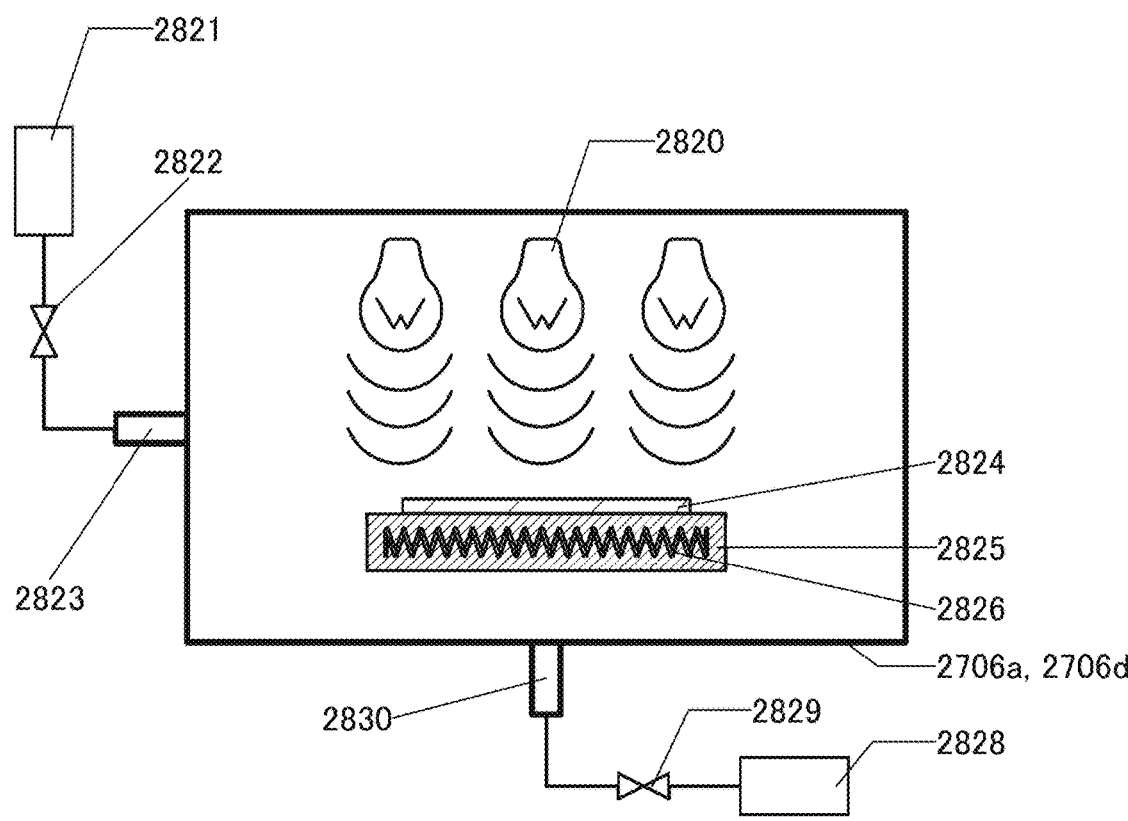
FIG. 4 is a cross-sectional view illustrating a microwave treatment apparatus of one embodiment of the present invention.
Figure 5:
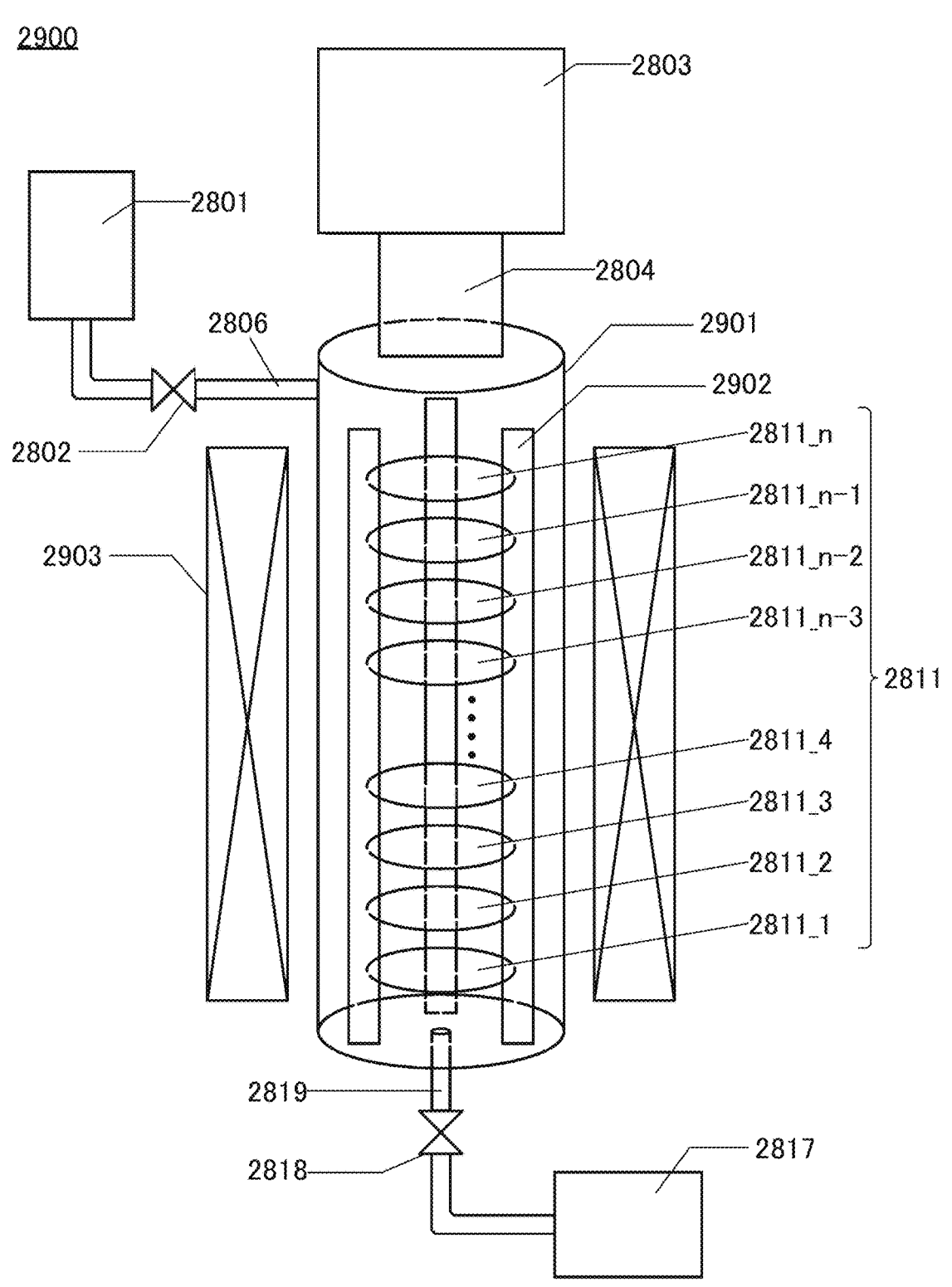
FIG. 5 is a cross-sectional view illustrating a microwave treatment apparatus of one embodiment of the present invention.

Next, the chamber 2706*a* and the chamber 2706*d* are described with reference to a schematic cross-sectional view illustrated in FIG. 4.

The chamber 2706*a* and the chamber 2706*d* are chambers in which an object can be irradiated with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or more lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak at a wavelength longer than or equal to 10 nm and shorter than or equal to 2500 nm, longer than or equal to 500 nm and shorter than or equal to 2000 nm, or longer than or equal to 40 nm and shorter than or equal to 340 nm can be used.

As the lamp 2820, a light source such as a halogen lamp, a metal halide lamp, a xenon arc lamp, a carbon arc lamp, a high-pressure sodium lamp, or a high-pressure mercury lamp can used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

A microwave treatment apparatus that can be used in this embodiment is not limited to the above. It is possible to use a microwave treatment apparatus 2900 illustrated in FIG. 5. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes a substrate holder 2902 that holds a plurality of substrates 2811 (2811_1 to 2811_n, n is an integer greater than or equal to 2) in the quartz tube 2901. The microwave treatment apparatus 2900 may further include a heating means 2903 outside the quartz tube 2901.

The substrate placed in the quartz tube 2901 is irradiated with the microwave generated by the high-frequency generator 2803, through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With the use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_n may be substrates to be treated where a semiconductor device or a storage device is to be formed, or some of the substrates may be dummy substrates. For example, the substrate 2811_1 and the substrate 2811_n may be dummy substrates and the substrate 2811_2 to the substrate 2811_n−1 may be substrates to be treated. Alternatively, the substrate 2811_1, the substrate 2811_2, the substrate 2811_n−1, and the substrate 2811_n may be dummy substrates and the substrate 2811_3 to the substrate 2811_n−2 may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to a microwave.

With the use of the above-described manufacturing apparatus, the quality of a film or the like can be modified while the entry of impurities into an object is inhibited.

According to one embodiment of the present invention, a method for modifying an insulating film can be provided. According to one embodiment of the present invention, a method for reducing the hydrogen concentration in an insulating film can be provided.

At least part of the structure, method, and the like described in this embodiment can be implemented in appropriate combination with any of those in the other embodiments and the other examples described in this specification.

Embodiment 2

In this embodiment, an example of a semiconductor device including a transistor 200 of one embodiment of the present invention and a manufacturing method thereof are described with reference to FIG. 6A to FIG. 22C.

<Structure Example of Semiconductor Device>

A structure of a semiconductor device including the transistor 200 is described with reference to FIG. 6A to FIG. 6D. FIG. 6A to FIG. 6D are a top view and cross-sectional views of the semiconductor device including the transistor 200. FIG. 6A is a top view of the semiconductor device. FIG. 6B to FIG. 6D are cross-sectional views of the semiconductor device. Here, FIG. 6B is a cross-sectional view of a portion indicated by dashed-dotted line A1-A2 in FIG. 6A, and is a cross-sectional view of the transistor 200 in the channel length direction. FIG. 6C is a cross-sectional view of a portion indicated by dashed-dotted line A3-A4 in FIG. 6A, and is a cross-sectional view of the transistor 200 in the channel width direction. FIG. 6D is a cross-sectional view of a portion indicated by a dashed-dotted line A5-A6 in FIG. 6A. Note that for clarity of the drawing, some components are not illustrated in the top view of FIG. 6A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, an insulator 274 over the insulator 283, and an insulator 285 over the insulator 283 and the insulator 274. The insulator 212, the insulator 214, the insulator 280, the insulator 282, the insulator 283, the insulator 285, and the insulator 274 each function as an interlayer film. A conductor 240a and a conductor 240b that are electrically connected to the transistor 200 and function as plugs are also included. An insulator 241a is provided in contact with a side surface of the conductor 240a, and an insulator 241b is provided in contact with a side surface of the conductor 240b. A conductor 246a that is electrically connected to the conductor 240a and functions as a wiring is provided over the insulator 285 and the conductor 240a, and a conductor 246b that is electrically connected to the conductor 240b and functions as a wiring is provided over the insulator 285 and the conductor 240b. The insulator 283 is in contact with part of the top surface of the insulator 214, the side surface of the insulator 216, a side surface of an insulator 222, a side surface of an insulator 275, the side surface of the insulator 280, and the side and top surfaces of the insulator 282.

Hereinafter, the conductor 240a and the conductor 240b are sometimes collectively referred to as a conductor 240. The insulator 241a and the insulator 241b are sometimes collectively referred to as an insulator 241. The conductor 246a and the conductor 246b are sometimes collectively referred to as a conductor 246.

The insulator 241a is provided in contact with an inner wall of an opening formed in the insulator 280, the insulator 282, the insulator 283, and the insulator 285, and the conductor 240a is provided in contact with the side surface of the insulator 241a. The insulator 241b is provided in contact with an inner wall of an opening formed in the insulator 280, the insulator 282, the insulator 283, and the insulator 285, and the conductor 240b is provided in contact with the side surface of the insulator 241b. Each of the insulator 241a and the insulator 241b has a structure in which a first insulator is provided in contact with the inner wall of the opening and a second insulator is provided on the inner side of the first insulator. The conductor 240a (the conductor 240b) has a structure in which a first conductor is provided in contact with the side surface of the insulator 241a (the insulator 241b) and a second conductor is provided on the inner side of the first conductor. Here, the level of a top surface of the conductor 240a (the conductor 240b)

and the level of a top surface of the insulator 285 in a region overlapped by the conductor 246*a* (the conductor 246*b*) can be substantially the same.

Although the first insulator of the insulator 241*a* (the insulator 241*b*) and the second insulator of the insulator 241*a* (the insulator 241*b*) are stacked in the transistor 200, the present invention is not limited thereto. For example, the insulator 241*a* (the insulator 241*b*) may have a single-layer structure or a stacked-layer structure of three or more layers. Although the first conductor of the conductor 240*a* (the insulator 241*b*) and the second conductor of the conductor 240*a* (the insulator 241*b*) are stacked in the transistor 200, the present invention is not limited thereto. For example the conductor 240*a* (the conductor 240*b*) may be provided as a single layer or to have a stacked-layer structure of three or more layers. In the case where a component has a stacked-layer structure, layers may be distinguished by ordinal numbers corresponding to the formation order.

[Transistor 200]

As illustrated in FIG. 6A to FIG. 6D, the transistor 200 includes the insulator 216 over the insulator 214, a conductor 205 (a conductor 205*a* and a conductor 205*b*) provided to be embedded in the insulator 214 and/or the insulator 216, the insulator 222 over the insulator 216 and the conductor 205, an insulator 224 over the insulator 222, an oxide 230*a* over the insulator 224, an oxide 230*b* over the oxide 230*a*, a conductor 242*a* over the oxide 230*b*, an insulator 271*a* over the conductor 242*a*, a conductor 242*b* over the oxide 230*b*, an insulator 271*b* over the conductor 242*b*, an insulator 252 over the oxide 230*b*, an insulator 250 over the insulator 252, an insulator 254 over the insulator 250, a conductor 260 (a conductor 260*a* and a conductor 260*b*) over the insulator 254 and overlapping with part of the oxide 230*b*, and the insulator 275 placed over the insulator 222, the insulator 224, the oxide 230*a*, the oxide 230*b*, the conductor 242*a*, the conductor 242*b*, the insulator 271*a*, and insulator 271*b*. Here, as illustrated in FIG. 6B and FIG. 6C, the insulator 252 is in contact with the top surface of the insulator 222, the side surface of the insulator 224, the side surface of the oxide 230*a*, the side surface and the top surface of the oxide 230*b*, the side surface of the conductor 242*a*, the side surface of the conductor 242*b*, the side surface of the insulator 271*a*, the side surface of the insulator 271*b*, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230*a* and the oxide 230*b* are sometimes collectively referred to as an oxide 230. The conductor 242*a* and the conductor 242*b* are sometimes collectively referred to as a conductor 242. The insulator 271*a* and the insulator 271*b* are sometimes collectively referred to as an insulator 271.

An opening reaching the oxide 230*b* is provided in the insulator 280 and the insulator 275. The insulator 252, the insulator 250, the insulator 254, and the conductor 260 are positioned in the opening. The conductor 260, the insulator 252, the insulator 250, and the insulator 254 are provided between the insulator 271*a* and the conductor 242*a*, and the insulator 271*b* and the conductor 242*b* in the channel length direction of the transistor 200. The insulator 254 includes a region in contact with the side surface of the conductor 260 and a region in contact with the bottom surface of the conductor 260.

The oxide 230 preferably includes the oxide 230*a* placed over the insulator 224 and the oxide 230*b* placed over the oxide 230*a*. Including the oxide 230*a* under the oxide 230*b* makes it possible to inhibit diffusion of impurities into the oxide 230*b* from components formed below the oxide 230*a*.

Note that although the transistor 200 is illustrated to have a structure in which two layers, the oxide 230*a* and the oxide 230*b*, are stacked as the oxide 230, one embodiment of the present invention is not limited thereto. For example, the oxide 230 may be provided as a single layer of the oxide 230*b* or to have a stacked-layer structure of three or more layers, or the oxide 230*a* and the oxide 230*b* may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242*a* functions as one of a source and a drain, and the conductor 242*b* functions as the other of the source and the drain. At least part of a region of the oxide 230 overlapping with the conductor 260 functions as a channel formation region.

Figure 7A:
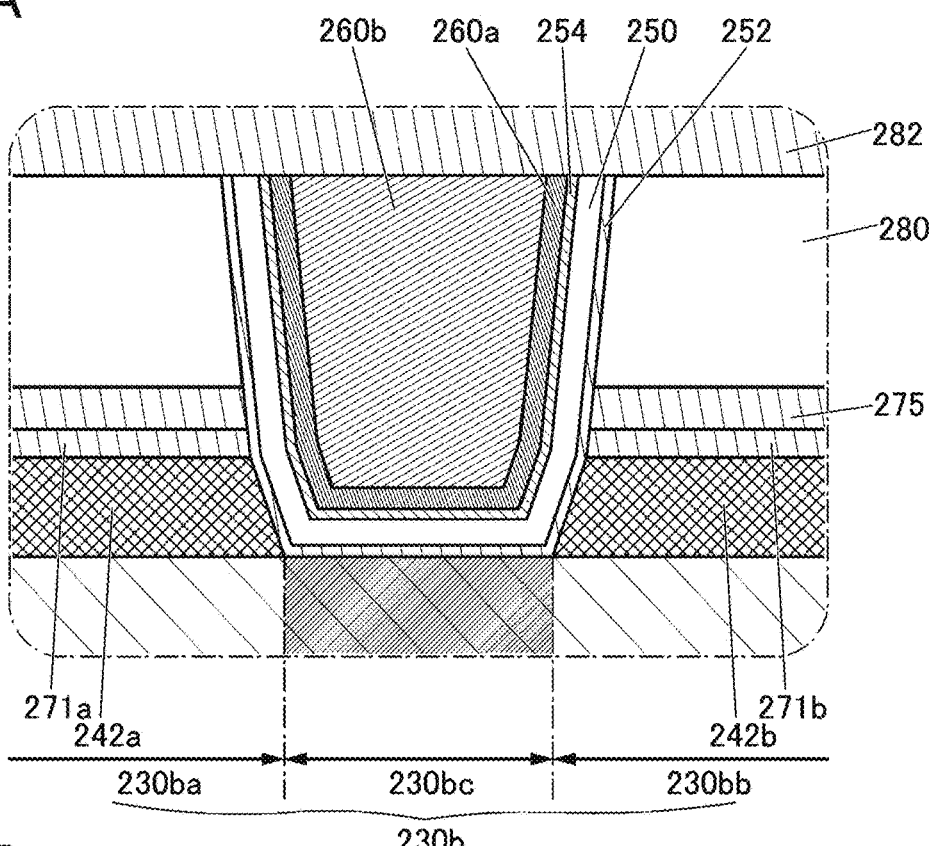
FIG. 7A and FIG. 7B are cross-sectional views of a semiconductor device of one embodiment of the present invention.

FIG. 7A is an enlarged view of the vicinity of the channel formation region in FIG. 6B. As illustrated in FIG. 7A, the oxide 230*b* includes a region 230*bc* functioning as the channel formation region of the transistor 200 and a region 230*ba* and a region 230*bb* that are provided to sandwich the region 230*bc* and function as a source region and a drain region. At least part of the region 230*bc* overlaps with the conductor 260. In other words, the region 230*bc* is provided between the conductor 242*a* and the conductor 242*b*. The region 230*ba* is provided to overlap with the conductor 242*a*, and the region 230*bb* is provided to overlap with the conductor 242*b*.

The region 230*bc* functioning as the channel formation region has a smaller amount of oxygen vacancies or a lower impurity concentration than those of the regions 230*ba* and 230*bb*, in other words, the region 230*bc* is a high-resistance region with a low carrier concentration. Thus, the region 230*bc* can be regarded as being i-type (intrinsic) or substantially i-type.

The region 230*ba* and the region 230*bb* functioning as the source region and the drain region are each a low-resistance region with an increased carrier concentration because it includes a large amount of oxygen vacancies or has a high concentration of an impurity such as hydrogen, nitrogen, or a metal element. In other words, the region 230*ba* and the region 230*bb* are each an n-type region having a higher carrier concentration and a lower resistance than those of the region 230*bc*.

The carrier concentration in the region 230*bc* functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 230*bc* functioning as the channel formation region is not particularly limited and can be, for example, $1 \times 10^{-9}$ cm$^{-3}$.

Between the region 230*bc* and the region 230*ba* (the region 230*bb*), a region having a carrier concentration that is lower than or substantially equal to the carrier concentrations in the region 230*ba* (the region 230*bb*) and higher than or substantially equal to the carrier concentration in the region 230*bc* may be formed. That is, the region functions as a junction region between the region 230*bc* and the region 230*ba* (the region 230*bb*). The hydrogen concentration in the junction region is lower than or substantially equal to the hydrogen concentration in the region 230*ba* (the region 230*bb*) and higher than or substantially equal to the hydrogen concentration in the region 230*bc* in some cases. The amount of oxygen vacancies in the junction region is smaller than or substantially equal to the amount of oxygen vacancies in the region 230*ba* (the region 230*bb*) and larger than or substantially equal to the amount of oxygen vacancies in the region 230*bc* in some cases.

Although FIG. 7A illustrates an example in which the region 230*ba*, the region 230*bb*, and the region 230*bc* are formed in the oxide 230*b*, the present invention is not limited thereto. For example, the above regions may be formed not only in the oxide 230*b* but also in the oxide 230*a*.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide 230*a* and the oxide 230*b*) including the channel formation region.

The metal oxide functioning as a semiconductor preferably has a band gap of 2 eV or more, further preferably 2.5 eV or more. With the use of a metal oxide having such a large bandgap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The atomic ratio of In to the element M in the metal oxide used as the oxide 230*b* is preferably greater than the atomic ratio of In to the element M in the metal oxide used as the oxide 230*a*.

The oxide 230*a* is placed under the oxide 230*b*, whereby impurities and oxygen can be inhibited from diffusing into the oxide 230*b* from components formed below the oxide 230*a*.

The oxide 230*b* preferably has crystallinity. It is particularly preferable to use a CAAC-OS (c-axis aligned crystalline oxide semiconductor) as the oxide 230*b*.

The CAAC-OS is a metal oxide having a dense structure with high crystallinity and a small amount of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Hence, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of i-type (intrinsic) or substantially i-type.

As a countermeasure to the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 200. Furthermore, a variation of oxygen supplied to the source region or the drain region in the substrate plane leads to a variation in characteristics of the semiconductor device including the transistor.

Therefore, the region 230*bc* functioning as the channel formation region in the oxide semiconductor is preferably an i-type or substantially i-type region with reduced carrier concentration, whereas the region 230*ba* and the region 230*bb* functioning as the source region and the drain region are preferably n-type regions with high carrier concentrations. That is, it is preferable that oxygen vacancies and VoH in the region 230*bc* of the oxide semiconductor be reduced and the region 230*ba* and the region 230*bb* not be supplied with an excess amount of oxygen.

Thus, in this embodiment, microwave treatment is performed in an oxygen-containing atmosphere in a state where the conductor 242*a* and the conductor 242*b* are provided over the oxide 230*b* so that oxygen vacancies and VoH in the region 230*bc* can be reduced. Here, the microwave treatment refers to, for example, treatment using an apparatus including a power source that generates high-density plasma with the use of a microwave. Note that in this specification and the like, a microwave refers to an electromagnetic wave having a frequency from 300 MHz to 300 GHz, inclusive in some cases.

The microwave treatment in an oxygen-containing atmosphere converts an oxygen gas into plasma using a high-frequency wave such as a microwave or RF and activates the oxygen plasma. At this time, the region 230*bc* can be irradiated with the high-frequency wave such as a microwave or RF. By the effect of the plasma, the microwave, or the like, VoH in the region 230*bc* can be divided into an oxygen vacancy ($V_O$) and hydrogen (H); the hydrogen can be removed from the region 230*bc* and the oxygen vacancy can be filled with oxygen. That is, the reaction "VoH→H+ $V_O$" occurs in the region 230*bc*, so that the hydrogen concentration in the region 230*bc* can be reduced. As a result, oxygen vacancies and VoH in the region 230*bc* can be reduced to lower the carrier concentration.

In the microwave treatment in an oxygen-containing atmosphere, the high-frequency wave such as the microwave or RF, the oxygen plasma, or the like is blocked by the conductor 242*a* and the conductor 242*b* and does not affect the region 230*ba* nor the region 230*bb*. In addition, the effect of the oxygen plasma can be reduced by the insulator 271, the insulator 275, and the insulator 280 that are provided so as to cover the oxide 230*b* and the conductor 242. Hence, a reduction in VoH and supply of an excess amount of oxygen do not occur in the region 230*ba* and the region 230*bb* in the microwave treatment, preventing a decrease in carrier concentration.

The oxygen supplied into the region 230*bc* has any of a variety of forms such as an oxygen atom, an oxygen molecule, an oxygen radical (an O radical, an atom or a molecule having an unpaired electron, or an ion). Note that the oxygen supplied into the region 230*bc* has any one or more of the above forms, particularly preferably an oxygen radical.

Here, the microwave treatment in an oxygen-containing atmosphere is preferably performed after the deposition of an insulating film to be the insulator 252 and/or after the deposition of an insulating film to be the insulator 250. By performing the microwave treatment in an oxygen-containing atmosphere through the insulator 252 and/or the insulator 250 in such a manner, oxygen can be efficiently supplied into the region 230*bc*. In addition, the insulator 252 is provided to be in contact with the side surface of the conductor 242 and the surface of the region 230*bc*, thereby preventing oxygen more than necessary from being supplied to the region 230*bc* and preventing the side surface of the conductor 242 from being oxidized. Furthermore, the side surface of the conductor 242 can be prevented from being oxidized when an insulating film to be the insulator 250 is formed.

In the above manner, oxygen vacancies and VoH can be selectively reduced in the region 230*bc* of the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited and the n-type conductivity can be maintained. As a result, a change in the electrical characteristics of the transistor 200 can be inhibited, and thus a variation in the electrical characteristics of the transistors 200 in the substrate plane can be inhibited With the above structure, a semiconductor device with a small variation in transistor characteristics can be provided. A semiconductor device with favorable reliability can be provided. A semiconductor device having favorable electrical characteristics can be provided.

As illustrated in FIG. 6C, a curved surface may be provided between a side surface of the oxide 230*b* and a top surface of the oxide 230*b* in a cross-sectional view of the transistor 200 in the channel width direction. In other words, an end portion of the side surface and an end portion of the top surface may be curved (hereinafter also referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230*b* with the insulator 252, the insulator 250, the insulator 254, and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. Furthermore, the atomic ratio of In to the element M in the metal oxide used as the oxide 230*b* is preferably greater than the atomic ratio of In to the element M in the metal oxide used as the oxide 230*a*.

The oxide 230*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230*b* by the source electrode or the drain electrode. This can reduce oxygen extraction from the oxide 230*b* even when heat treatment is performed; thus, the transistor 200 is stable with respect to high temperatures in a manufacturing process (what is called thermal budget).

Here, the conduction band minimum gradually changes at a junction portion of the oxide 230*a* and the oxide 230*b*. In other words, the conduction band minimum at the junction portion of the oxide 230*a* and the oxide 230*b* continuously changes or is continuously connected. To achieve this, the density of defect states in a mixed layer formed at the interface between the oxide 230*a* and the oxide 230*b* is preferably made low.

Specifically, when the oxide 230*a* and the oxide 230*b* contain a common element as a main component besides oxygen, a mixed layer with a low density of defect states can be formed. For example, in the case where the oxide 230*b* is an In-M-Zn oxide, an In-M-Zn oxide, an M-Zn oxide, an oxide of the element M, an In—Zn oxide, indium oxide, or the like may be used as the oxide 230*a*.

Specifically, as the oxide 230*a*, a metal oxide with a composition of In:M:Zn=1:3:4 [atomic ratio] or in the neighborhood thereof, or a metal oxide with a composition of In:M:Zn=1:1:0.5 [atomic ratio] or in the neighborhood thereof is used. As the oxide 230*b*, a metal oxide with a composition of In:M:Zn=1:1:1 [atomic ratio] or in the neighborhood thereof, or a metal oxide with a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

As illustrated in FIG. 6C or the like, the insulator 252 formed using aluminum oxide or the like is provided in contact with the top and side surfaces of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In—Zn oxide. Such an increase in the atomic ratio of indium in the vicinity of the surface of the oxide 230, especially the vicinity of a surface of the oxide 230b, can increase the field-effect mobility of the transistor 200.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as a function of less easily transmitting the substance). In addition, a barrier property in this specification means a function of capturing and fixing (also referred to as gettering) a targeted substance.

An insulator having a function of inhibiting diffusion of oxygen and impurities such as water and hydrogen is preferably used for the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing or fixing hydrogen well, is preferably used for the insulator 214, the insulator 271, the insulator 282, and the insulator 285. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing into the substrate side through the insulator 212 and the insulator 214. Alternatively, oxygen contained in the insulator 280 and the like can be inhibited from diffusing into the components above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be manufactured.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 212, the insulator 275, and the insulator 283 are preferably low in some cases. For example, by setting the resistivities of the insulator 212, the insulator 275, and the insulator 283 to approximately $1 \times 10^{13}$ $\Omega$cm, the insulator 212, the insulator 275, and the insulator 283 can sometimes reduce charge up of the conductor 205, the conductor 242, the conductor 260, or the conductor 246 in treatment using plasma or the like in the manufacturing process of a semiconductor device. The resistivities of the insulator 212, the insulator 275, and the insulator 283 are preferably higher than or equal to $1\times10^{10}$ Ωcm and lower than or equal to $1\times10^{15}$ Ωcm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205*a* and the conductor 205*b*. The conductor 205*a* is provided in contact with a bottom surface and a sidewall of the opening. The conductor 205*b* is provided to be embedded in a recessed portion formed in the conductor 205*a*. Here, the top surface of the conductor 205*b* is substantially level with the top surfaces of the conductor 205*a* and the insulator 216.

Here, for the conductor 205*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom. Alternatively, it is preferable to use a conductive material that has a function of inhibiting diffusion of oxygen (e.g., at least one of an oxygen atom, an oxygen molecule, and the like).

When the conductor 205*a* is formed using a conductive material having a function of inhibiting diffusion of hydrogen, impurities such as hydrogen contained in the conductor 205*b* can be prevented from diffusing into the oxide 230 through the insulator 224 and the like. When the conductor 205*a* is formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 205*a*. For example, titanium nitride is used for the conductor 205*a*.

Moreover, the conductor 205*b* is preferably formed using a conductive material containing tungsten, copper, or aluminum as its main component. For example, tungsten is used for the conductor 205*b*.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurity such as hydrogen contained in the insulator 216 can be reduced, inhibiting the diffusion of the impurity into the oxide 230.

As illustrated in FIG. 6A, the conductor 205 is preferably provided to be larger than a region of the oxide 230 that does not overlap with the conductor 242*a* or the conductor 242*b*. As illustrated in FIG. 6C, it is particularly preferable that the conductor 205 extend to a region outside end portions of the oxide 230*a* and the oxide 230*b* in the channel width direction. That is, the conductor 205 and the conductor 260 preferably overlap each other with the insulators therebetween on the outer side of a side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 6C, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205*a* and the conductor 205*b* is illustrated, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 to the substrate side and/or diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 or the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, or zirconium oxide may be used for the insulator 222. As miniaturization and high integration of transistors progress, a problem such as leakage current may arise because of a thinner gate insulator. When a high-k material is used for an insulator functioning as the gate insulator, a gate potential at the time when the transistor operates can be lowered while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Silicon oxide or silicon oxynitride, for example, can be used as appropriate for the insulator 224 that is in contact with the oxide 230.

In a manufacturing process of the transistor 200, heat treatment is preferably performed with a surface of the oxide 230 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, heat treatment may be performed in an atmosphere containing an oxidizing gas at 10 ppm or more, 1% or more, or 10% or more in order to compensate for released oxygen after heat treatment in a nitrogen gas or inert gas atmosphere. Alternatively, heat treatment may be performed in a nitrogen gas or inert gas atmosphere successively after heat treatment in an atmosphere containing an oxidizing gas at 10 ppm or more, 1% or more, or 10% or more.

Note that oxygen adding treatment performed on the oxide 230 can promote a reaction in which oxygen vacancies in the oxide 230 are repaired with supplied oxygen, i.e., a reaction of "$V_O+O \rightarrow null$". Furthermore, supplied oxygen reacts with hydrogen remaining in the oxide 230, so that the hydrogen can be removed as $H_2O$ (dehydration can be caused). This can inhibit recombination of hydrogen remaining in the oxide 230 with oxygen vacancies and formation of $V_OH$.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with a side surface of the insulator 224 and a top surface of insulator 222.

The conductor 242a and the conductor 242b are provided in contact with a top surface of the oxide 230b. Each of the conductor 242a and the conductor 242b functions as a source electrode or a drain electrode of the transistor 200.

For the conductor 242, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between a side surface of the conductor 242 and a top surface of the conductor 242. When no curved surface is formed in the conductor 242, the conductor 242 can have a large cross-sectional area in the channel width direction as illustrated in FIG. 6D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. For example, a nitride containing silicon such as silicon nitride may be used for the insulator 271. The insulator 271 preferably has a function of capturing impurities such as hydrogen. In that case, for the insulator 271, a metal oxide having an amorphous structure, for example, an insulator such as aluminum oxide or magnesium oxide, may be used. It is particularly preferable to use aluminum oxide having an amorphous structure or amorphous aluminum oxide for the insulator 271 because hydrogen can be captured or fixed more effectively in some cases. Accordingly, the transistor 200 and a semiconductor device which have favorable characteristics and high reliability can be manufactured.

The insulator 275 is provided to cover the insulator 224, the oxide 230a, the oxide 230b, the conductor 242, and the insulator 271. The insulator 275 preferably has a function of capturing and fixing hydrogen. In that case, the insulator 275 preferably includes an insulator such as silicon nitride or a metal oxide having an amorphous structure (e.g., aluminum oxide or magnesium oxide). Alternatively, for example, a stacked-layer film of aluminum oxide and silicon nitride over the aluminum oxide may be used as the insulator 275.

When the above insulator 271 and the insulator 275 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium may be used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 6C, the insulator 252 is provided in contact with the top surface and the side surface of the oxide 230b, the side surface of the oxide 230a, the side surface of the insulator 224, and the top surface of the insulator 222. That is, the regions of the oxide 230a, the oxide 230b, and the insulator 224 that overlap with the conductor 260 are covered with the insulator 252 in the cross section in the channel width direction. With this structure, the insulator 252 having a barrier property against oxygen can prevent release of oxygen in the oxide 230a and in the oxide 230b at the time of heat treatment or the like. This can inhibit formation of oxygen vacancies in the oxide 230a and the oxide 230b. Thus, the amount of oxygen vacancies and VoH formed in the region 230bc can be reduced. Thus, the transistor 200 can have favorable electrical characteristics and higher reliability.

Even when an excess amount of oxygen is contained in the insulator 280, the insulator 250 and the like, oxygen can be inhibited from being excessively supplied to the oxide 230a and the oxide 230b. Thus, the region 230ba and the region 230bb are prevented from being excessively oxidized by oxygen through the region 230bc; a reduction in on-state current or field-effect mobility of the transistor 200 can be inhibited.

As illustrated in FIG. 6B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280, and the like, together with the insulator 254, the insulator 250, and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 252 preferably includes a region having the above-described thickness. The thickness of the insulator 252 is preferably smaller than that of the insulator 250. In that case, at least part of the insulator 252 preferably includes a region having a thickness smaller than that of the insulator 250.

To form the insulator 252 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be formed on the side surface of the opening formed in the insulator 280 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 250 functions as part of the gate insulator. The insulator 250 is preferably in contact with at least part of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride are preferable because they are thermally stable. The insulator 250 in this case is an insulator containing at least oxygen and silicon.

As in the insulator 224, the concentration of impurities such as water and hydrogen in the insulator 250 is preferably reduced.

The thickness of the insulator 250 is preferably greater than or equal to 0.5 nm and less than or equal to 20 nm, further preferably greater than or equal to 1.0 and less than or equal to 15.0 nm. In this case, at least part of the insulator 250 preferably has a region with the above thickness. To deposit the insulator 250 with a small thickness and good coverage, the insulator 250 is preferably deposited by an ALD method, for example.

To obtain a high quality film, the insulating film to be the insulator 250 is preferably deposited at high temperature (e.g., a temperature higher than or equal to 400° C.), further preferably deposited at a temperature that can inhibit oxidation of the side surface of the conductor 242. The temperature is, for example, lower than 400° C., preferably lower than or equal to 300° C., further preferably lower than or equal to 250° C., and higher than or equal to 100° C. Depositing the insulating film at such a temperature can inhibit oxidation of the side surface of the conductor 242 at the time of the deposition of the insulating film.

After the insulating film to be the insulator 250 is deposited, microwave treatment is preferably performed in an oxygen-containing atmosphere. The microwave treatment can improve the film quality of the insulator 250. As the improvement in the film quality of the insulator 250, for example, a reduction in hydrogen concentration in the insulator 250 can be given. In other words, the microwave treatment can reduce the hydrogen concentration in the insulator 250. Accordingly, the hydrogen concentration in the oxide 230 in the vicinity of the insulator 250 can be reduced, so that the reliability of the transistor 200 can be improved.

Note that as another improvement in the film quality of the insulator 250 by the microwave treatment, an increase in the density of the insulator 250 is expected. With the dense structure, the insulator 250 has reduced density of defect states, whereby the reliability of the transistor 200 can be improved.

As described in the above embodiment, in the case where silicon oxide is used as the insulator 250, it is possible to improve the film quality of the silicon oxide when microwave treatment is performed in an oxygen-containing atmosphere. Specifically, the microwave treatment can lower the $\gamma$ peak. Therefore, hydrogen in the silicon oxide can be reduced and the diffusion of hydrogen into the oxide 230 can be inhibited. Note that as the temperature at the time of the microwave treatment is increased, oxidation of the side surface of the conductor 242 might be promoted although the $\gamma$ peak can be efficiently lowered. The effect of lowering the Y peak can be obtained even when the temperature range of the microwave treatment is higher than or equal to 150° C. and lower than or equal to 400° C. or higher than or equal to 200° C. and lower than or equal to 300° C., for example, approximately 250° C. Therefore, it is preferable that the microwave treatment be performed at such a temperature range.

Accordingly, it is preferable that the insulating film to be the insulator 250 be deposited at relatively low temperatures and then subjected to microwave treatment in an oxygen-containing atmosphere. Thus, the insulator 250 with favorable film quality can be formed while oxidation of the side surface of the conductor 242 is inhibited. Furthermore, the insulator 250 with reduced hydrogen concentration can be formed while oxidation of the side surface of the conductor 242 is inhibited. Therefore, the reliability of the transistor 200 can be improved.

Although FIG. 6B or the like illustrates a single-layer structure of the insulator 250, the present invention is not limited to this structure, and a stacked-layer structure of two or more layers may be employed. For example, as illustrated in FIG. 7B, the insulator 250 may have a stacked-layer structure including two layers of an insulator 250a and an insulator 250b over the insulator 250a.

Figure 7B:
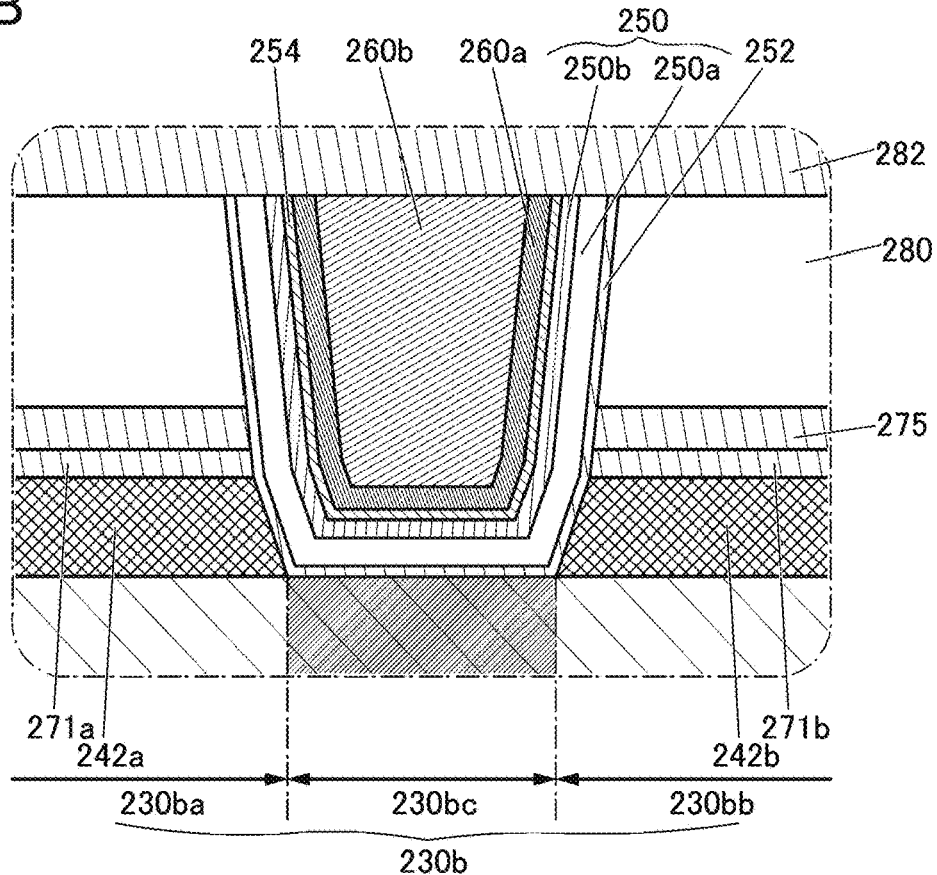
Figure 9A:
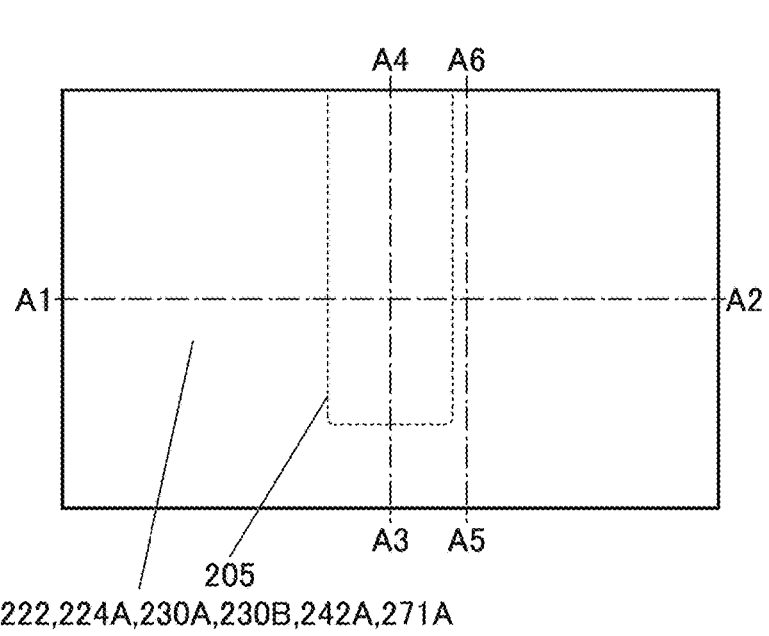
FIG. 9A is a top view illustrating a method for manufacturing a semiconductor device that is one embodiment of the present invention.
Figure 9C:
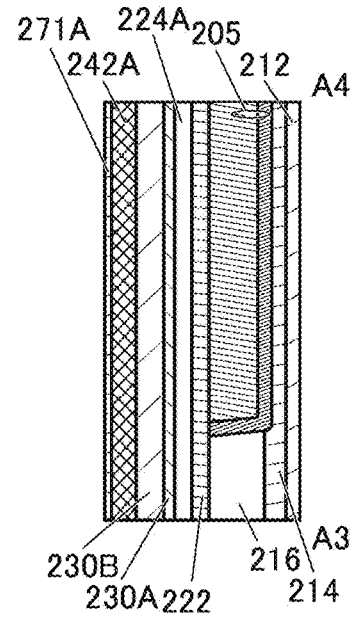
FIG. 9B to FIG. 9D are cross-sectional views illustrating the method for manufacturing a semiconductor device that is one embodiment of the present invention.
Figure 9B:
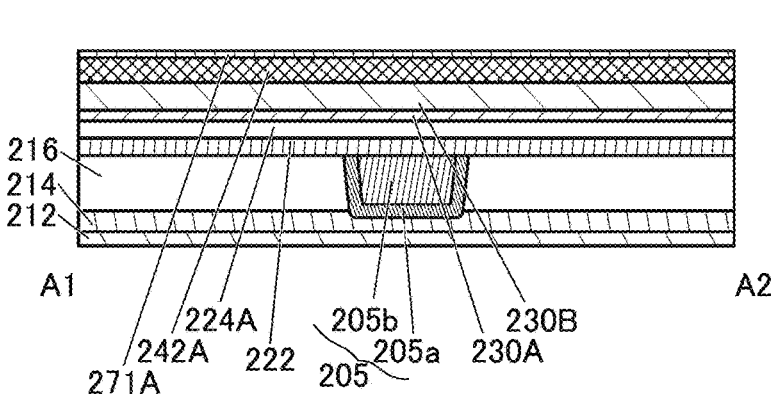
Figure 9D:
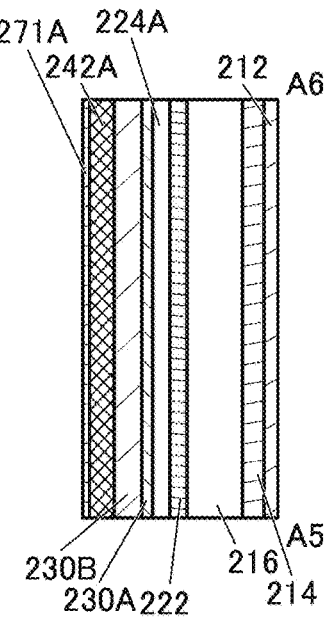
Figure 11A:
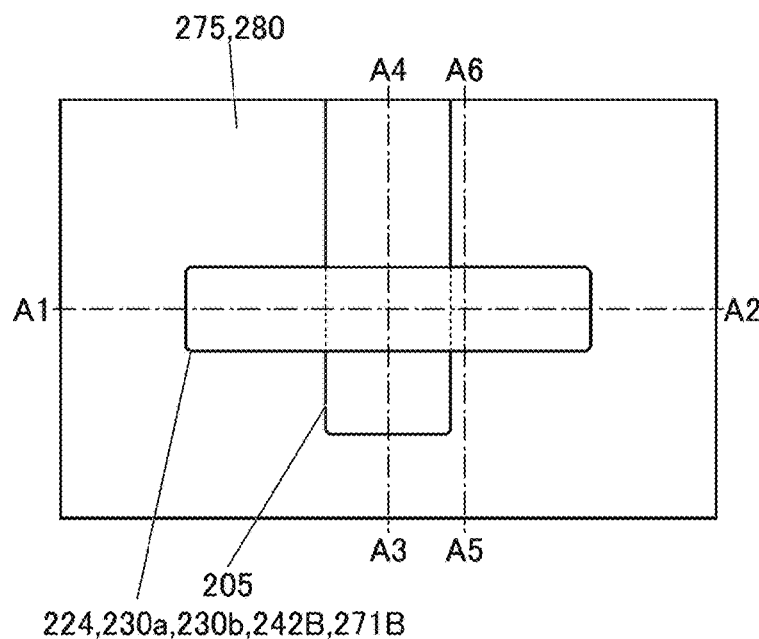
FIG. 11A is a top view illustrating the method for manufacturing a semiconductor device that is one embodiment of the present invention.
Figure 11C:
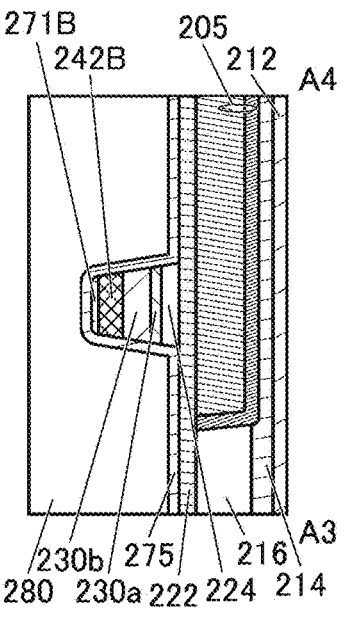
FIG. 11B to FIG. 11D are cross-sectional views illustrating the method for manufacturing a semiconductor device that is one embodiment of the present invention.
Figure 11B:
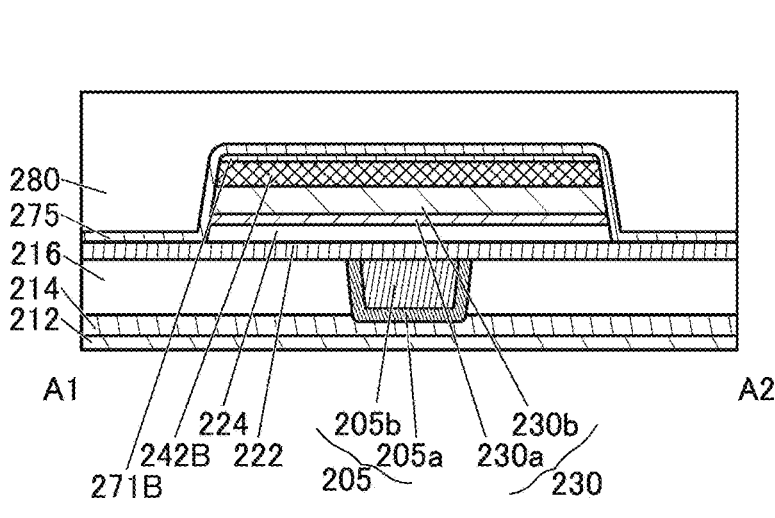
Figure 11D:
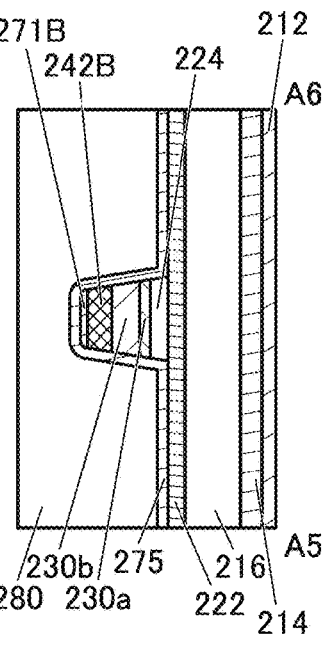

In the case where the insulator 250 has a stacked-layer structure of two layers as illustrated in FIG. 7B, it is preferable that the insulator 250a in a lower layer be formed using an insulator that is likely to transmit oxygen and the insulator 250b in an upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b is an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250b may include a region having a thickness like the above-described thickness.

In the case where silicon oxide, silicon oxynitride, or the like is used for the insulator 250a, the insulator 250b may be formed using an insulating material that is a high-k material having a high relative permittivity. The gate insulator having a stacked-layer structure of the insulator 250a and the insulator 250b can be thermally stable and can have a high relative permittivity. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide 230b. As the insulator 254, an insulator that can be used as the insulator 283 described above may be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 254 preferably includes a region having the above-described thickness. The thickness of the insulator 254 is preferably smaller than that of the insulator 250. In that case, at least part of the insulator 254 may include a region having a thickness that is smaller than that of the insulator 250.

The conductor 260 functions as the first gate electrode of the transistor 200. The conductor 260 preferably includes the conductor 260a and the conductor 260b placed over the conductor 260a. For example, the conductor 260a is preferably placed to cover a bottom surface and a side surface of the conductor 260b. Moreover, as illustrated in FIG. 6B and FIG. 6C, the top surface of the conductor 260 is substantially aligned with the uppermost portion of the insulator 252, the uppermost portion of the insulator 250, and the uppermost portion of the insulator 254. Although the conductor 260 has a two-layer structure of the conductor 260a and the conductor 260b in FIG. 6B and FIG. 6C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material that has a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 6C, in the channel width direction of the transistor 200, with reference to a bottom surface of the insulator 222, the level of the bottom surface of the conductor 260 in a region where the conductor 260 and the oxide 230b do not overlap is preferably lower than the level of a bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With a reference to the bottom surface of the insulator 222, the difference between the level of the bottom surface of the conductor 260 in a region where the conductor 260 do not overlap the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 252, the insulator 250, the insulator 254, and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 280 is preferably reduced. Oxide containing silicon such as silicon oxide, silicon oxynitride, or the like is used as appropriate for the insulator 280, for example.

The insulator 282 preferably functions as barrier insulating films that inhibit impurities such as water and hydrogen from diffusing into the insulator 280 from above and preferably have a function of capturing impurities such as hydrogen. The insulator 282 preferably functions as a barrier insulating film that inhibits passage of oxygen. For each of the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, for hydrogen can be captured or fixed more effectively in some cases. Accordingly, the transistor 200 and a semiconductor device which have favorable characteristics and high reliability can be manufactured.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, high-density silicon nitride be formed. To obtain the insulator 283, silicon nitride deposited by a PEALD method or a CVD method may be stacked over silicon nitride deposited by a sputtering method.

For the conductor 240, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of impurities such as water and hydrogen is preferably used for a first conductor placed in the vicinity of the insulator 285, the insulator 283, the insulator 282, the insulator 280, the insulator 275, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Furthermore, impurities such as water and hydrogen contained in a layer above the insulator 283 can be inhibited from entering the oxide 230 through the conductor 240.

For the insulator 241, for example, a barrier insulating film that can be used for the insulator 275 or the like may be used. For the insulator 241, for example, an insulator such as silicon nitride, aluminum oxide, or silicon nitride oxide can be used. Since the insulator 241a (the insulator 241b) is provided in contact with the insulator 283, the insulator 282, and the insulator 271, impurities such as water and hydrogen contained in the insulator 280 or the like can be inhibited from entering the oxide 230 through the conductor 240a (the conductor 240b). In particular, silicon nitride is suitable because of its high blocking property against hydrogen. Furthermore, oxygen contained in the insulator 280 can be prevented from being absorbed by the conductor 240.

When the insulator 241a and the insulator 241b each have a stacked-layer structure illustrated in FIG. 6B, a first insulator in contact with an inner wall of the opening formed in the insulator 280 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be prevented from entering the conductor 240.

The conductor 246a functioning as a wiring may be provided in contact with the top surface of the conductor 240a, and the conductor 246b functioning as a wiring may be provided in contact with the top surface of the conductor 240b. The conductor 246 is preferably formed using a conductive material containing tungsten, copper, or aluminum as its main component. The conductor 246a and the conductor 246b may each have a stacked-layer structure, for example, may be stacked layers of titanium or titanium nitride and the above conductive material. Note that the conductors may be formed to be embedded in an opening provided in an insulator.

<Component Materials of Semiconductor Device>

Component materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is preferable to use, in particular, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also referred to as a metal oxide in some cases. A metal oxide containing nitrogen may be referred to as a metal oxynitride.

<Classification of Crystal Structure>

First, classification of the crystal structures of an oxide semiconductor will be described using FIG. 8A. FIG. 8A is a diagram showing the classification of crystal structures of an oxide semiconductor, typically IGZO (a metal oxide containing In, Ga, and Zn).

As shown in FIG. 8A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and polycrystal). Note that "Crystalline" excludes single crystal, poly crystal, and completely amorphous. "Crystal" includes single crystal and poly crystal.

Note that the structures in the thick frame in FIG. 8A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. Here, FIG. 8B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 8B and obtained by GIXD measurement is hereinafter simply referred to as an XRD spectrum. The CAAC-IGZO film shown in FIG. 8B has a composition in the neighborhood of In:Ga:Zn=4:2:3 [atomic ratio]. In addition, the thickness of the CAAC-IGZO film shown in FIG. 8B is 500 nm.

In FIG. 8B, the horizontal axis represents $2\theta$ [deg.], and the vertical axis represents intensity [a.u.]. As shown in FIG. 8B, a clear peak indicating crystallinity is detected in the XRD spectrum of the CAAC-IGZO film. Specifically, a peak indicating c-axis alignment is detected at $2\theta$ of around $31°$ in the XRD spectrum of the CAAC-IGZO film. As shown in FIG. 8B, the peak at $2\theta$ of around $31°$ is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 8C shows a diffraction pattern of the CAAC-IGZO film. FIG. 8C shows a diffraction pattern observed by NBED in which an electron beam is incident in a direction parallel to the substrate. Note that the CAAC-IGZO film shown in FIG. 8C has a composition in the vicinity of In:Ga:Zn=4:2:3 [atomic ratio]. In the nanobeam electron diffraction method, electron diffraction is performed with a probe diameter of 1 nm.

As shown in FIG. 8C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 8A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS Other examples of the non-single-crystal oxide semiconductor include a and nc-OS. polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be rephrased as a region containing In as its main component. The second region can be rephrased as a region containing Ga as its main component.

Note that a clear boundary between the first region and second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor in the channel formation region and the concentration of silicon or carbon in the vicinity of an interface with the oxide semiconductor in the channel formation region (the concentrations obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region in the oxide semiconductor is preferably reduced as much as possible. Specifically, the hydrogen concentration in the channel formation region in the oxide semiconductor, which is obtained by SIMS, is set lower than $1\times10^{20}$ atoms/$cm^3$, preferably lower than $5\times10^{19}$ atoms/$cm^3$, further preferably lower than $1\times10^{19}$ atoms/$cm^3$, still further preferably lower than $5\times10^{18}$ atoms/$cm^3$, yet still further preferably lower than $1\times10^{18}$ atoms/$cm^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Method for Manufacturing Semiconductor Device>

Next, a method for manufacturing the semiconductor device that is one embodiment of the present invention and is illustrated in FIG. 6A to FIG. 6D is described with reference to FIG. 9A to FIG. 18D.

Note that A of each drawing is a top view. Moreover, B of each drawing is a cross-sectional view corresponding to a portion indicated by dashed-dotted line A1-A2 in A of each drawing, and is also a cross-sectional view in the channel length direction of the transistor 200. Furthermore, C of each drawing is a cross-sectional view corresponding to a portion indicated by dashed-dotted line A3-A4 in A of each drawing, and is also a cross-sectional view in the channel width direction of the transistor 200. Furthermore, D of each drawing is a cross-sectional view of a portion indicated by dashed-dotted line A5-A6 in A of each drawing. Note that for clarity of the drawing, some components are not illustrated in the top view of A of each drawing.

Hereinafter, an insulating material for forming an insulator, a conductive material for forming a conductor, or a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, and the like can be used.

A CVD method and an ALD method are different from a sputtering method in which particles ejected from a target or the like are deposited. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be deposited depending on the flow rate ratio of the source gases. For example, by a CVD method, by changing the flow rate ratio of the source gases during the deposition, a film in which the composition is continuously changed can be deposited. In the case where the film is deposited while the flow rate ratio of the source gases is changed, as compared to the case where the film is deposited using a plurality of deposition chambers, the time taken for the deposition can be shortened because the time taken for transfer and pressure adjustment is omitted. Thus, the productivity of the semiconductor device can be increased in some cases.

By an ALD method, a film with a certain composition can be deposited by concurrently introducing a plurality kinds of different precursors or controlling the cycle number of each of the plurality kinds of different precursors.

First, a substrate (not illustrated) is prepared, and the insulator 212 is deposited over the substrate (see FIG. 9A to FIG. 9D). The insulator 212 is preferably deposited by a sputtering method. By using a sputtering method that does not need to use a molecule containing hydrogen as a deposition gas, the hydrogen concentration in the insulator 212 can be reduced. Without limitation to a sputtering method, the insulator 212 may be deposited by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, upward diffusion of the metal through the insulator 212 can be inhibited.

Next, the insulator 214 is deposited over the insulator 212 (see FIG. 9A to FIG. 9D). The insulator 214 is preferably deposited by a sputtering method. By using a sputtering method that does not need to use a molecule containing hydrogen as a deposition gas, the hydrogen concentration in the insulator 214 can be reduced. Without limitation to a sputtering method, the insulator 214 may be deposited by a CVD method, an MBE method, a PLD method, an ALD method, or the like as appropriate.

In this embodiment, for the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF (Radio Frequency) power may be applied to the substrate. The amount of oxygen supplied to a layer below the insulator 214 can be controlled depending on the amount of the RF power applied to the substrate. The RF power is higher than or equal to 0 W/cm$^2$ and lower than or equal to 1.86 W/cm$^2$. In other words, the supply amount of oxygen can be changed to be appropriate for the characteristics of the transistor, with the RF power used at the time of forming the insulator 214. Accordingly, an appropriate amount of oxygen for improving the reliability of the transistor can be supplied. The RF frequency is preferably 10 MHz or higher. The typical frequency is 13.56 MHZ. The higher the RF frequency is, the less damage the substrate gets.

A metal oxide including an amorphous structure, which has an excellent function of capturing and fixing hydrogen, such as aluminum oxide, is preferably used for the insulator 214. In this case, the insulator 214 captures or fixes hydrogen contained in the insulator 216 and the like and prevents the hydrogen from diffusing into the oxide 230. In particular, it is preferable to use aluminum oxide having an amorphous structure or amorphous aluminum oxide for the insulator 214 because hydrogen can be captured or fixed more effectively in some cases. Accordingly, the transistor 200 and a semiconductor device which have favorable characteristics and high reliability can be manufactured.

Next, the insulator 216 is deposited over the insulator 214. The insulator 216 is preferably deposited by a sputtering method. By using a sputtering method that does not need to use a molecule containing hydrogen as a deposition gas, the hydrogen concentration in the insulator 216 can be reduced. Without limitation to a sputtering method, the insulator 216 may be deposited by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively deposited without exposure to the air. For example, a multi-chamber deposition apparatus is used. As a result, the amounts of hydrogen in the deposited insulator 212, insulator 214, and insulator 216 can be reduced, and furthermore, entry of hydrogen into the films in intervals between deposition steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film preferably includes a conductor that has a function of inhibiting the passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, a titanium nitride film is formed as the conductive film to be the conductor 205a. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing to the outside through the conductor 205a.

Next, a conductive film to be the conductor 205b is deposited. As the conductive film, tantalum, tungsten, titanium, molybdenum, aluminum, copper, a molybdenum-tungsten alloy, or the like can be used. The conductive film can be formed by a plating method, a sputtering method, a CVD method, an MBE method, a PLD method, an ALD method, or the like. In this embodiment, a tungsten film is formed as the conductive film.

Next, by performing CMP treatment, the conductive film to be the conductor 205a and the conductive film to be the conductor 205b are partly removed to expose the insulator 216 (see FIG. 9A to FIG. 9D). As a result, the conductor 205a and the conductor 205b remain only in the opening portion. Note that the insulator 216 is partly removed by the CMP treatment in some cases.

Next, the insulator 222 is formed over the insulator 216 and the conductor 205 (see FIG. 9A to FIG. 9D). An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, for the insulator 222, hafnium oxide is deposited by an ALD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, treatment is performed with a flow rate ratio of a nitrogen gas and an oxygen gas of 4 slm:1 slm at 400° C. for one hour after the deposition of the insulator 222. By the heat treatment, impurities such as water and hydrogen contained in the insulator 222 can be removed, for example. In the case where an oxide containing hafnium is used for the insulator 222, the insulator 222 is partly crystallized by the heat treatment in some cases. The heat treatment can also be performed after the deposition of the insulator 224, for example.

Next, an insulating film 224A is deposited over the insulator 222 (see FIG. 9A to FIG. 9D). The insulating film 224A can be deposited by a sputtering method, a CVD method, an MBE method, a PLD method, an ALD method, or the like. In this embodiment, as the insulating film 224A, a silicon oxide film is formed by a sputtering method. By using a sputtering method that does not need to use a molecule containing hydrogen as a deposition gas, the hydrogen concentration in the insulating film 224A can be reduced. The hydrogen concentration in the insulating film 224A is preferably reduced because the insulator 224A is in contact with the oxide 230a in a later step.

Next, an oxide film 230A and an oxide film 230B are formed in this order over the insulating film 224A (see FIG. 9A to FIG. 9D). Note that it is preferable to deposit the oxide film 230A and the oxide film 230B successively without exposure to the air. By the formation without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like. It is preferable to form the oxide film 230A and the oxide film 230B by an ALD method, in which case a film with a uniform thickness can be formed even in a groove or an opening portion having a high aspect ratio. Employing a PEALD method is preferable because the oxide film 230A and the oxide film 230B can be formed at a lower temperature than that in the case of employing a thermal ALD method. In this embodiment, the oxide film 230A and the oxide film 230B are deposited by a sputtering method.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1: 3:4 [atomic ratio]. In addition, the oxide film 230B is deposited by a sputtering method using an oxide target with In:Ga:Zn=4:2:4.1 [atomic ratio], an oxide target with In:Ga: Zn=1:1:1 [atomic ratio], or an oxide target with In:Ga:Zn=1: 1:2 [atomic ratio]. Note that each of the oxide films is preferably formed so as to have characteristics required for the oxide 230a and the oxide 230b by selecting the deposition conditions and the atomic ratios as appropriate.

The insulating film 224A, the oxide film 230A, and the oxide film 230B are preferably formed by a sputtering method without exposure to the air. For example, a multi-chamber deposition apparatus is used. As a result, entry of hydrogen into the insulating film 224A, the oxide film 230A, and the oxide film 230B in intervals between deposition steps can be inhibited.

Next, heat treatment is preferably performed. The heat treatment can be performed in a temperature range where the oxide film 230A and the oxide film 230B do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide film 230A, the oxide film 230B, and the like as much as possible.

In this embodiment, the heat treatment is performed at 400° C. for one hour with the flow rate ratio of nitrogen gas to oxygen gas being 4 slm:1 slm. By the heat treatment using the oxygen gas, impurities such as carbon, water and hydrogen in the oxide film 230A and the oxide film 230B can be reduced, for example. Furthermore, the reduction of impurities in the films improves the crystallinity of the oxide film 230B, thereby offering a dense structure with higher density. Thus, crystalline regions in the oxide film 230A and the oxide film 230B are expanded, so that in-plane variations of the crystalline regions in the oxide film 230A and the oxide film 230B can be reduced. Accordingly, an in-plane variation of electrical characteristics of the transistor 200 can be reduced.

Next, a conductive film 242A is deposited over the oxide film 230B (see FIG. 9A to FIG. 9D). The conductive film 242A can be deposited by a sputtering method, a CVD method, an MBE method, a PLD method, an ALD method, or the like. For example, as the conductive film 242A, a tantalum nitride film is formed by a sputtering method. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto the surface of the oxide film 230B, and further can reduce the moisture concentration and the hydrogen concentration in the oxide film 230A and the oxide film 230B. The heat treatment is preferably performed at a temperature higher than or equal to 100° C. and lower than or equal to 400° C. In this embodiment, the heat treatment is performed at 200° C.

Next, an insulating film 271A is formed over the conductive film 242A (see FIG. 9A to FIG. 9D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, as the insulating film 271A, an aluminum oxide film or a silicon nitride film may be deposited by a sputtering method.

Note that the conductive film 242A and the insulating film 271A are preferably deposited by a sputtering method without exposure to the air. For example, a multi-chamber deposition apparatus is used. As a result, the amounts of hydrogen in the conductive film 242A and the insulating film 271A can be reduced, and furthermore, entry of hydrogen into the films in intervals between deposition steps can be inhibited. In the case where a hard mask is provided over the insulating film 271A, a film to be the hard mask is preferably successively formed without exposure to the air.

Next, the insulating film 224A, the oxide film 230A, the oxide film 230B, the conductive film 242A, and the insulating film 271A are processed into island shapes by a lithography method to form the insulator 224, the oxide 230a, the oxide 230b, a conductive layer 242B, and an insulating layer 271B (see FIG. 10A to FIG. 10D). Here, the insulator 224, the oxide 230a, the oxide 230b, the conductive layer 242B, and the insulating layer 271B are formed such that at least parts thereof are overlapped with the conductor 205. A dry etching method or a wet etching method can be used for the processing. A dry etching method is suitable for microfabrication. The insulating film 224A, the oxide film 230A, the oxide film 230B, the conductive film 242A, and the insulating film 271A may be processed under different conditions.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask may be formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by a dry etching process such as ashing, a wet etching process, a wet etching process after a dry etching process, or a dry etching process after a wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask.

Here, since the insulating layer 271B functions as a mask for the conductive layer 242B, as illustrated in FIG. 10B to FIG. 10D, the conductive layer 242B does not have a curved surface between the side surface and the top surface. Thus, end portions at the intersection of the side surface and the top surface of the conductor 242 illustrated in FIG. 6B and FIG. 6D is angular. The cross-sectional area of the conductor 242 in the case where the end portion at the intersection of the side surface and the top surface of the conductor 242 is angular is larger than that in the case where the end portion is rounded. Accordingly, the resistance of the conductor 242 is reduced, so that the on-state current of the transistor 200 can be increased.

Furthermore, as illustrated in FIG. 10B to FIG. 10D, cross sections of the insulator 224, the oxide 230a, the oxide 230b, the conductive layer 242B, and the insulating layer 271B may have tapered shapes. In this specification and the like, a tapered shape indicates a shape in which at least part of a side surface of a structure is inclined to a substrate surface. For example, the angle formed between the inclined side surface and the substrate surface (the angle is also referred to as a taper angle) is preferably less than 90°. Each of the insulator 224, the oxide 230a, the oxide 230b, the conductive layer 242B, and the insulating layer 271B may have a taper angle greater than or equal to 60° and less than 90°. With such tapered shapes on the sections, the coverage with the insulator 275 and the like can be improved in a later step, so that defects such as a void can be reduced.

Not being limited to the above, the insulator 224, the oxide 230a, the oxide 230b, the conductive layer 242B, and the insulating layer 271B may be processed to have side surfaces that are substantially perpendicular to the top surface of the insulator 222. With this structure, a plurality of the transistors 200 can be provided with high density in a small area.

A by-product generated in the above etching step is sometimes formed in a layered manner on the side surfaces of the insulator 224, the oxide 230a, the oxide 230b, the conductive layer 242B, and the insulating layer 271B. In this case, the layered by-product is formed between the insulator 275 and the insulator 224, the oxide 230a, the oxide 230b, the conductive layer 242B, and the insulating layer 271B. Hence, the layered by-product formed in contact with the top surface of the insulator 222 is preferably removed.

Next, the insulator 275 is formed to cover the insulator 224, the oxide 230a, the oxide 230b, the conductive layer 242B, and the insulating layer 271B (see FIG. 11A to FIG. 11D). Here, it is preferable that the insulator 275 be in close contact with the top surface of the insulator 222 and the side surface of the insulator 224. The insulator 275 can be formed by a sputtering method, a CVD method, an MBE method, a PLD method, an ALD method, or the like. The insulator 275 is preferably formed using an insulating film having a function of inhibiting passage of oxygen. For example, as the insulator 275, aluminum oxide may be deposited by a sputtering method, and silicon nitride may be deposited thereover by a PEALD method. When the insulator 275 has such a stacked-layer structure, the function of inhibiting diffusion of impurities such as water or hydrogen and oxygen is improved in some cases.

In this manner, the oxide 230a, the oxide 230b, and the conductive layer 242B can be covered with the insulator 275 and the insulating layer 271B, which have a function of inhibiting diffusion of oxygen. This structure can suppress direct diffusion of oxygen from the insulator 280 or the like into the insulator 224, the oxide 230*a*, the oxide 230*b*, and the conductive layer 242B in a later step.

Next, an insulating film to be the insulator 280 is deposited over the insulator 275. The insulating film can be deposited by a sputtering method, a CVD method, an MBE method, a PLD method, an ALD method, or the like. A silicon oxide film may be deposited by a sputtering method as the insulating film, for example. When the insulating film is deposited by a sputtering method in an oxygen-containing atmosphere, the insulator 280 containing excess oxygen can be formed. Since a molecule containing hydrogen is not used as a deposition gas in the sputtering method, the concentration of hydrogen in the insulator 280 can be reduced. Note that heat treatment may be performed before the insulating film is deposited. The heat treatment may be performed under reduced pressure, and the insulating film may be successively deposited without exposure to the air. The treatment can remove moisture and hydrogen adsorbed onto the surface of the insulator 275 and the like, and further can reduce the moisture concentration and the hydrogen concentration in the oxide 230*a*, the oxide 230*b*, and the insulator 224. For the heat treatment, the above heat treatment conditions can be used.

Next, the insulating film to be the insulator 280 is subjected to CMP treatment, so that the insulator 280 with a flat top surface is formed (see FIG. 11A to FIG. 11D). Note that, for example, silicon nitride may be deposited over the insulator 280 by a sputtering method and CMP treatment may be performed on the silicon nitride until the insulator 280 is reached.

Then, part of the insulator 280, part of the insulator 275, and part of the insulating layer 271B, part of the conductive layer 242B are processed to form an opening reaching the oxide 230*b*. The opening is preferably formed to overlap with the conductor 205. The insulator 271*a*, the insulator 271*b*, the conductor 242*a*, and the conductor 242*b* are formed through the formation of the opening (see FIG. 12A to FIG. 12D).

As illustrated in FIG. 12B and FIG. 12C, the side surfaces of the insulator 280, the insulator 275, the insulator 271, and the conductor 242 may be tapered. The taper angle of the insulator 280 is larger than that of the conductor 242 in some cases. Although not illustrated in FIG. 12A to FIG. 12C, the upper portion of the oxide 230*b* is removed in some cases when the opening is formed.

The part of the insulator 280, the part of the insulator 275, the part of the insulating layer 271B, and the part of the conductive layer 242B can be processed by a dry etching method or a wet etching method. A dry etching method is suitable for microfabrication. The processing may be performed under different conditions. For example, the part of the insulator 280 may be processed by a dry etching method, the part of the insulator 275 and the part of the insulating layer 271B may be processed by a wet etching method, and the part of the conductive layer 242B may be processed by a dry etching method.

Here, in some cases, impurities are attached to the side surface of the oxide 230*a* and the top surface and the side surface of the oxide 230*b*, the side surface of the conductor 242, and the side surface of the insulator 280 and diffused therein. A step of removing the impurities may be performed. In addition, a damaged region might be formed on the surface of the oxide 230*b* by the above dry etching. The damaged region may be removed. The impurities come from components contained in the insulator 280, the insulator 275, the insulating layer 271B, and the conductive layer 242B; components contained in a member of an apparatus used to form the opening; and components contained in a gas or a liquid used for etching, for instance. Examples of the impurities include hafnium, aluminum, silicon, tantalum, fluorine, and chlorine.

In particular, impurities such as aluminum and silicon hinder the oxide 230*b* from becoming a CAAC-OS. It is thus preferable to reduce or remove impurity elements such as aluminum and silicon, which hinder the oxide from becoming a CAAC-OS. For example, the concentration of aluminum atoms in the oxide 230*b* and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an a-like OS is referred to as a non-CAAC region in some cases. In the non-CAAC region, the density of the crystal structure is reduced to increase VoH; thus, the transistor is likely to be normally on. Hence, the non-CAAC region in the oxide 230*b* is preferably reduced or removed.

In contrast, the oxide 230*b* preferably has a layered CAAC structure. In particular, the CAAC structure preferably reaches a lower edge portion of a drain in the oxide 230*b*. Here, in the transistor 200, the conductor 242*a* or the conductor 242*b*, and its vicinity function as a drain. In other words, the oxide 230*b* in the vicinity of the lower edge portion of the conductor 242*a* (conductor 242*b*) preferably has a CAAC structure. In this manner, the damaged region of the oxide 230*b* is removed and the CAAC structure is formed also in the edge portion of the drain, which significantly affects the drain withstand voltage, so that variation in the electrical characteristics of the transistor 200 can be further suppressed. In addition, the reliability of the transistor 200 can be improved.

In order to remove impurities and the like attached to the surface of the oxide 230*b* in the above etching step, cleaning treatment is performed. Examples of the cleaning method include wet cleaning using a cleaning solution (also can be referred to as wet etching process), plasma treatment using plasma, and cleaning by heat treatment, and any of these cleanings may be performed in combination as appropriate. The cleaning treatment sometimes makes the groove portion deeper.

The wet cleaning may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

For the ultrasonic cleaning, a frequency higher than or equal to 200 kHz is preferable, higher than or equal to 900 kHz is further preferable. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted ammonia water is performed. The cleaning treatment can remove impurities that are attached onto the surfaces of the oxide 230a, the oxide 230b, and the like or diffused into the oxide 230a, the oxide 230b, and the like. Furthermore, the crystallinity of the oxide 230b can be increased.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies. In addition, the crystallinity of the oxide 230b can be improved by the heat treatment. The heat treatment may be performed under reduced pressure. Alternatively, heat treatment may be performed in an oxygen atmosphere, and then heat treatment may be successively performed in a nitrogen atmosphere without exposure to the air.

Next, an insulating film 252A is deposited (see FIG. 13A to FIG. 13D). The insulating film 252A can be formed by a sputtering method, a CVD method, an MBE method, a PLD method, an ALD method, or the like. The insulating film 252A is preferably deposited by an ALD method. As described above, it is preferable to form the insulating film 252A with a small thickness, and an unevenness of the thickness needs to be reduced. In contrast, an ALD method is a deposition method in which a precursor and a reactant (e.g., oxidizer) are alternately introduced, and the film thickness can be adjusted with the number of repetition times of the cycle; thus, accurate control of the film thickness is possible. Furthermore, as illustrated in FIG. 13B and FIG. 13C, the insulating film 252A needs to be deposited on the bottom surface and the side surface of the opening formed in the insulator 280 and the like so as to have good coverage. In particular, it is preferable that the insulating film 252A be deposited on the top and side surfaces of the oxide 230 and the side surface of the conductor 242 so as to have good coverage. One atomic layer can be deposited at a time on the bottom surface and the side surface of the opening, whereby the insulating film 252A can be deposited in the opening with good coverage.

When the insulating film 252A is deposited by an ALD method, ozone ($O_3$), oxygen ($O_2$), water ($H_2O$), or the like can be used as the oxidizer. When an oxidizer without containing hydrogen, such as ($O_3$) or ($O_2$), is used, the amount of hydrogen diffusing into the oxide 230b can be reduced.

In this embodiment, an aluminum oxide film is deposited as the insulating film 252A by a thermal ALD method.

Next, an insulating film 250A is deposited (see FIG. 13A to FIG. 13D). Heat treatment may be performed before the deposition of the insulating film 250A; the heat treatment may be performed under reduced pressure, and the insulating film 250A may be successively deposited without exposure to the air. The heat treatment is preferably performed in an oxygen-containing atmosphere. Such treatment can remove moisture and hydrogen adsorbed onto the surface of the insulating film 252A and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be deposited by a sputtering method, a CVD method, a PECVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that faces the oxide 230b with the insulator 252 with a small thickness therebetween, in a later step.

The insulating film 250A is preferably deposited by a deposition method providing good coverage. For example, the deposition is preferably performed using an ALD method. Accordingly, the insulating film 250A can be deposited with good coverage for the opening formed in the insulator 280 and the like with the insulating film 252A therebetween.

As described above, microwave treatment is performed in an oxygen-containing atmosphere after the insulating film 250A is deposited, whereby the film quality of the insulator 250 can be improved. Therefore, the deposition temperature of the insulating film 250A may be low. The deposition temperature is, for example, lower than 400° C., lower than or equal to 300° C., or lower than or equal to 250° C., and higher than or equal to 100° C. Depositing the insulating film 250A at such a temperature can inhibit oxidation of the conductor 242 (particularly, the side surface of the conductor 242) in the vicinity of the insulating film 250A.

In this embodiment, a silicon oxide film is deposited as the insulating film 250A by a PEALD method using an organic precursor. By a PEALD method, the insulating film 250A can be deposited to have a small thickness and good coverage. Although an organic precursor is used as the precursor in this embodiment, an inorganic precursor may be used.

Next, microwave treatment is preferably performed in an oxygen-containing atmosphere (see FIG. 13A to FIG. 13D). Dotted lines in FIG. 13B to FIG. 13D indicate high-frequency waves such as microwaves or RF, oxygen plasma, oxygen radicals, or the like. In the microwave treatment, for example, application of RF to the substrate side allows oxygen ions generated by high-density plasma to be introduced into the oxide 230b efficiently. The treatment temperature for the microwave treatment is higher than or equal to 150° C. and lower than or equal to 400° C., preferably higher than or equal to 200° C. and lower than or equal to 300° C., further preferably approximately 250° C.

The above-described microwave treatment is preferably performed in an oxygen-containing atmosphere. The carrier concentration in the region 230bc can be reduced by performing the microwave treatment in an oxygen-containing atmosphere. In addition, the carrier concentrations in the region 230$ba$ and the region 230$bb$ can be prevented from being excessively reduced by preventing an excess amount of oxygen from being introduced into the chamber in the microwave treatment.

Note that as conditions other than the treatment temperature for the above microwave treatment, the conditions for the microwave treatment described in the above embodiment are preferably used. The treatment temperature may be lower than or equal to 750° C. or lower than or equal to 500° C., for example, approximately 400° C. After the microwave treatment is performed, heat treatment may be successively performed without exposure to the air. For example, the heat treatment may be performed at higher than or equal to 100° C. and lower than or equal to 750° C., preferably higher than or equal to 300° C. and lower than or equal to 500° C.

As illustrated in FIG. 13B to FIG. 13D, the microwave treatment in an atmosphere containing oxygen can convert an oxygen gas into plasma using a high-frequency wave such as a microwave or RF, and apply the oxygen plasma to a region of the oxide 230$b$ that is between the conductor 242$a$ and the conductor 242$b$. At this time, the region 230$bc$ can be irradiated with the high-frequency wave such as a microwave or RF. In other words, the high-frequency oxygen plasma such as a microwave or RF, or the like can be applied to the region 230$bc$ in FIG. 7A. The effect of the plasma, the microwave, or the like enables VoH in the region 230$bc$ to be cut, and hydrogen (H) to be removed from the region 230$bc$. That is, the reaction "$V_OH \rightarrow H + V_O$" occurs in the region 230$bc$, so that the concentration of VoH in the region 230$bc$ can be reduced. As a result, oxygen vacancies and VoH in the region 230$bc$ can be reduced to lower the carrier concentration. In addition, oxygen radicals generated by the oxygen plasma or oxygen contained in the insulator 250 can be supplied to oxygen vacancies formed in the region 230$bc$, thereby further reducing oxygen vacancies and lowering the carrier concentration in the region 230$bc$.

By contrast, the conductor 242$a$ and the conductor 242$b$ are provided over the region 230$ba$ and the region 230$bb$ illustrated in FIG. 7A. The conductor 242 preferably functions as a blocking film preventing the effect caused by the microwave, the high-frequency waves such as RF, the oxygen plasma, or the like in the microwave treatment in an atmosphere containing oxygen. Therefore, the conductor 242 preferably has a function of blocking an electromagnetic wave greater than or equal to 300 MHz and less than or equal to 300 GHz, for example, greater than or equal to 2.4 GHz and less than or equal to 2.5 GHz.

As illustrated in FIG. 13B to FIG. 13D, the effect of the high-frequency wave such as a microwave or RF, the oxygen plasma, or the like is blocked by the conductor 242$a$ and the conductor 242$b$, and thus does not reach the region 230$ba$ and the region 230$bb$. Hence, a reduction in VoH and supply of an excess amount of oxygen due to the microwave treatment do not occur in the region 230$ba$ and the region 230$bb$, preventing a decrease in carrier concentration.

Furthermore, the insulator 252 having a barrier property against oxygen is provided in contact with the side surfaces of the conductor 242$a$ and the conductor 242$b$. Thus, formation of oxide films on the side surfaces of the conductor 242$a$ and the conductor 242$b$ by the microwave treatment can be inhibited.

Furthermore, the insulating film 250A is deposited at a temperature that can inhibit oxidation of the conductor 242, and then microwave treatment is performed in an oxygen-containing atmosphere, whereby the insulator 250 with reduced hydrogen concentration can be formed while oxidation of the side surface of the conductor 242 is inhibited. Therefore, the reliability of the transistor 200 can be improved.

In the above manner, oxygen vacancies and VoH can be selectively removed from the region 230$bc$ in the oxide semiconductor, whereby the region 230$bc$ can be an i-type or substantially i-type region. Furthermore, supply of an excess amount of oxygen to the region 230$ba$ and the region 230$bb$ functioning as the source region and the drain region can be inhibited and the n-type conductivity can be maintained. As a result, a change in the electrical characteristics of the transistor 200 can be inhibited, and thus a variation in the electrical characteristics of the transistors 200 in the substrate plane can be inhibited In the microwave treatment, thermal energy is directly transmitted to the oxide 230$b$ in some cases owing to an electromagnetic interaction between the microwave and a molecule in the oxide 230$b$. The oxide 230$b$ might be heated by this thermal energy. Such heat treatment is sometimes referred to as microwave annealing. When microwave treatment is performed in an atmosphere containing oxygen, an effect equivalent to that of oxygen annealing is sometimes obtained. In the case where hydrogen is contained in the oxide 230$b$, it is probable that the thermal energy is transmitted to the hydrogen in the oxide 230$b$ and the hydrogen activated by the energy is released from the oxide 230$b$.

In this embodiment, after deposition of the insulating film 250A, microwave treatment is performed at a treatment temperature of 250° C. and an oxygen flow rate ratio ($O_2/(O_2+Ar)$) of 25% for a processing time of 10 minutes.

Note that the microwave treatment may be performed after the insulating film 252A is deposited. For the microwave treatment performed after the deposition of the insulating film 252A, the above-described treatment conditions for the microwave treatment are preferably used.

In the case where the insulator 250 has a two-layer structure as illustrated in FIG. 7B, an insulating film to be the insulator 250$b$ may be formed after the deposition of the insulating film 250A. The insulating film can be deposited by a sputtering method, a CVD method, an MBE method, a PLD method, an ALD method, or the like. The insulating film is preferably formed using an insulator having a function of inhibiting diffusion of oxygen. With such a structure, oxygen contained in the insulator 250$a$ can be inhibited from diffusing into the conductor 260. That is, a reduction in the amount of oxygen supplied to the oxide 230 can be inhibited. In addition, oxidation of the conductor 260 due to oxygen contained in the insulator 250$a$ can be inhibited. For example, the insulating film can be provided using a material similar to that for the insulator 222. For example, a hafnium oxide film may be formed by a thermal ALD method as the insulating film.

In the case where the insulating film to be the insulator 250$b$ is provided as described above, microwave treatment may be performed after the deposition of the insulating film. In the microwave treatment, the conditions for the aforementioned microwave treatment performed after the deposition of the insulating film 252A or the conditions for the aforementioned microwave treatment performed after the deposition of the insulating film 250A may be used. Alternatively, microwave treatment may be performed after the deposition of the insulating film, instead of performing microwave treatment after the deposition of the insulating film 252A and/or the insulating film 250A.

Heat treatment may be performed while the reduced pressure is maintained after each of microwave treatment after the deposition of the insulating film 252A, microwave treatment after the deposition of the insulating film 250A, and microwave treatment after the deposition of the insulating film to be the insulator 250b. Such treatment enables hydrogen in the insulating film 252A, the insulating film 250A, the insulating film to be the insulator 250b, the oxide 230b, and the oxide 230a to be removed efficiently. In other cases, part of hydrogen is gettered by the conductor 242. Alternatively, the step of performing microwave treatment and then performing heat treatment with the reduced pressure being maintained may be repeated a plurality of cycles. The repetition of the heat treatment enables hydrogen in the insulating film 252A, the insulating film 250A, the insulating film to be the insulator 250b, the oxide 230b, and the oxide 230a to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230b and the like are adequately heated by the microwave annealing.

Furthermore, the microwave treatment improves the film quality of the insulating film 252A, the insulating film 250A and the insulating film to be the insulator 250b, thereby inhibiting diffusion of hydrogen, water, impurities, and the like. Accordingly, hydrogen, water, impurities, and the like can be inhibited from diffusing into the oxide 230b, the oxide 230a, and the like through the insulator 252 in a later step such as deposition of a conductive film to be the conductor 260 or later treatment such as heat treatment.

Next, an insulating film 254A is deposited (see FIG. 14A to FIG. 14D). The insulating film 254A can be deposited by a sputtering method, a CVD method, an MBE method, a PLD method, an ALD method, or the like. Like the insulating film 252A, the insulating film 254A is preferably deposited by an ALD method. By an ALD method, the insulating film 254A can be formed to have small thickness and good coverage. In this embodiment, as the insulating film 254A, a silicon nitride film is deposited by a PEALD method.

Next, microwave treatment may be performed in an oxygen-containing atmosphere. Note that in the microwave treatment performed after the deposition of the insulating film 254A, the conditions for the above-described microwave treatment are preferably used.

Next, a conductive film to be the conductor 260a and a conductive film to be the conductor 260b are deposited in this order. The conductive film to be the conductor 260a and the conductive film to be the conductor 260b can be deposited by a sputtering method, a CVD method, an MBE method, a PLD method, an ALD method, or the like. In this embodiment, a titanium nitride film is deposited as the conductive film to be the conductor 260a by an ALD method, and a tungsten film is deposited as the conductive film to be the conductor 260b by a CVD method.

Then, the insulating film 252A, the insulating film 250A, the insulating film 254A, the conductive film to be the conductor 260a, and the conductive film to be the conductor 260b are polished by CMP treatment until the insulator 280 is exposed, whereby the insulator 252, the insulator 250, the insulator 254, and the conductor 260 (the conductor 260a and the conductor 260b) are formed (see FIG. 15A to FIG. 15D). Accordingly, the insulator 252 is placed to cover the opening reaching the oxide 230b. The conductor 260 is placed to fill the opening with the insulator 252 and the insulator 250 therebetween.

Then, heat treatment may be performed under conditions similar to those for the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be deposited successively without exposure to the air.

Next, the insulator 282 is formed over the insulator 252, the insulator 250, the insulator 254, the conductor 260, and the insulator 280 (see FIG. 15A to FIG. 15D). The insulator 282 can be deposited by a sputtering method, a CVD method, an MBE method, a PLD method, an ALD method, or the like. The insulator 282 is preferably deposited by a sputtering method. Since a molecule containing hydrogen is not needed to be used as a deposition gas in the sputtering method, the hydrogen concentration in the insulator 282 can be reduced.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

The insulator 282 is deposited by a sputtering method in an oxygen-containing atmosphere, whereby oxygen can be added to the insulator 280 during the deposition. Thus, excess oxygen can be contained in the insulator 280. At this time, the insulator 282 is preferably deposited while the substrate is being heated.

Next, an etching mask is formed over the insulator 282 by a lithography method and parts of the insulator 282, the insulator 280, the insulator 275, the insulator 222, and the insulator 216 are processed until the top surface of the insulator 214 is exposed (see FIG. 16A to FIG. 16D). Wet etching can be used for the processing; however, dry etching is preferably used for microfabrication.

Next, heat treatment may be performed. The heat treatment is performed at higher than or equal to 250° C. and lower than or equal to 650° C., preferably higher than or equal to 350° C. and lower than or equal to 600° C. The heat treatment is preferably performed at a temperature lower than that of the heat treatment performed after the deposition of the oxide film 230B. Note that the heat treatment is performed in an atmosphere of a nitrogen gas or an inert gas. By the heat treatment, part of oxygen added to the insulator 280 is diffused into the oxide 230 through the insulator 250 and the like.

By the heat treatment, oxygen contained in the insulator 280 and hydrogen bonded to the oxygen can be released to the outside from the side surface of the insulator 280 formed by the processing of the insulator 282, the insulator 280, the insulator 275, the insulator 222, and the insulator 216. Note that the hydrogen bonded to oxygen is released as water. Thus, unnecessary oxygen and hydrogen contained in the insulator 280 can be reduced.

In a region of the oxide 230 that overlaps with the conductor 260, the insulator 252 is provided to be in contact with top and side surfaces of the oxide 230. Since the insulator 252 has a barrier property against oxygen, diffusion of an excess amount of oxygen to the oxide 230 can be inhibited. Thus, oxygen can be supplied to the region 230bc or in the vicinity of the region 230bc, without supply of an excess amount of oxygen. Accordingly, oxygen vacancies and VoH formed in the region 230bc can be reduced while oxidation of the side surface of the conductor 242 due to excess oxygen can be prevented. Thus, the transistor 200 can have favorable electrical characteristics and higher reliability.

On the other hand, in the case where the transistors 200 are integrated at a high density, the volume of the insulator 280 becomes excessively small with respect to one transistor 200 in some cases. In this case, the amount of oxygen diffused into the oxide 230 becomes significantly small in the heat treatment. When the oxide 230 is heated while being in contact with the oxide insulator (e.g., the insulator 250) which does not contain sufficient oxygen, oxygen contained in the oxide 230 might be released. However, in the transistor 200 described in this embodiment, the insulator 252 is provided in contact with the top surface and side surfaces of the oxide 230 in the region of the oxide 230 that overlaps with the conductor 260. Since the insulator 252 has a barrier property against oxygen, release of the oxygen from the oxide 230 can be reduced also in the heat treatment. Thus, the amount of oxygen vacancies and VoH formed in the region 230bc can be reduced. Thus, the transistor 200 can have favorable electrical characteristics and higher reliability.

As described above, in either case of a large or small amount of oxygen supplied from the insulator 280 in the semiconductor device of this embodiment, the transistor can have good electric characteristics and high reliability. Thus, a semiconductor device with a reduced variation in the electrical characteristics of the transistors 200 in the substrate plane can be provided.

Next, the insulator 283 is formed over the insulator 282 (see FIG. 17A to FIG. 17D). The insulator 283 can be deposited by a sputtering method, a CVD method, an MBE method, a PLD method, an ALD method, or the like. The insulator 283 is preferably deposited by a sputtering method. By using a sputtering method that does not need to use a molecule containing hydrogen as a deposition gas, the hydrogen concentration in the insulator 283 can be reduced. The insulator 283 may be a multilayer. For example, silicon nitride may be deposited by a sputtering method and silicon nitride may be deposited over the silicon nitride by an ALD method. Surrounding the transistor 200 by the insulator 283 and the insulator 214 that have a high barrier property can prevent entry of moisture and hydrogen from the outside.

Next, the insulator 274 is formed over the insulator 283. The insulator 274 can be deposited by a sputtering method, a CVD method, an MBE method, a PLD method, an ALD method, or the like. In this embodiment, for the insulator 274, silicon oxide is deposited by a CVD method.

Next, the insulator 274 is polished by CMP treatment until the insulator 283 is exposed, whereby a top surface of the insulator 274 is planarized (see FIG. 17A to FIG. 17D). The top surface of the insulator 283 is partly removed by the CMP treatment in some cases.

Next, the insulator 285 is formed over the insulator 274 and the insulator 283 (see FIG. 18A to FIG. 18D). The insulator 285 can be formed by a sputtering method, a CVD method, an MBE method, a PLD method, an ALD method, or the like. The insulator 285 is preferably deposited by a sputtering method. By using a sputtering method that does not need to use a molecule containing hydrogen as a deposition gas, the hydrogen concentration in the insulator 285 can be reduced.

In this embodiment, for the insulator 285, silicon oxide is deposited by a sputtering method.

Subsequently, openings reaching the conductor 242 are formed in the insulator 271, the insulator 275, the insulator 280, the insulator 282, the insulator 283, and the insulator 285 (see FIG. 18A and FIG. 18B). The openings can be formed by a lithography method. Note that the openings in the top view in FIG. 18A have a circular shape; however, the shapes of the openings are not limited thereto. For example, the openings in the top view may have an almost circular shape such as an elliptical shape, a polygonal shape such as a quadrangular shape, or a polygonal shape such as a quadrangular shape with rounded corners.

Subsequently, an insulating film to be the insulator 241a and the insulator 241b is deposited and subjected to anisotropic etching, so that the insulator 241 is formed (see FIG. 18B). The insulating film can be deposited by a sputtering method, a CVD method, an MBE method, a PLD method, an ALD method, or the like. As the insulating film, an insulating film having a function of inhibiting passage of oxygen is preferably used. For example, it is preferable that an aluminum oxide film be formed by an ALD method and a silicon nitride film be formed thereover by a PEALD method. Silicon nitride is preferable because it has a high blocking property against hydrogen.

As an anisotropic etching for the insulating film to be the insulator 241a and the insulator 241b, a dry etching method may be performed, for example. When the insulator 241 is provided on the sidewall portions of the openings, passage of oxygen from the outside can be inhibited and oxidation of the conductor 240 to be formed next can be prevented. Furthermore, impurities such as water and hydrogen contained in the insulator 280 can be prevented from diffusing into the conductor 240.

Next, a conductive film to be the conductor 240a and the conductor 240b is deposited. The conductive film desirably has a stacked-layer structure which includes a conductor having a function of inhibiting passage of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Then, part of the conductive film to be the conductor 240a and the conductor 240b is removed by CMP treatment to expose the top surface of the insulator 285. As a result, the conductive film remains only in the openings, so that the conductor 240a and the conductor 240b having flat top surfaces can be formed (see FIG. 18A to FIG. 18D). Note that part of the top surface of the insulator 285 is sometimes removed by the CMP treatment.

Next, a conductive film to be the conductor 246 is deposited. The conductive film can be deposited by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b. At this time, part of the insulator 285 in a region where the insulator 285 does not overlap with the conductor 246a or the conductor 246b is sometimes removed.

Through the above process, the semiconductor device including the transistor 200 shown in FIG. 6A to FIG. 6D can be manufactured. As illustrated in FIG. 9A to FIG. 18D, the transistor 200 can be manufactured in accordance with the method for manufacturing the semiconductor device described in this embodiment.

<Modification Examples of Semiconductor Device>

Examples of the semiconductor device of one embodiment of the present invention are described below with reference to FIG. 19A to FIG. 21D.

A of each figure is a top view of the semiconductor device. Moreover, B of each figure is a cross-sectional view corresponding to a portion indicated by dashed-dotted line A1-A2 in A of each figure. Furthermore, C of each figure is a cross-sectional view corresponding to a portion indicated by dashed-dotted line A3-A4 in A of each figure. Furthermore, D of each figure is a cross-sectional view corresponding to a portion indicated by dashed-dotted line A5-A6 in A of each figure. Note that for clarity of the drawing, some components are omitted in the top view of A of each figure.

Note that in the semiconductor device illustrated in A to D of each figure, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

Modification Example 1 of Semiconductor Device

The semiconductor device illustrated in FIG. 19A to FIG. 19D is a modification example of the semiconductor device illustrated in FIG. 6A to FIG. 6D. The semiconductor device illustrated in FIG. 19A to FIG. 19D is different from the semiconductor device illustrated in FIG. 6A to FIG. 6D in that the insulator 282 is not provided. Thus, in the semiconductor device illustrated in FIG. 19A to FIG. 19D, the insulator 283 is in contact with the top surface of the conductor 260, the top surface of the insulator 280, the uppermost portion of the insulator 254, the uppermost portion of the insulator 250, and the uppermost portion of the insulator 252.

For example, in the case where oxygen can be supplied sufficiently to the oxide 230 by the microwave treatment or the like as illustrated in FIG. 13A to FIG. 13D, the region 230bc can be substantially i-type without the insulator 282 for adding oxygen to the insulator 280. In such a case, the structure without the insulator 282 as illustrated in FIG. 19A to FIG. 19D enables the simplification of the manufacturing process and productivity of the semiconductor device.

Modification Example 2 of Semiconductor Device

A semiconductor device illustrated in FIG. 20A to FIG. 20D is a modification example of the semiconductor device illustrated in FIG. 6A to FIG. 6D. The semiconductor device illustrated in FIG. 20A to FIG. 20D is different from the semiconductor device illustrated in FIG. 6A to FIG. 6D in that an oxide 243a and an oxide 243b are provided. The oxide 243a is provided between the oxide 230b and the conductor 242a, and the oxide 243b is provided between the oxide 230b and the conductor 242b. The oxide 243a is preferably in contact with the top surface of the oxide 230b and the bottom surface of the conductor 242a. The oxide 243b is preferably in contact with the top surface of the oxide 230b and the bottom surface of the conductor 242b.

The oxide 243a and the oxide 243b preferably have a function of inhibiting the passage of oxygen. The oxide 243a (the oxide 243b) having a function of inhibiting the passage of oxygen is preferably provided between the oxide 230b and the conductor 242a (the conductor 242b) functioning as the source electrode or the drain electrode, in which case the electric resistance between the conductor 242a (the conductor 242b) and the oxide 230b can be reduced. Such a structure can improve the electrical characteristics, the field-effect mobility, and the reliability of the transistor 200 in some cases.

A metal oxide containing the element M may be used as the oxide 243a and the oxide 243b. In particular, aluminum, gallium, yttrium, or tin is preferably used as the element M. The concentration of the element M in the oxide 243a and the oxide 243b is preferably higher than that in the oxide 230b. Gallium oxide may be used as the oxide 243a and the oxide 243b. A metal oxide such as an In-M-Zn oxide may be used as the oxide 243a and the oxide 243b. Specifically, the atomic ratio of the element M to In in the metal oxide used as the oxide 243a and the oxide 243b is preferably greater than the atomic ratio of the element M to In in the metal oxide used as the oxide 230b. The thicknesses of the oxide 243a and the oxide 243b are preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243a and the oxide 243b preferably have crystallinity. With the oxide 243a and the oxide 243b having crystallinity, release of oxygen in the oxide 230 can be suitably inhibited. When the oxide 243a and the oxide 243b have a hexagonal crystal structure, for example, release of oxygen in the oxide 230 can sometimes be inhibited.

Modification Example 3 of Semiconductor Device

A semiconductor device illustrated in FIG. 21A to FIG. 21D is a modification example of the semiconductor device illustrated in FIG. 6A to FIG. 6D. The semiconductor device illustrated in FIG. 21A to FIG. 21D is different from the semiconductor device illustrated in FIG. 6A to FIG. 6D in that the insulator 283 is in contact with part of a top surface of the insulator 212. Accordingly, the transistor 200 is placed in a region sealed with the insulator 283 and the insulator 212. With the above structure, entry of hydrogen contained in a region outside the sealed region into the sealed region can be inhibited. Although FIG. 21A to FIG. 21D illustrate the transistor 200 having a structure in which the insulator 212 and the insulator 283 are each provided to have a single-layer structure, the present invention is not limited thereto. For example, the insulator 212 and the insulator 283 may each be provided to have a stacked-layer structure of two or more layers.

<Application Example of Semiconductor Device>

An example of the semiconductor device that is one embodiment of the present invention is described below with reference to FIG. 22.

Figure 22A:
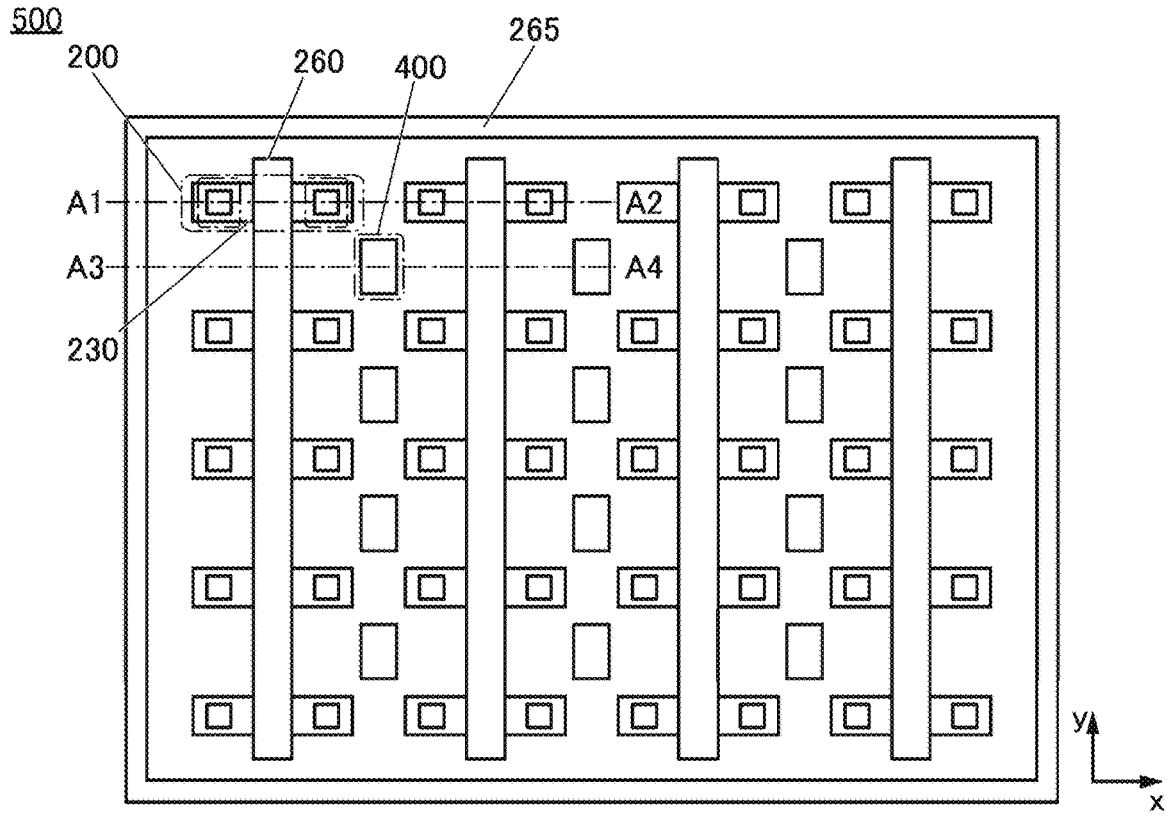
FIG. 22A is a plan view of a semiconductor device of one embodiment of the present invention.
Figure 22B:
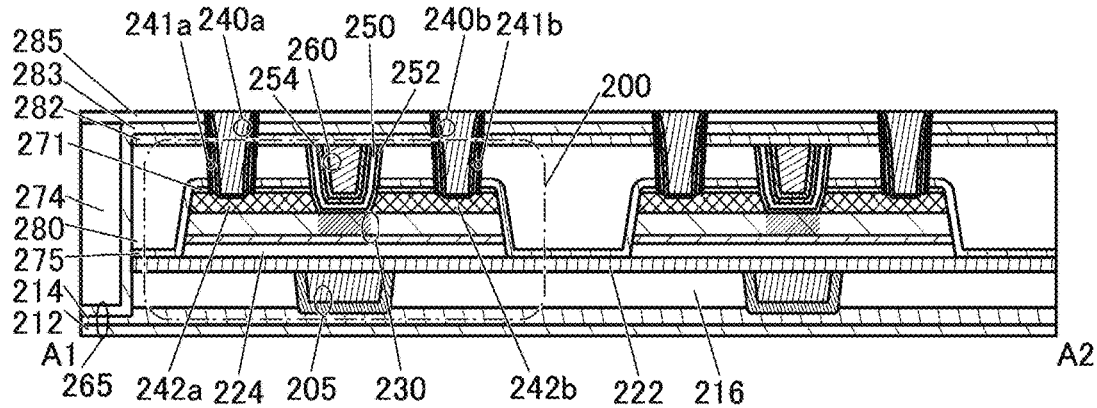
FIG. 22B and FIG. 22C are cross-sectional views of the semiconductor device of one embodiment of the present invention.
Figure 22C:
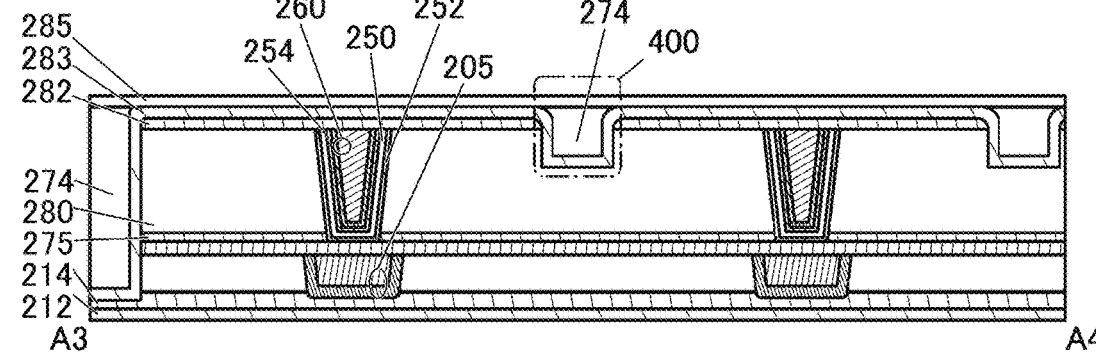

FIG. 22A is a top view of a semiconductor device 500. In FIG. 22A, the x-axis is parallel to the channel length direction of the transistor 200, and the y-axis is perpendicular to the x-axis. FIG. 22B is a cross-sectional view corresponding to a portion indicated by dashed-dotted line A1-A2 in FIG. 22A, and is also a cross-sectional view of the transistor 200 in the channel length direction. FIG. 22C is a cross-sectional view corresponding to a portion indicated by the dashed-dotted line A3-A4 in FIG. 22A, and is also a cross-sectional view of an opening region 400 and its vicinity. Note that for clarity of the drawing, some components are omitted in the top view in FIG. 22A.

Note that in the semiconductor device illustrated in FIG. 22A to FIG. 22C, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

The semiconductor device 500 illustrated in FIG. 22A to FIG. 22C is a modification example of the semiconductor device illustrated in FIG. 6A to FIG. 6D. The semiconductor device 500 illustrated in FIG. 22A to FIG. 22C is different from the semiconductor device illustrated in FIG. 6A to FIG. 6D in that an opening region 400 is formed in the insulator 282 and the insulator 280. Moreover, a sealing portion 265 is formed to surround a plurality of transistors 200, which is a different point from the semiconductor device illustrated in FIG. 6A to FIG. 6D.

The semiconductor device 500 includes a plurality of transistors 200 and a plurality of opening regions 400 arranged in a matrix. In addition, a plurality of conductors 260 functioning as gate electrodes of the transistors 200 are provided to extend in the y-axis direction. The opening regions 400 are provided in regions not overlapping with the oxide 230 or the conductor 260. The sealing portion 265 is formed so as to surround the plurality of transistors 200, the plurality of conductors 260, and the plurality of opening regions 400. Note that the numbers, the positions, and the sizes of the transistors 200, the conductors 260, and the opening regions 400 are not limited to those illustrated in FIG. 22A and may be set as appropriate in accordance with the design of the semiconductor device 500.

As illustrated in FIG. 22B and FIG. 22C, the sealing portion 265 is provided to surround the plurality of transistors 200, the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with a top surface of the insulator 214. In the sealing portion 265, an insulator 274 is provided between the insulator 283 and the insulator 285. The top surface of the insulator 274 is substantially level with the uppermost surface of the insulator 283. As the insulator 274, an insulator similar to the insulator 280 can be used.

With such a structure, the plurality of transistors 200 can be surrounded by the insulator 283, the insulator 214, and the insulator 212. One or more of the insulator 283, the insulator 214, and the insulator 212 preferably function as a barrier insulating film against hydrogen. Accordingly, entry of hydrogen contained in the region outside the sealing portion 265 into a region in the sealing portion 265 can be inhibited.

As illustrated in FIG. 22C, the insulator 282 has an opening portion in the opening region 400. In the opening region 400, the insulator 280 may have a groove to overlap with the opening portion in the insulator 282. The depth of the groove portion of the insulator 280 is less than or equal to the depth at which a top surface of the insulator 275 is exposed and is, for example, approximately greater than or equal to ¼ and less than or equal to ½ of the maximum thickness of the insulator 280.

As illustrated in FIG. 22C, the insulator 283 is in contact with a side surface of the insulator 282, the side surface of the insulator 280, and the top surface of the insulator 280 inside the opening region 400. Part of the insulator 274 is formed in the opening region 400 to fill the depression portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor layer from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be prevented from entering the oxide 230.

In FIG. 22A, the shape of the opening region 400 in the top view is substantially rectangular; however, the present invention is not limited thereto. For example, the shape of the opening region 400 in the top view can be a rectangular shape, an elliptical shape, a circular shape, a rhombus shape, or a shape obtained by combining any of the above shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

According to one embodiment of the present invention, a semiconductor device with a small variation in transistor characteristics and a manufacturing method thereof can be provided. According to one embodiment of the present invention, a semiconductor device with favorable electrical characteristics and a manufacturing method thereof can be provided. According to one embodiment of the present invention, a highly reliable semiconductor device and a manufacturing method thereof can be provided. According to one embodiment of the present invention, a semiconductor device with a high on-state current and a manufacturing method thereof can be provided. According to one embodiment of the present invention, a semiconductor device with high field-effect mobility and a manufacturing method thereof can be provided. According to one embodiment of the present invention, a semiconductor device with favorable frequency characteristics and a manufacturing method thereof can be provided. According to one embodiment of the present invention, a semiconductor device that can be miniaturized or highly integrated and a manufacturing method thereof can be provided. According to one embodiment of the present invention, a semiconductor device with low power consumption and a manufacturing method thereof can be provided.

At least part of the structure, method, and the like described in this embodiment can be implemented in appropriate combination with any of those in the other embodiments and the other examples described in this specification.

Embodiment 3

In this embodiment, one embodiment of a semiconductor device is described with reference to FIG. 23 to FIG. 27.

[Storage Device 1]

Figure 23:
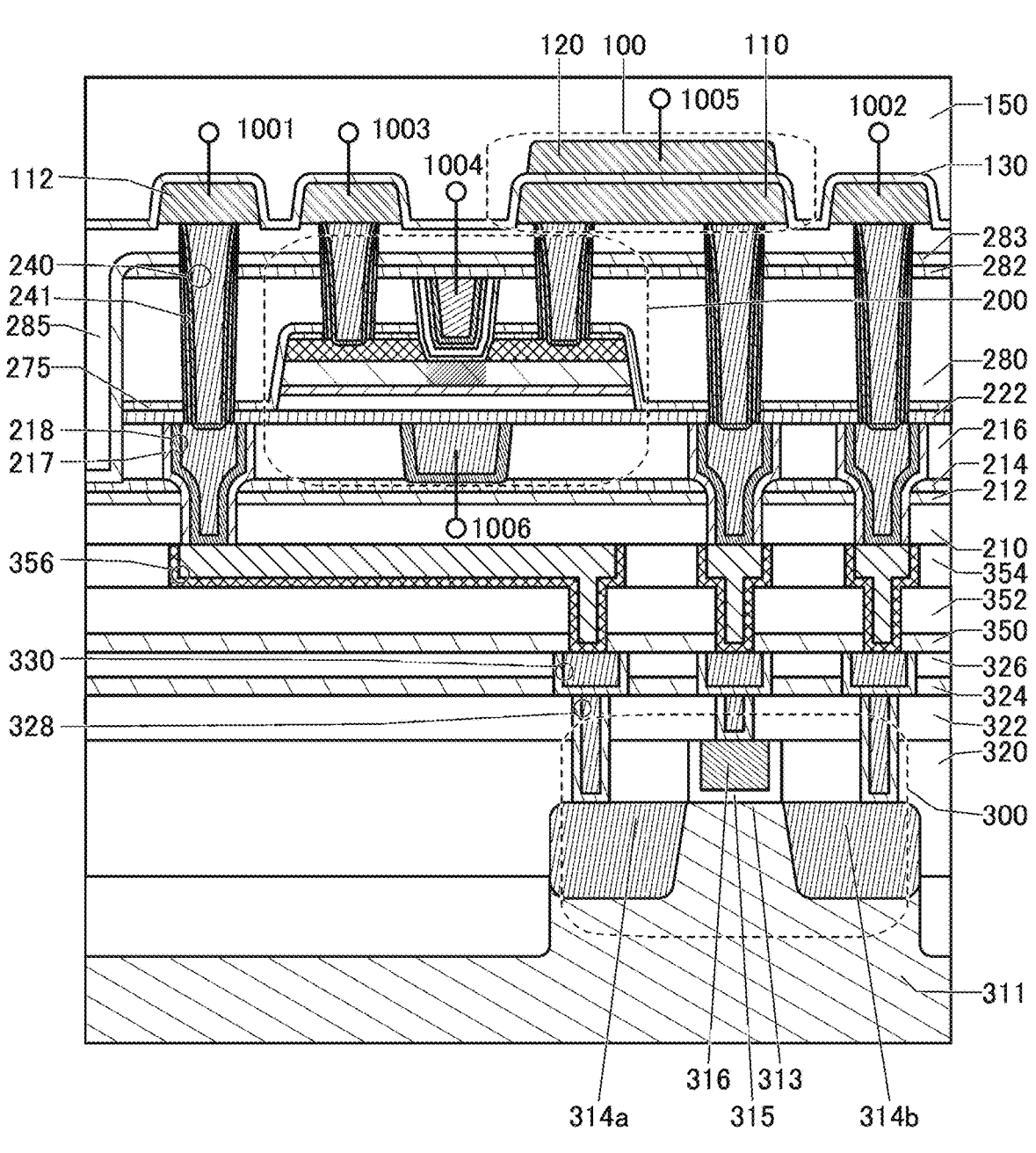
FIG. 23 is a cross-sectional view illustrating a structure of a storage device of one embodiment of the present invention.

FIG. 23 illustrates an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. Since the transistor 200 has a low off-state current, a storage device that uses the transistor 200 can retain stored data for a long time. In other words, such a storage device does not require refresh operation or has extremely low frequency of the refresh operation, which leads to a sufficient reduction in power consumption of the storage device.

In the semiconductor device illustrated in FIG. 23, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage devices illustrated in FIG. 23 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 23, the semiconductor region 313 (part of the substrate 311) in which the channel is formed has a protruding shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 23 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

Here, for the insulator 130, the insulator that can be used as the insulator 283 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are shown in FIG. 23, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided as stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, for the insulator 130, a stacked-layer structure of a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 23, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with a side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, parasitic capacitance generated between wirings can be reduced. Thus, a material is preferably selected depending on the function of an insulator.

For example, as the insulator 150, the insulator 210, the insulator 352, the insulator 354, and the like, an insulator having a low relative permittivity is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 23, the insulator 241 is preferably provided between the conductor 240 and the insulator 224 and the insulator 280 that contain excess oxygen. Since the insulator 241 is provided in contact with the insulator 222, the insulator 282, and the insulator 283, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

The insulator 241 is preferably formed using an insulating material having a function of inhibiting diffusion of oxygen and impurities such as water and hydrogen. For example, silicon nitride, silicon nitride oxide, aluminum oxide, hafnium oxide, or the like is preferably used. In particular, silicon nitride is preferable because of its high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 23, a region in which the insulator 283 and the insulator 214 are in contact with each other is preferably designed to overlap the dicing line. That is, an opening is provided in the insulator 282, the insulator 280, the insulator 275, the insulator 224, the insulator 222, and the insulator 216 in the vicinity of a region to be the dicing line that is provided on an outer edge of the memory cell including the plurality of transistors 200.

That is, in the opening provided in the insulator 282, the insulator 280, the insulator 275, the insulator 224, the insulator 222, and the insulator 216, the insulator 214 is in contact with the insulator 283.

Alternatively, for example, an opening may be provided in the insulator 282, the insulator 280, the insulator 275, the insulator 224, the insulator 222, the insulator 216, and the insulator 214. With such a structure, in the opening provided in the insulator 282, the insulator 280, the insulator 275, the insulator 224, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 24:
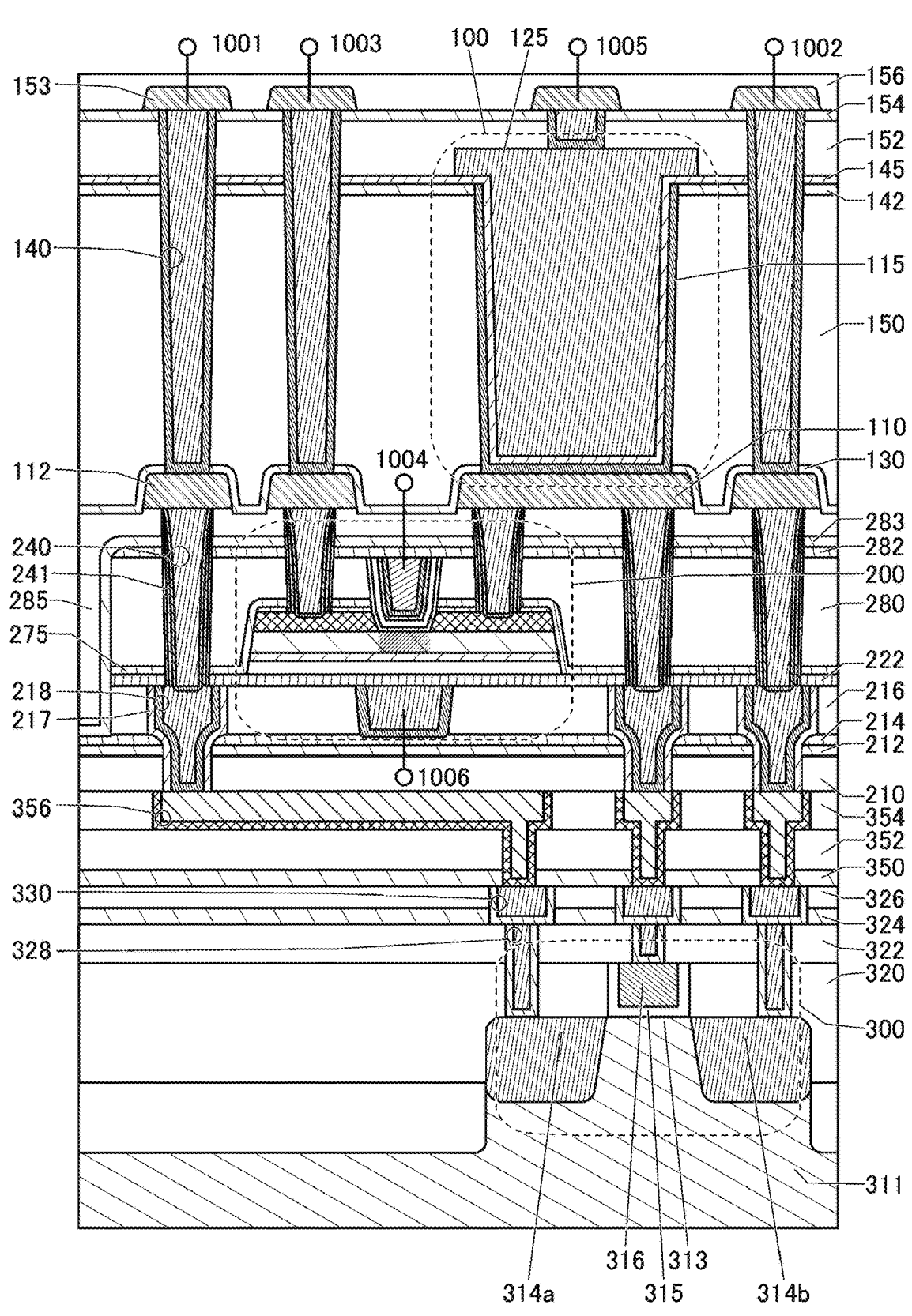
FIG. 24 is a cross-sectional view illustrating a structure of a storage device of one embodiment of the present invention.

Note that although the capacitor 100 of the memory device illustrated in FIG. 23 has a planar shape, the capacitor 100 of the memory device described in this embodiment is not limited thereto. For example, the capacitor 100 may be a cylindrical capacitor as illustrated in FIG. 24. Note that the structure below and including the insulator 150 of a memory device illustrated in FIG. 24 is similar to that of the semiconductor device illustrated in FIG. 23.

The capacitor 100 illustrated in FIG. 24 includes the insulator 150 over the insulator 130, an insulator 142 over the insulator 150, a conductor 115 positioned in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are placed in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric sandwiched therebetween on a side surface as well as a bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. Such a structure can reduce the area occupied by the semiconductor device including the capacitor 100 and the transistor 200.

The conductor 115 is placed in contact with the opening formed in the insulator 142 and the insulator 150. A top surface of the conductor 115 is preferably substantially level with a top surface of the insulator 142. Furthermore, a bottom surface of the conductor 115 is in contact with the conductor 110 through an opening in the insulator 130. The conductor 115 is preferably deposited by an ALD method, a CVD method, or the like; for example, a conductor that can be used for the conductor 205 is used.

The insulator 145 is placed to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure of a material with high dielectric strength and a high permittivity (high-k) material may be used.

Examples of an insulator that is the high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, generation of a leakage current between the conductor 115 and the conductor 125 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by a PEALD method, silicon oxide ($SiO_x$) deposited by a PEALD method, and silicon nitride ($SiN_x$) deposited by a PEALD method are stacked in this order. Alternatively, an insulating film in which zirconium oxide, silicon oxide deposited by an ALD method, and zirconium oxide are stacked in this order can be used. The use of such an insulator with high dielectric strength can increase the dielectric strength and inhibit electrostatic breakdown of the capacitor 100.

The conductor 125 is placed to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like and may be formed using a conductor that can be used as the conductor 205, for example.

The conductor 153 is provided over an insulator 154 and is covered with an insulator 156. The conductor 153 can be formed using a conductor that can be used as the conductor 112, and the insulator 156 can be formed using an insulator that can be used as the insulator 152. Here, the conductor 153 is in contact with a top surface of the conductor 140 and functions as a terminal of the capacitor 100, the transistor 200, or the transistor 300.

[Storage Device 2]

Figure 25:
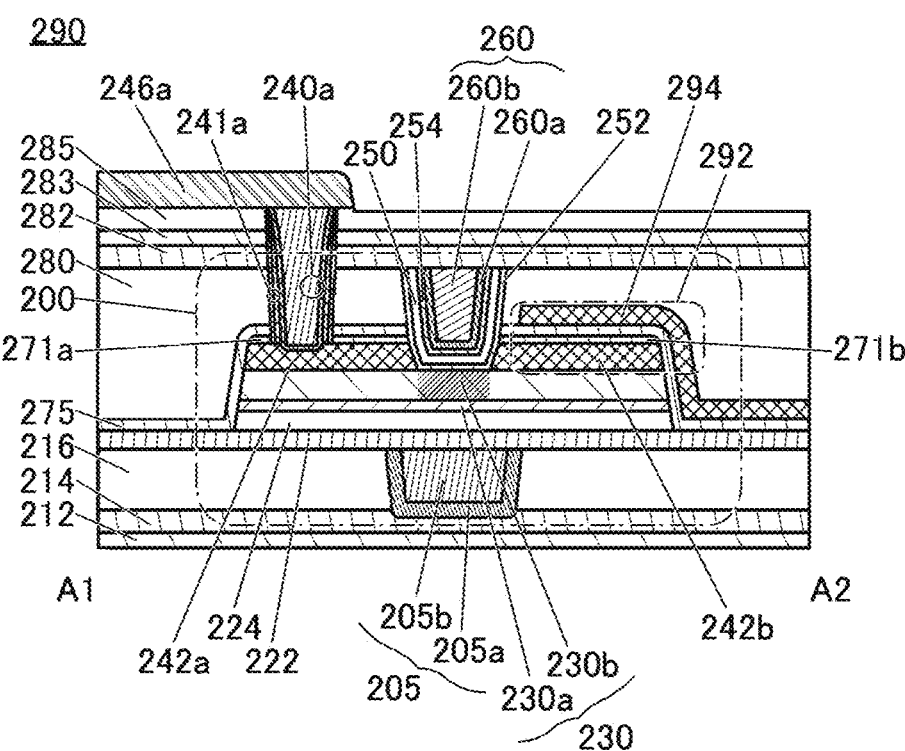
FIG. 25 is a cross-sectional view of a semiconductor device of one embodiment of the present invention.

FIG. 25 illustrates an example of a semiconductor device (a storage device) of one embodiment of the present invention.

<Structure Example of Memory Device>

FIG. 25 is a cross-sectional view of a semiconductor device including a memory device 290. The memory device 290 illustrated in FIG. 25 includes a capacitor device 292 besides the transistor 200 illustrated in FIG. 6A to FIG. 6D. FIG. 25 corresponds to a cross-sectional view in the channel length direction of the transistor 200.

The capacitor device 292 includes the conductor 242b; the insulator 271b provided over the conductor 242b; the insulator 275 provided in contact with a top surface of the insulator 271b, a side surface of the insulator 271b, and a side surface of the conductor 242b; and a conductor 294 over the insulator 275. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer included in the capacitor device 292 can also serve as a protective layer provided in the transistor, i.e., the insulator 271 and the insulator 275. Thus, the manufacturing process of the capacitor device 292 can also serve as part of the manufacturing process of the transistor, improving the productivity of the semiconductor device. Furthermore, one of a pair of electrodes included in the capacitor device 292, that is, the conductor 242b, also serves as the source electrode of the transistor; therefore, the area in which the transistor and the capacitor device are placed can be reduced.

Note that the conductor 294 can be formed using, for example, a material that can be used for the conductor 242.

<Modification Example of Memory Device>

Examples of a semiconductor device of one embodiment of the present invention including the transistor 200 and the capacitor device 292, which are different from the example described above in <Structure example of memory device>, are described below with reference to FIG. 26A, FIG. 26B, and FIG. 27. Note that in the semiconductor devices illustrated in FIG. 26A, FIG. 26B, and FIG. 27, structures having the same function as those included in the semiconductor device described in the above embodiment and <Structure example of memory device> (see FIG. 25) are denoted by the same reference numerals. Note that the materials described in detail in the above embodiment and <Structure example of memory device> can be used as component materials of the transistor 200 and the capacitor device 292 in this section. The memory devices in FIG. 26A, FIG. 26B, FIG. 27, and the like are, but not limited to, the memory device illustrated in FIG. 25.

Modification Example 1 of Memory Device

An example of a semiconductor device 600 of one embodiment of the present invention including a transistor 200a, a transistor 200b, a capacitor device 292a, and a capacitor device 292b is described with reference to FIG. 26A.

Figures 26A, 26B:
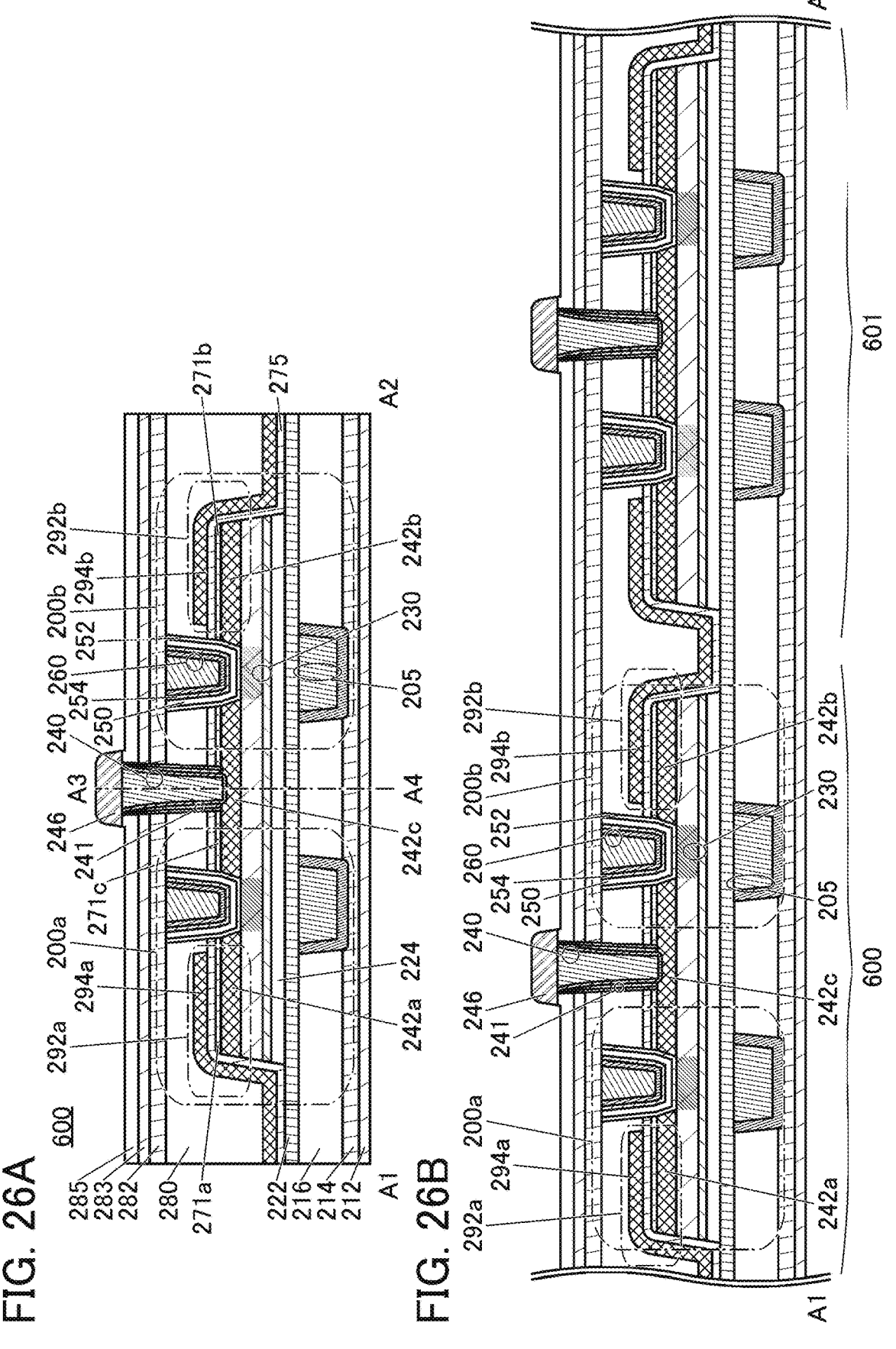
FIG. 26A and FIG. 26B are cross-sectional views of semiconductor devices of one embodiment of the present invention.
Figure 27:
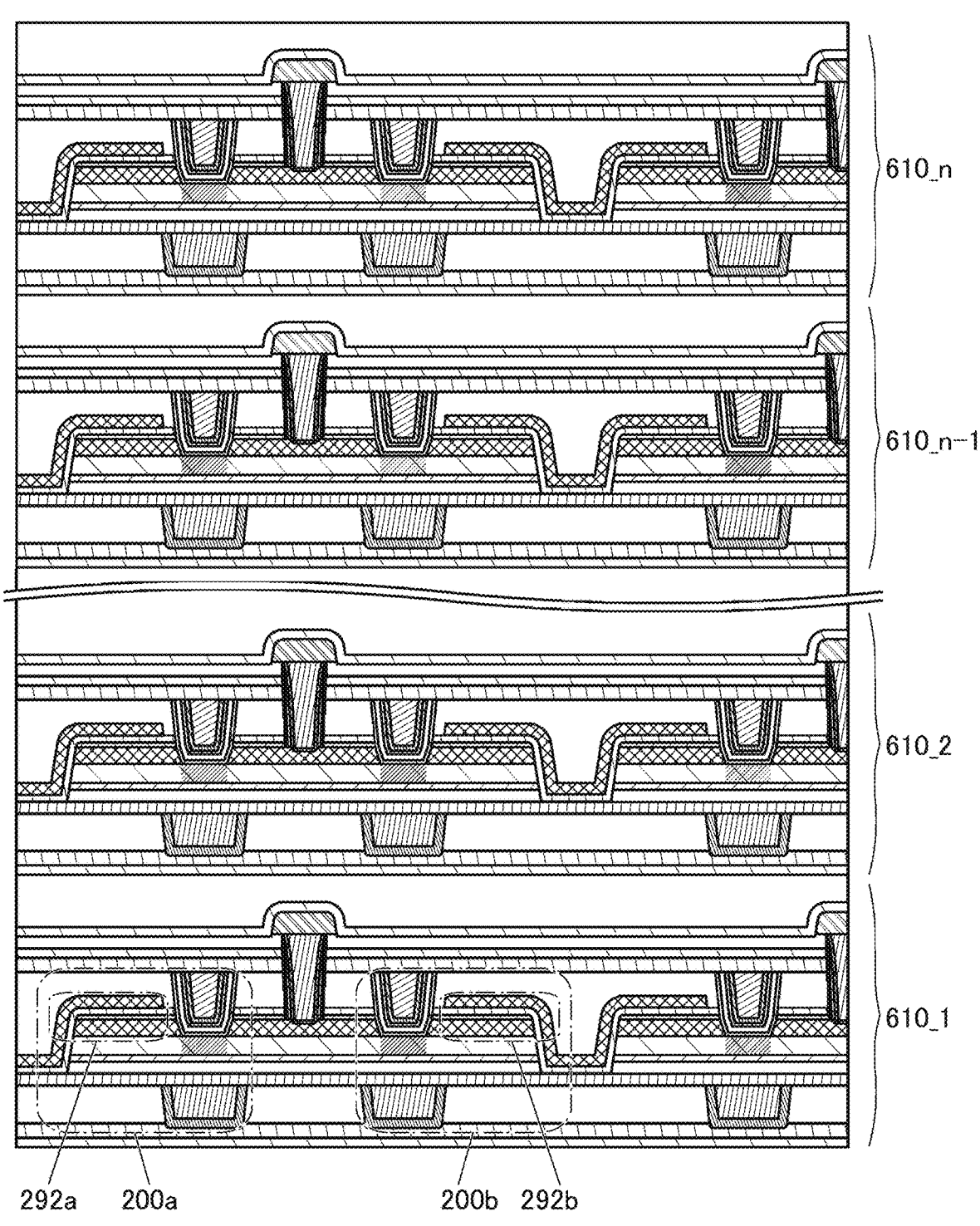
FIG. 27 is a cross-sectional view of a semiconductor device of one embodiment of the present invention.

FIG. 26A is a cross-sectional view of the semiconductor device 600 including the transistor 200*a*, the transistor 200*b*, the capacitor device 292*a*, and the capacitor device 292*b* in the channel length direction. Here, the capacitor device 292*a* includes the conductor 242*a*; the insulator 271*a* over the conductor 242*a*; the insulator 275 in contact with a top surface of the insulator 271*a*, a side surface of the insulator 271*a*, and a side surface of the conductor 242*a*; and a conductor 294*a* over the insulator 275. The capacitor device 292*b* includes the conductor 242*b*; the insulator 271*b* over the conductor 242*b*; the insulator 275 in contact with the top surface of the insulator 271*b*, the side surface of the insulator 271*b*, and the side surface of the conductor 242*b*; and a conductor 294*b* over the insulator 275.

The semiconductor device 600 has a line-symmetric structure with respect to dashed-dotted line A3-A4 as shown in FIG. 26A. A conductor 242*c* serves as both one of a source electrode and a drain electrode of the transistor 200*a* and one of a source electrode and a drain electrode of the transistor 200*b*. An insulator 271*c* is provided over the conductor 242*c*. In addition, the conductor 240 functioning as a plug also connects the conductor 246 functioning as a wiring to the transistor 200*a* and the transistor 200*b*. With the above connection structure between the two transistors, the two capacitor devices, the wiring, and the plug, a semiconductor device that can be miniaturized or highly integrated can be provided.

The structure examples of the semiconductor device illustrated in FIG. 26A can be referred to for the structures and the effects of the transistor 200*a*, the transistor 200*b*, the capacitor device 292*a*, and the capacitor device 292*b*.

Modification Example 2 of Memory Device

In the above description, the transistor 200*a*, the transistor 200*b*, the capacitor device 292*a*, and the capacitor device 292*b* are given as examples of components of the semiconductor device; however, the semiconductor device described in this embodiment is not limited thereto. For example, as shown in FIG. 26B, a structure in which the semiconductor device 600 and a semiconductor device having a structure similar to that of the semiconductor device 600 are connected through a capacitor portion may be employed. In this specification, the semiconductor device including the transistor 200*a*, the transistor 200*b*, the capacitor device 292*a*, and the capacitor device 292*b* is referred to as a cell. For the structures of the transistor 200*a*, the transistor 200*b*, the capacitor device 292*a*, and the capacitor device 292*b*, the above description of the transistor 200*a*, the transistor 200*b*, the capacitor device 292*a*, and the capacitor device 292*b* can be referred to.

FIG. 26B is a cross-sectional view in which the semiconductor device 600 including the transistor 200*a*, the transistor 200*b*, the capacitor device 292*a*, and the capacitor device 292*b*, and a cell having a structure similar to that of the semiconductor device 600 are connected through a capacitor portion.

As illustrated in FIG. 26B, the conductor 294*b* functioning as one electrode of the capacitor device 292*b* included in the semiconductor device 600 also serves as one electrode of a capacitor device included in a semiconductor device 601 having a structure similar to that of the semiconductor device 600. Although not illustrated, the conductor 294*a* functioning as one electrode of the capacitor device 292*a* included in the semiconductor device 600 also serves as one electrode of a capacitor device included in a semiconductor device on the left side of the semiconductor device 600, that is, a semiconductor device adjacent to the semiconductor device 600 in the A1 direction in FIG. 26B. The cell on the right side of the semiconductor device 601, that is, the cell in the A2 direction in FIG. 26B, has a similar structure. That is, a cell array (also referred to as a memory device layer) can be formed. With this structure of the cell array, the space between the adjacent cells can be reduced; thus, the projected area of the cell array can be reduced and high integration can be achieved. When the cells illustrated in FIG. 26B are arranged in a matrix, a matrix-shape cell array can be formed.

When the transistor 200*a*, the transistor 200*b*, the capacitor device 292*a*, and the capacitor device 292*b* are formed to have the structures described in this embodiment as described above, the area of the cell can be reduced and the semiconductor device including a cell array can be miniaturized or highly integrated.

Furthermore, the cell array may have a stacked-layer structure instead of a single-layer structure. FIG. 27 illustrates a cross-sectional view of n layers of cell arrays 610 that are stacked. When a plurality of cell arrays (a cell array 610_1 to a cell array 610_*n*) are stacked as illustrated in FIG. 27, cells can be integrally positioned without increasing the area occupied by the cell arrays. In other words, a 3D cell array can be formed.

At least part of the structure, method, and the like described in this embodiment can be implemented in appropriate combination with any of those in the other embodiments and the other examples described in this specification.

Embodiment 4

In this embodiment, a storage device including a transistor in which an oxide is used as a semiconductor (hereinafter, sometimes referred to as an OS transistor) and a capacitor (hereinafter, sometimes referred to as an OS memory device) of one embodiment of the present invention is described with reference to FIG. 28A, FIG. 28B, and FIG. 29A to FIG. 29H. The OS memory device is a storage device that includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Storage Device>

Figures 28A, 28B:
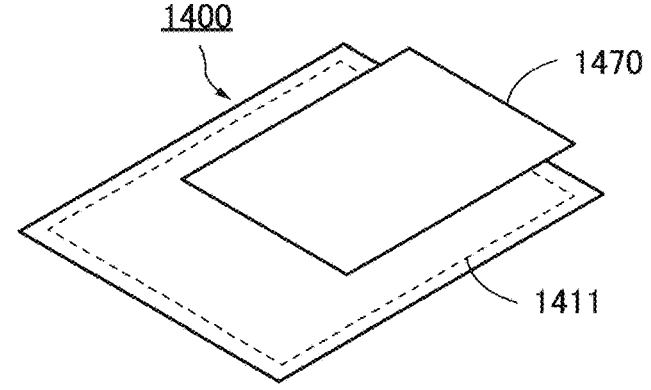
FIG. 28A is a block diagram illustrating a structure example of a storage device of one embodiment of the present invention.
FIG. 28B is a perspective view illustrating a structure example of the storage device of one embodiment of the present invention.

FIG. 28A illustrates a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Note that FIG. 28A illustrates an example in which peripheral circuit 1411 and the memory cell array 1470 are formed on the same plane; however, this embodiment is not limited thereto. For example, as illustrated in FIG. 28B, the memory cell array 1470 may be provided to overlap part of the peripheral circuit 1411. For example, the sense amplifier may be provided below the memory cell array 1470 so that they overlap with each other.

FIG. 29A to FIG. 29H illustrate structure examples of a memory cell that can be applied to the memory cell MC.

[DOSRAM]

Figure 29A:
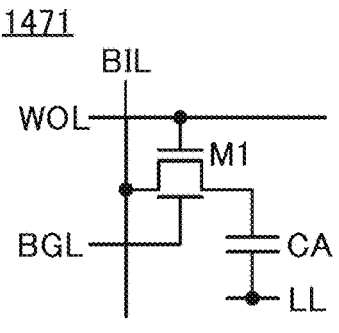
FIG. 29A to FIG. 29H are circuit diagrams illustrating structure examples of storage devices of one embodiment of the present invention.
Figure 29B:
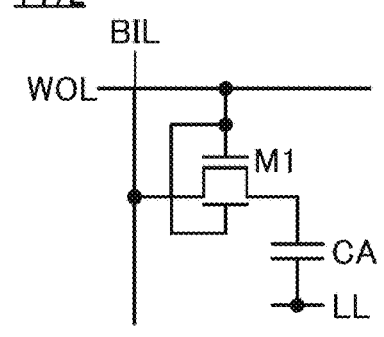
Figure 29C:
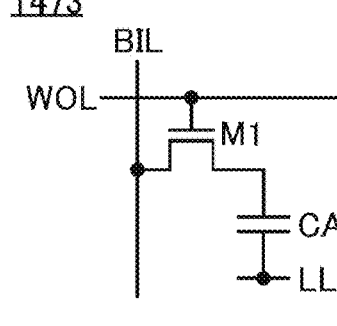

FIG. 29A to FIG. 29C illustrate circuit structure examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 in FIG. 29A includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. In the time of data writing and data reading, the wiring LL may be at a ground potential or a low-level potential. The wiring BGL functions as a wiring for applying a potential to the back gate of the transistor M1. When a given potential is applied to the wiring BGL, the threshold voltage of the transistor M1 can be increased or decreased.

Here, the memory cell 1471 shown in FIG. 29A corresponds to the storage device illustrated in FIG. 25. That is, the transistor M1 and the capacitor CA correspond to the transistor 200 and the capacitor device 292, respectively.

The circuit structure of the memory cell MC is not limited to that of the memory cell 1471, and the circuit structure can be changed. For example, like a memory cell 1472 in FIG. 29B, a structure may be used in which the back gate of the transistor M1 is connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 29C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. Alternatively, refresh operation for the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. This reduces bit line capacitance, which can reduce the storage capacitance of the memory cell.

[NOSRAM]

FIG. 29D to FIG. 29G each illustrate a circuit structure example of a gain-cell memory cell including two transistors and one capacitor. A memory cell 1474 illustrated in FIG. 29D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing and data reading, a high-level potential is preferably applied to the wiring CAL. In the time of data retaining, a low-level potential is preferably applied to the wiring CAL. The wiring BGL functions as a wiring for applying a potential to the back gate of the transistor M2. The threshold voltage of the transistor M2 can be increased or decreased by applying a given potential to the wiring BGL.

Figure 29D:
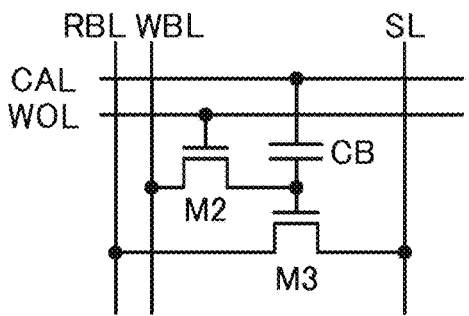
Figure 29E:
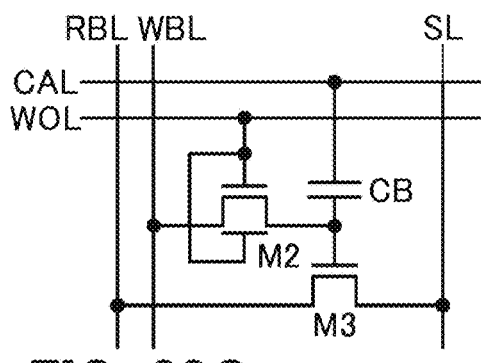
Figure 29F:
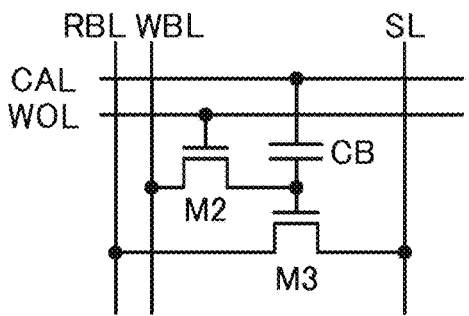
Figure 29G:
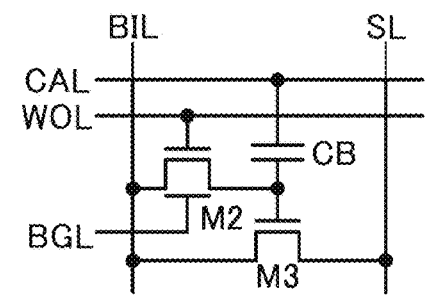

Here, the memory cell 1474 illustrated in FIG. 29D corresponds to the storage device illustrated in FIG. 23 and FIG. 24. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The circuit structure of the memory cell MC is not limited to that of the memory cell 1474, and the circuit structure can be changed as appropriate. For example, like a memory cell 1475 in FIG. 29E, a structure may be used in which the back gate of the transistor M2 is connected not to the wiring BGL but to the wiring WOL in the memory cell MC. Alternatively, for example, like a memory cell 1476 in FIG. 29F, the memory cell MC may be a memory cell including a single-gate transistor, that is, the transistor M2 that does not include a back gate. For example, the memory cell MC may have a structure in which the wiring WBL and the wiring RBL are combined into one wiring BIL as in a memory cell 1477 in FIG. 29G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long time, and thus the frequency of the refresh operation for the memory cell can be decreased. Alternatively, refresh operation for the memory cell can be unnecessary. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, sometimes referred to as a Si transistor). The Si transistor may be either an n-channel transistor or a p-channel transistor. A Si transistor has higher field-effect mobility than an OS transistor in some cases. Therefore, a Si transistor may be used as the transistor M3 functioning as a reading transistor. Furthermore, the use of a Si transistor as the transistor M3 enables the transistor M2 to be stacked over the transistor M3, in which case the area occupied by the memory cell can be reduced and high integration of the storage device can be achieved.

Alternatively, the transistor M3 may be an OS transistor. When an OS transistor is used as each of the transistor M2 and the transistor M3, the circuit of the memory cell array 1470 can be formed using only n-channel transistors.

Figure 29H:
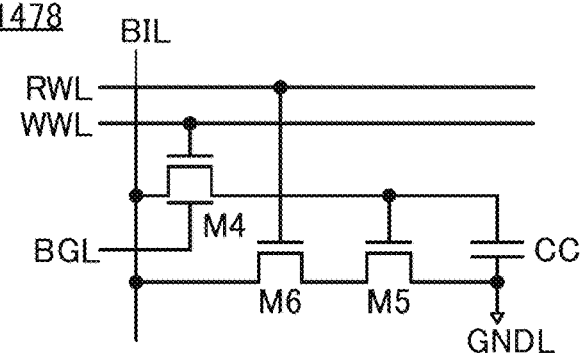

FIG. 29H illustrates an example of a gain-cell type memory cell including three transistors and one capacitor. A memory cell 1478 in FIG. 29H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate, and the back gate is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in any of the above embodiments is used in the memory cell

1478, the transistor 200 can be used as the transistor M4, the transistors 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure, method, and the like described in this embodiment can be used in an appropriate combination with any of other structures, methods, and the like described in this embodiment or the other embodiments.

Embodiment 5

In this embodiment, an example of a chip 1200 on which the semiconductor device of the present invention is mounted will be described with reference to FIG. 30A and FIG. 30B. A plurality of circuits (systems) are mounted on the chip 1200. A technique for integrating a plurality of circuits (systems) into one chip is referred to as system on chip (SoC) in some cases.

Figure 30A:
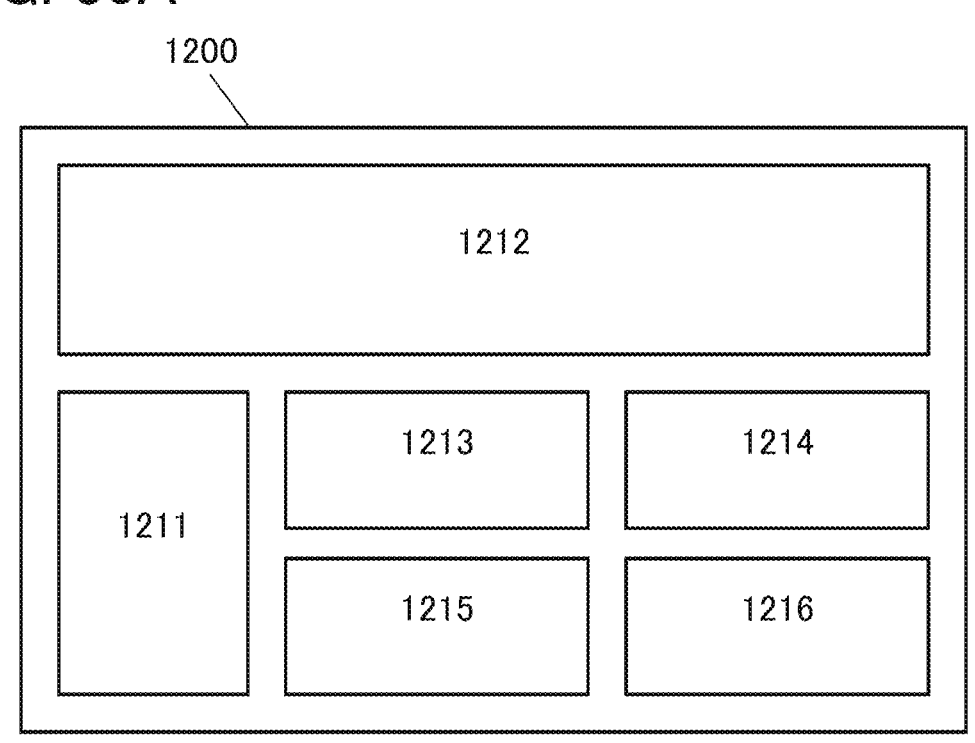
FIG. 30A and FIG. 30B are schematic views of a semiconductor device of one embodiment of the present invention.

As illustrated in FIG. 30A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 30B:
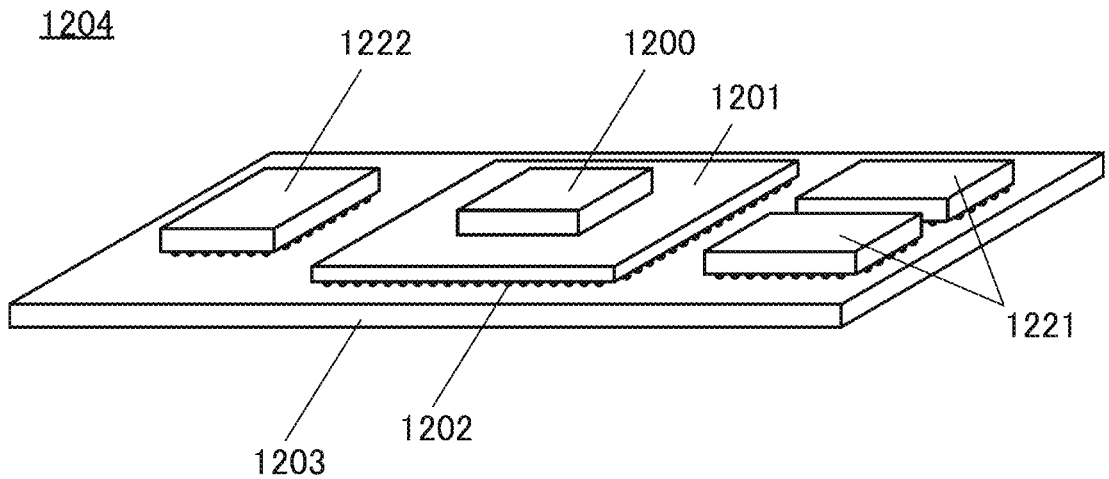

A bump (not illustrated) is provided on the chip 1200, and as illustrated in FIG. 30B, the chip 1200 is connected to a first surface of a package board 1201. In addition, a plurality of bumps 1202 are provided on a rear side of the first surface of the package board 1201, and the package board 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the package board 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

At least part of the structure, method, and the like described in this embodiment can be implemented in appropriate combination with any of those in the other embodiments and the other examples described in this specification.

Embodiment 6

In this embodiment, examples of electronic components and electronic devices in which the storage device or the like described in the above embodiment is incorporated are described.

<Electronic Components>

First, examples of electronic components in which a storage device 720 is incorporated are described with reference to FIG. 31A and FIG. 31B.

Figures 31A, 31B:
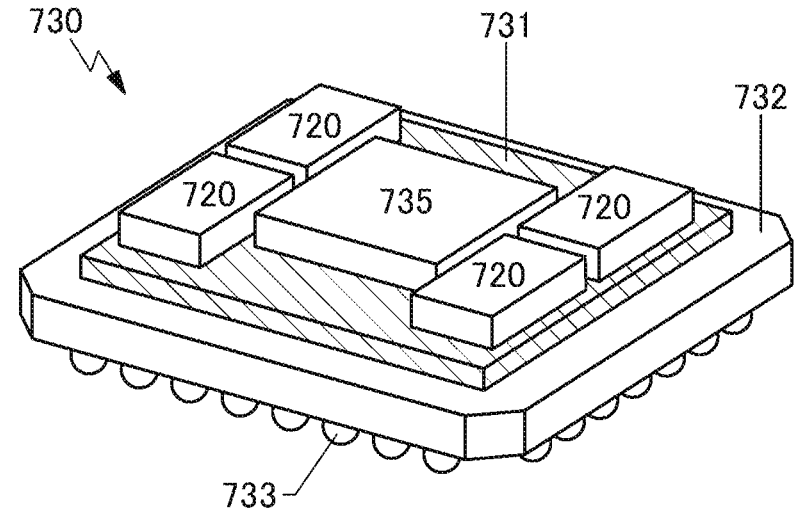
FIG. 31A and FIG. 31B are diagrams illustrating examples of electronic components.

FIG. 31A is a perspective view of an electronic component 700 and a substrate (a mounting board 704) on which the electronic component 700 is mounted. The electronic component 700 illustrated in FIG. 31A includes the storage device 720 in a mold 711. FIG. 31A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the mounting board 704.

The storage device 720 includes a driver circuit layer 721 and a storage circuit layer 722.

FIG. 31B is a perspective view of an electronic component 730. The electronic component 730 is an example of a SiP (System in package) or an MCM (Multi Chip Module). In the electronic component 730, an interposer 731 is provided over a package board 732 (printed circuit board) and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package board 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. The interposer 731 has a function of electrically connecting an integrated circuit provided on the interposer 731 to an electrode provided on the package board 732. Accordingly, the interposer is referred to as a "redistribution substrate" or an "intermediate substrate" in some cases. A through electrode may be provided in the interposer 731 to be used for electrically connecting the integrated circuit and the package board 732. In the case of using a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (radiator plate) may be provided to overlap the electronic component 730. In the case of providing a heat sink, the heights of integrated circuits provided on the interposer 731 are preferably the same. In the electronic component 730 of this embodiment, the heights of the storage device 720 and the semiconductor device 735 are preferably the same, for example.

An electrode 733 may be provided on the bottom portion of the package board 732 to mount the electronic component 730 on another substrate. FIG. 31B shows an example in which the electrodes 733 are formed of solder balls. Solder balls are provided in a matrix on the bottom portion of the package board 732, whereby a BGA (Ball Grid Array) can be achieved. Alternatively, the electrode 733 may be formed of a conductive pin. When conductive pins are provided in a matrix on the bottom portion of the package board 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

The structure, method, and the like described in this embodiment can be used in an appropriate combination with any of other structures, methods, and the like described in this embodiment or the other embodiments.

Embodiment 7

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 32A to FIG. 32E schematically show some structure examples of removable storage devices. The semiconductor device described in the above embodiment is processed into a packaged memory chip and used in a variety of storage devices and removable memories, for example.

Figure 32A:
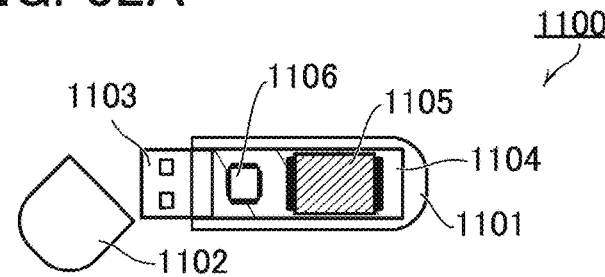
FIG. 32A to FIG. 32E are schematic views of storage devices of one embodiment of the present invention.

FIG. 32A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figures 32B, 32C:
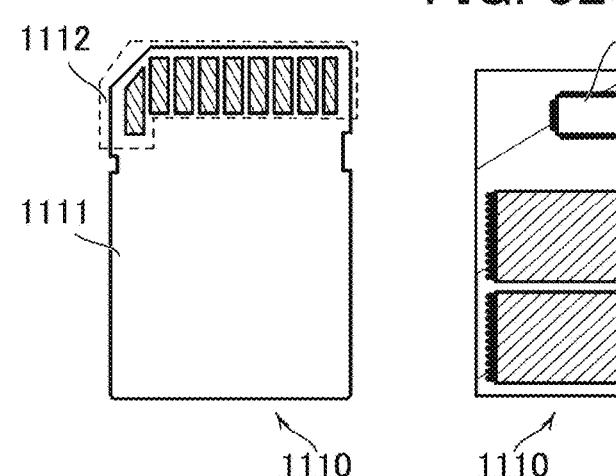

FIG. 32B is a schematic external diagram of an SD card, and FIG. 32C is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figures 32D, 32E:
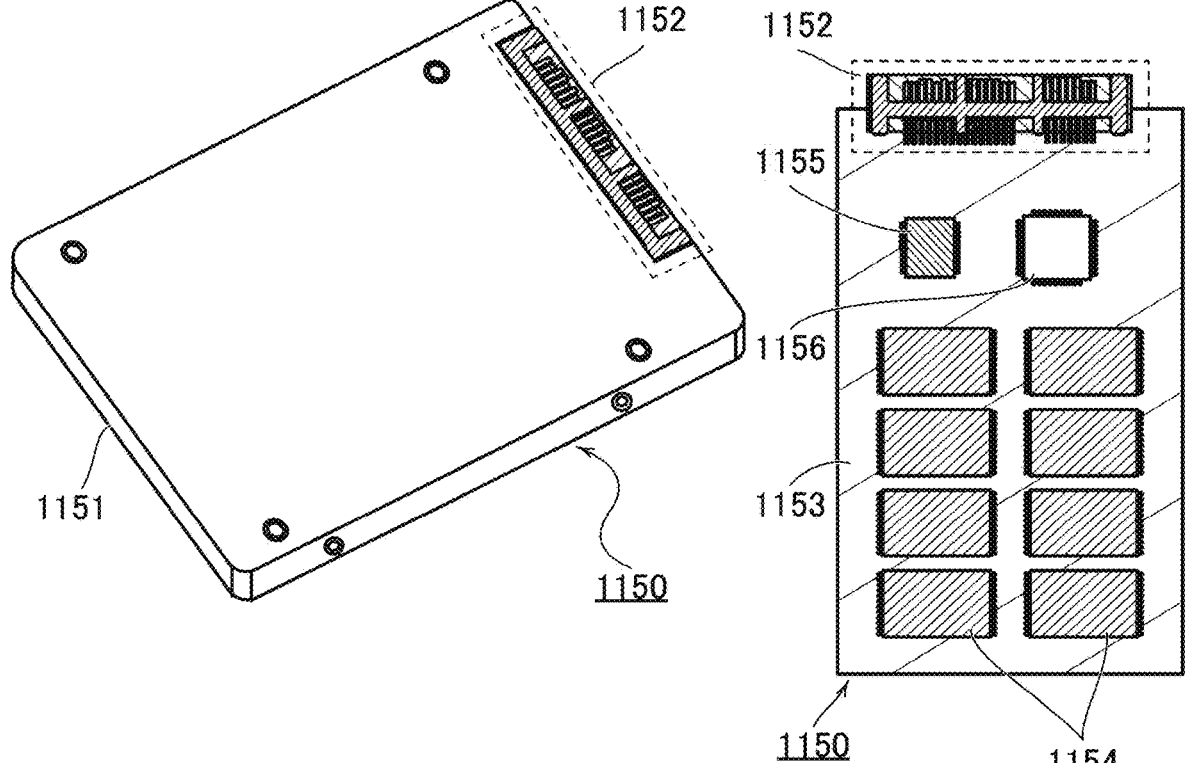

FIG. 32D is a schematic external diagram of an SSD, and FIG. 32E is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

At least part of the structure, method, and the like described in this embodiment can be implemented in appropriate combination with any of those in the other embodiments and the other examples described in this specification.

Embodiment 8

The semiconductor device of one embodiment of the present invention can be used as a processor such as a CPU and a GPU or a chip. FIG. 33A to FIG. 33H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, information, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 33A to FIG. 33H show examples of electronic devices.

[Information Terminal]

Figure 33A:
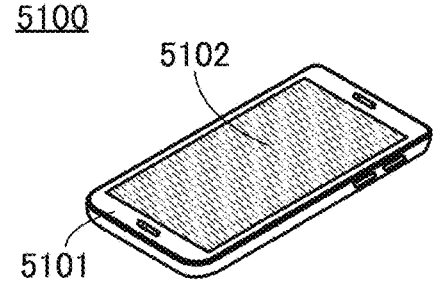
FIG. 33A to FIG. 33H are diagrams illustrating electronic devices of one embodiment of the present invention.

FIG. 33A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 33B:
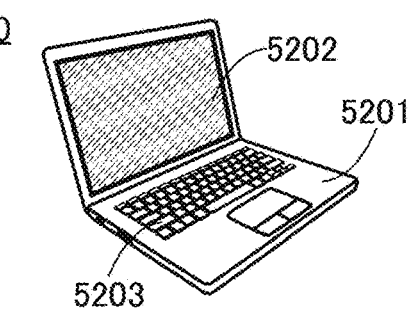

FIG. 33B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 33A and FIG. 33B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 33C:
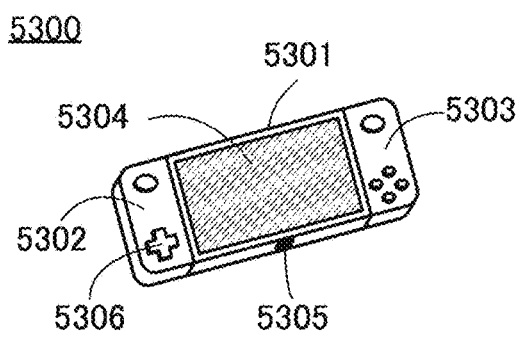

FIG. 33C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 33D:
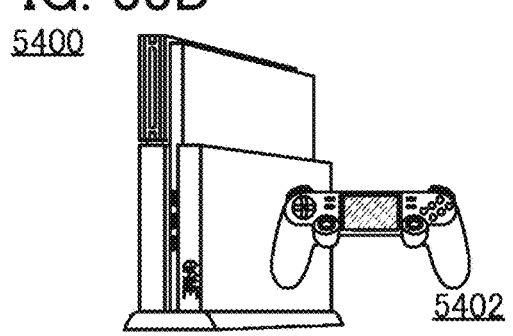

FIG. 33D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 33C and FIG. 33D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 33E:
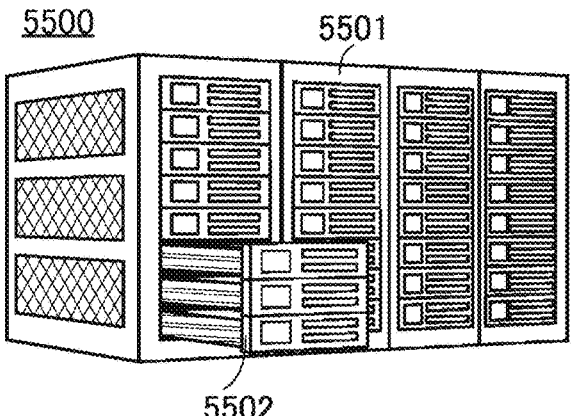
Figure 33F:
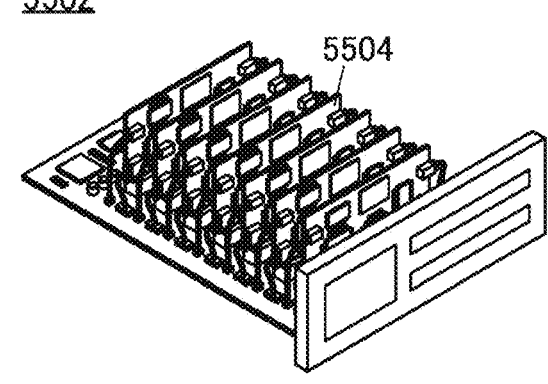

FIG. 33E shows a supercomputer 5500 as an example of a large computer. FIG. 33F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is shown as an example of a large computer in FIG. 33E and FIG. 33F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 33G:
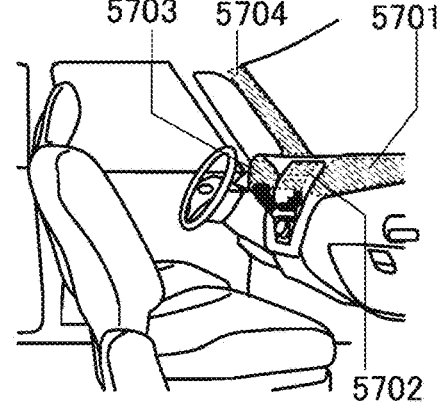

FIG. 33G shows an area around a windshield inside an automobile, which is an example of a moving vehicle. FIG. 33G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 33H:
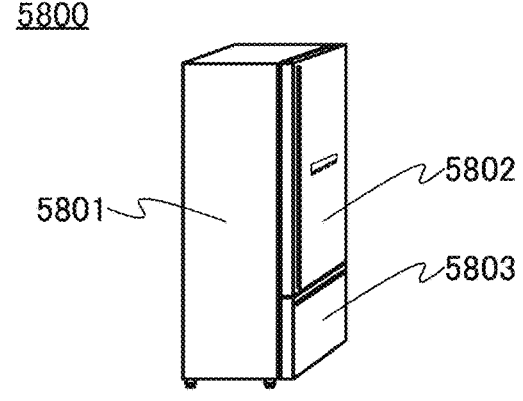

FIG. 33H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like. Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments and the other examples described in this specification.

Example 1

In this example, TDS analysis was performed on samples that had been subjected to microwave treatment after formation of insulators. Note that in this example, three kinds of samples (Sample 1A, Sample 1B, and Sample 1C) were fabricated.

<Structure and Fabrication Method of Each Sample>

Figure 34A:
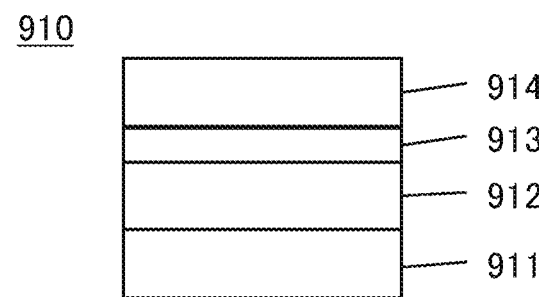
FIG. 34A is a schematic view of a sample in Example.

Sample 1A to Sample 1C in this example will be described below. First, FIG. 34A shows a structure 910 of Sample 1A to Sample 1C. Each sample includes a substrate 911, an insulator 912 over the substrate 911, an insulator 913 over the insulator 912, and an insulator 914 over the insulator 913.

Here, conditions for microwave treatment performed after deposition of the insulator 914 partly differ among Sample 1A to Sample 1C. Table 1 shows the conditions for the microwave treatment on Sample 1A to Sample 1C. Note that "-" in Table 1 indicates that no microwave treatment was performed.

TABLE 1

| Sample name | Temperature in microwave treatment [° C.] |
|---|---|
| Sample 1A | — |
| Sample 1B | 400 |
| Sample 1C | 250 |

Next, fabrication methods of Sample 1A to Sample 1C will be described.

First, a silicon substrate was prepared as the substrate 911. Then, a 100-nm-thick thermal oxide film was formed as the insulator 912 over the substrate 911.

Next, a 1-nm-thick aluminum oxide was formed as the insulator 913 over the insulator 912 by an ALD method.

Then, a 20-nm-thick silicon oxide was formed as the insulator 914 over the insulator 913 by a PEALD method. Note that for the deposition of the insulator 914, an organic precursor was used, the pressure of a reaction chamber was set to 400 Pa, the deposition temperature was set to 250° C., and the deposition power was set to 100 W.

Next, microwave treatment was performed on Sample 1B and Sample 1C. In the microwave treatment, the oxygen gas flow rate was set to 50 sccm, the argon gas flow rate was set to 150 sccm, the pressure of the reaction chamber was set to 400 Pa, the power was set to 4000 W, and the processing time was set to 10 minutes. Note that no microwave treatment was performed on Sample 1A.

Through the above steps, Sample 1A to Sample 1C of this example were fabricated.

<TDS Measurement Results of Each Sample>

The amount of water molecules released from the insulator 914 was measured for Sample 1A to Sample 1C.

In the TDS analysis, the amount of a released gas with a mass-to-charge ratio $m/z=18$, which corresponds to water molecules, was measured. WA1000S produced by ESCO Ltd. was used as a TDS analysis apparatus. In the TDS analysis, the substrate temperature was set within a range of higher than or equal to 50° C. and lower than or equal to 600° C., and the temperature raising rate was set at 30° C./min.

Figure 34B:
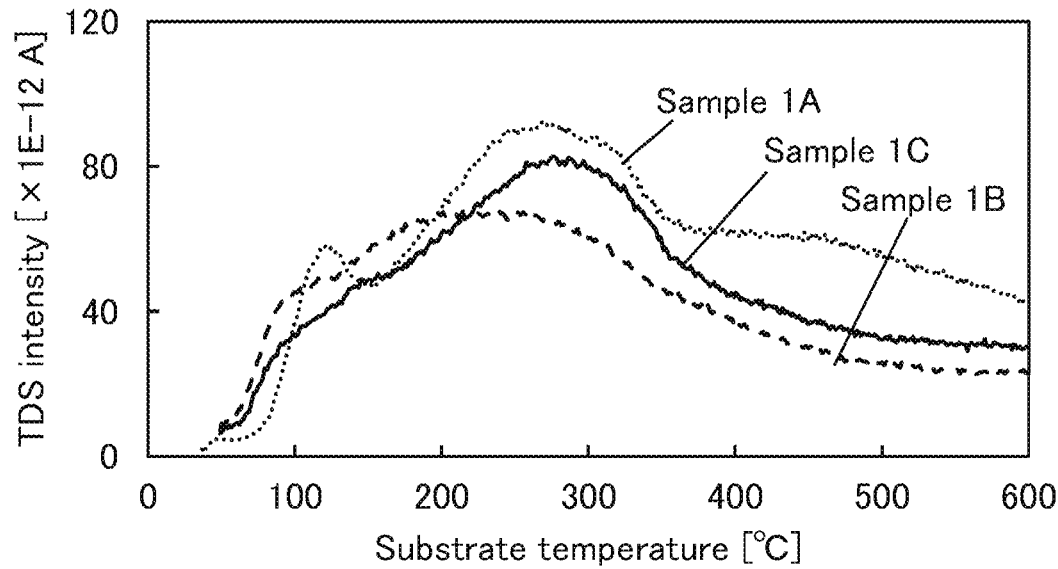
FIG. 34B is a graph showing TDS analysis results in Example.

FIG. 34B shows desorption profiles with a mass-to-charge ratio m/z=18. In FIG. 34B, the horizontal axis represents substrate temperature [° C.] and the vertical axis represents TDS intensity [$\times 10^{-12}$ A] relating to a mass-to-charge ratio m/z=18.

It was found from FIG. 34B that the amount of water molecules released from the insulator 914 in each sample varied depending on the temperature of the microwave treatment performed after formation of the insulator 914. That is, it was found that as the temperature at the time of the microwave treatment was increased, the amount of water molecules released from the insulator 914 was decreased.

Specifically, the amount of water molecules released from the insulator 914 in Sample 1A was $4.0 \times 10^{15}$ molecules/ $cm^2$. The amount of water molecules released from the insulator 914 in Sample 1B was $2.3 \times 10^{15}$ molecules/$cm^2$. The amount of water molecules released from the insulator 914 in Sample 1C was $2.7 \times 10^{15}$ molecules/$cm^2$.

According to FIG. 34B, at substrate temperatures higher than or equal to 400° C., Sample 1B had the lowest TDS intensity, followed by Sample 1C and Sample 1A in this order. The microwave treatment can lower the peak (γ peak) of desorption in a range of up to approximately 750° C. Note that as described in Embodiment 1, the γ peak is also a peak of desorption at 400° C. or higher. In other words, microwave treatment can reduce water molecules released at 400° C. or higher. In addition, it was found that water molecules released at 400° C. or higher was able to be reduced even when the temperature at which microwave treatment was performed was 250° C.

At least part of the structure, method, and the like described in this example can be implemented in appropriate combination with any of those in the other embodiments and the other examples described in this specification.

Example 2

In this example, samples each including part of the structure included in the transistor described in the above embodiment were fabricated, and oxidation of a side surface of a conductor was evaluated. In this example, Sample 2A to Sample 2C in each of which part of the structure included in the transistor 200 illustrated in FIG. 6A to FIG. 6D was provided were fabricated.

<Structure and Fabrication Method of Each Sample>

Figure 35:
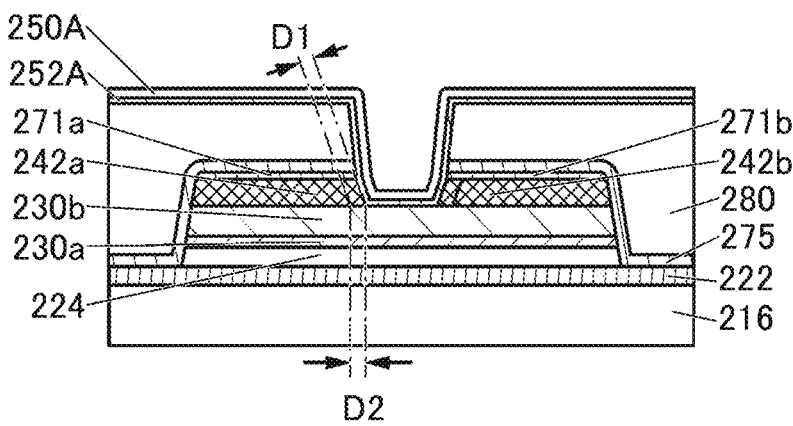
FIG. 35 is a schematic view of a sample in Example.

Sample 2A to Sample 2C in this example will be described below. First, FIG. 35 shows a structure 900 of Sample 2A to Sample 2C. Each sample includes the insulator 216 over a substrate (not illustrated), the insulator 222 over the insulator 216, the insulator 224 over the insulator 222, the oxide 230a over the insulator 224, the oxide 230b over the oxide 230a, the conductor 242a over the oxide 230b, the insulator 271a over the conductor 242a, the conductor 242b over the oxide 230b, the insulator 271b over the conductor 242b, the insulator 275 provided over the insulator 222, the insulator 224, the oxide 230a, the oxide 230b, the conductor 242a, the conductor 242b, the insulator 271a, and the insulator 271b, the insulator 280 over the insulator 275, the insulating film 252A over the insulator 280 and the oxide 230b, and the insulating film 250A over the insulating film 252A.

The materials used in the above structure are described below. Note that the thickness described below is a target thickness at the deposition. As the insulator 216, silicon oxynitride was used. As the insulator 222, a 20-nm-thick hafnium oxide was used, and a 10-nm-thick silicon oxide was used as the insulator 224. As the oxide 230a, a 5-nm-thick In—Ga—Zn oxide deposited by a sputtering method using an oxide target with In:Ga:Zn=1:3:4 [atomic ratio] was used. As the oxide 230b, a 15-nm-thick In—Ga—Zn oxide deposited by a sputtering method using an oxide target with In:Ga:Zn=1:1:1 [atomic ratio] was used. As each of the conductor 242a and the conductor 242b, a 20-nm-thick tantalum nitride was used. As each of the insulator 271a and the insulator 271b, a 5-nm-thick aluminum oxide was used. As the insulator 275, a stacked-layer insulating film of a 5-nm-thick aluminum oxide and a 5-nm-thick silicon nitride provided thereover was used. As the insulator 280, silicon oxide was used. As the insulating film 252A, a 1-nm-thick aluminum oxide deposited by an ALD method was used. As the insulating film 250A, a 10-nm-thick silicon oxide deposited by a PEALD method was used.

After an oxide film to be the oxide 230b was deposited, atmospheric pressure heat treatment was performed at 400° C. for two hour in a mixed atmosphere of an nitrogen flow rate of 4 slm and an oxygen flow rate of 1 slm.

After the deposition of the insulating film 250A, microwave treatment was performed. Note that conditions for the microwave treatment partly differ among Sample 2A to Sample 2C. Table 2 shows the conditions for the microwave treatment on Sample 2A to Sample 2C. Note that "-" in Table 2 means that no microwave treatment was performed.

TABLE 2

| Sample name | Temperature in microwave treatment [° C.] |
|---|---|
| Sample 2A | — |
| Sample 2B | 400 |
| Sample 2C | 250 |

For the conditions for the microwave treatment, which were common to Sample 2A to Sample 2C, an argon gas at 150 sccm and an oxygen gas at 50 sccm were used as treatment gases, the power was set to 4000 W, the pressure was set to 400 Pa, and the processing time was set to 600 seconds.

Through the above steps, Sample 2A to Sample 2C of this example were fabricated. Note that D1 indicated in FIG. 35 is an oxide thickness of tantalum nitride at a side end portion of the conductor 242, and D2 indicated in FIG. 35 is an oxide thickness of tantalum nitride at a lower side end portion of the conductor 242. Here, the lower side end portion of the conductor 242 corresponds to a position of a side end portion of the conductor 242, which is in contact with the oxide 230b.

<Observation of Cross-Sectional STEM Image>

Cross-sectional STEM images of fabricated Sample 2A to Sample 2C were taken with "HD-2700" manufactured by Hitachi High-Technologies Corporation at an acceleration voltage of 200 kV. FIG. 36A to FIG. 36C show the taken cross-sectional STEM images. FIG. 36A corresponds to Sample 2A, FIG. 36B corresponds to Sample 2B, and FIG. 36C corresponds to Sample 2C.

Here, in each of the samples shown in FIG. 36A to FIG. 36C, an oxide thickness of tantalum nitride at a side end portion of the conductor 242 (hereinafter referred to as a thickness D1), an oxide thickness of tantalum nitride at a lower side end portion of the conductor 242 (hereinafter referred to as a thickness D2) were measured.

Figure 37:
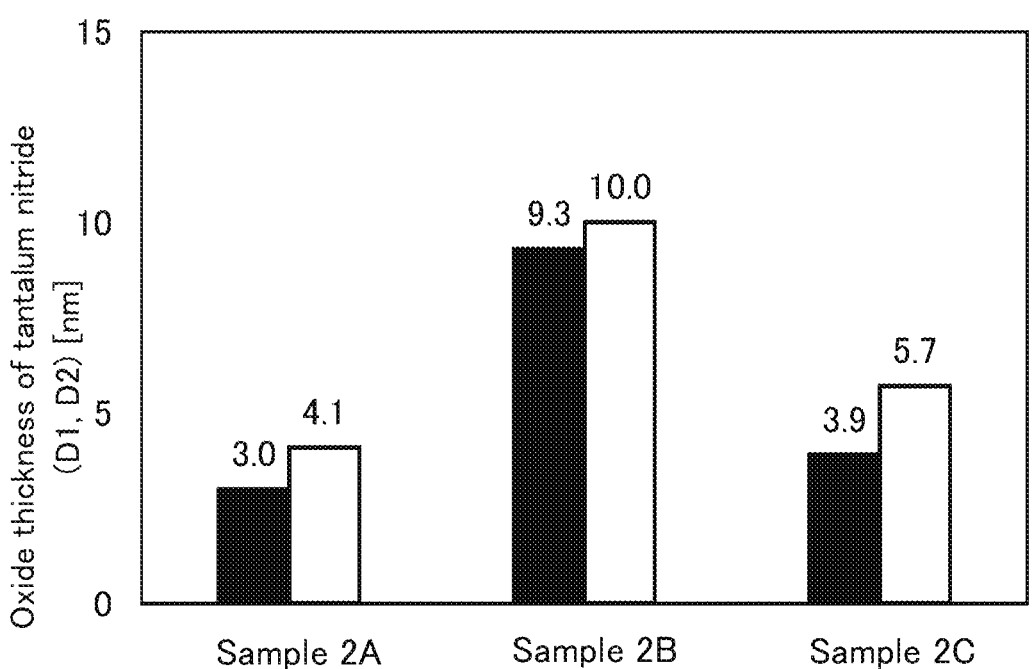
FIG. 37 is a graph showing an oxide thickness of tantalum nitride in Example.

FIG. 37 shows the measurement results. In FIG. 37, the vertical axis represents an oxide thickness of tantalum nitride (D1 and D2) [nm]. A black bar represents the thickness D1 of the sample, and a white bar represents the thickness D2 of the sample. Note that the thickness D1 shown in FIG. 37 is an average value of an oxide thickness of tantalum nitride at a side end portion of the conductor 242*a* and an oxide thickness of tantalum nitride at a side end portion of the conductor 242*b*. Furthermore, the thickness D2 shown in FIG. 37 is an average value of an oxide thickness of tantalum nitride at a lower side end portion of the conductor 242*a* and an oxide thickness of tantalum nitride at a lower side end portion of the conductor 242*b*.

FIG. 37 indicates that the oxide thickness of tantalum nitride can be small when microwave treatment after deposition of the insulating film 250A is performed at low temperatures (250° C. in this example). That is, the microwave treatment at low temperatures (250° C. in this example) can inhibit oxidation of the side surfaces (the side end portion and the lower side end portion) of the conductor 242. For example, the temperature range of the microwave treatment may be higher than or equal to 150° C. and lower than or equal to 400° C. or higher than or equal to 200° C. and lower than or equal to 300° C., for example, approximately 250° C. Thus, the on-state current, field effect mobility, and frequency characteristics of the transistor can be improved.

At least part of the structure, method, and the like described in this example can be implemented in appropriate combination with any of those in the other embodiments and the other examples described in this specification.

REFERENCE NUMERALS

11: insulating film, 100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200*a*: transistor, 200*b*: transistor, 205: conductor, 205*a*: conductor, 205*b*: conductor, 210: insulator, 212: insulator, 214: insulator, 216: insulator, 217: insulator, 218: conductor, 222: insulator, 224: insulator, 224A: insulating film, 230: oxide, 230*a*: oxide, 230A: oxide film, 230*b*: oxide, 230B: oxide film, 230*ba*: region, 230*bb*: region, 230*bc*: region, 240: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductive layer, 242*c*: conductor, 243*a*: oxide, 243*b*: oxide, 246: conductor, 246*a*: conductor, 246*b*: conductor, 250: insulator, 250*a*: insulator, 250A: insulating film, 250*b*: insulator, 252: insulator, 252A: insulating film, 254: insulator, 254A: insulating film, 260: conductor, 260*a*: conductor, 260*b*: conductor, 265: sealing portion, 271: insulator, 271*a*: insulator, 271A: insulating film, 271*b*: insulator, 271B: insulating layer, 271*c*: insulator, 274: insulator, 275: insulator, 280: insulator, 282: insulator, 283: insulator, 285: insulator, 290: memory device, 292: capacitor device, 292*a*: capacitor device, 292*b*: capacitor device, 294: conductor, 294*a*: conductor, 294*b*: conductor, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: opening region, 500: semiconductor device, 600: semiconductor device, 601: semiconductor device, 610: cell array, 610_*n*: cell array, 610_1: cell array, 700: electronic component, 702: printed circuit board, 704: mounting board, 711: mold, 712: land, 713: electrode pad, 714: wire, 720: storage device, 721: driver circuit layer, 722: storage circuit layer, 730: electronic component, 731: interposer, 732: package board, 733: electrode, 735: semiconductor device, 900: structure, 910: structure, 911: substrate, 912: insulator, 913: insulator, 914: insulator, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: package board, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 2700: manufacturing apparatus, 2701: atmosphere-side substrate supply chamber, 2702: atmosphere-side substrate transfer chamber, 2703*a*: load lock chamber, 2703*b*: unload lock chamber, 2704: transfer chamber, 2706*a*: chamber, 2706*b*: chamber, 2706*c*: chamber, 2706*d*: chamber, 2761: cassette port, 2762: alignment port, 2763*a*: transfer robot, 2763*b*: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2811_*n*: substrate, 2811_*n*−1: substrate, 2811_*n*−2: substrate, 2811_1: substrate, 2811_2: substrate, 2811_3: substrate, 2812: substrate holder, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate holder, 2826: heating mechanism, 2828: vacuum pump, 2829: valve, 2830: exhaust port, 2900: microwave treatment apparatus, 2901: quartz tube, 2902: substrate holder, 2903: heating means, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: type game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A method for manufacturing a semiconductor device, comprising the steps of:

depositing an oxide semiconductor film;

depositing a conductive film over the oxide semiconductor film;

depositing a first insulating film over the conductive film;

processing the oxide semiconductor film, the conductive film, and the first insulating film into an island shape to form a stack of an oxide semiconductor layer, a conductive layer, and a first insulating layer;

forming a second insulating film over the first insulating layer;

processing the second insulating film, the conductive layer, and the first insulating layer to form a first conductor and a second conductor from the conductive layer and form an opening reaching the oxide semiconductor layer in the second insulating film and the first insulating layer;

depositing an aluminum oxide film as a third insulating film by an ALD method to cover the opening;

depositing a silicon oxide film as a fourth insulating film over the third insulating film by an ALD method; and performing microwave treatment at a temperature range of higher than or equal to 200° C. and lower than or equal to 300° C.

2. A method for manufacturing a semiconductor device, comprising the steps of:

depositing an oxide semiconductor film;

depositing a conductive film over the oxide semiconductor film;

depositing a first insulating film over the conductive film;

processing the first insulating film by an etching method to form a first insulating layer;

processing the oxide semiconductor film and the conductive film into an island shape by using the first insulating layer as a mask to form a stack of an oxide semiconductor layer, a conductive layer, and the first insulating layer;

forming a second insulating film over the first insulating layer;

processing the second insulating film and the conductive layer to form a first conductor and a second conductor from the conductive layer and form an opening reaching the oxide semiconductor layer in the second insulating film and the first insulating layer;

depositing an aluminum oxide film as a third insulating film by an ALD method to cover the opening;

depositing a silicon oxide film as a fourth insulating film over the third insulating film by an ALD method at a deposition temperature higher than or equal to 200° C. and lower than or equal to 300° C.; and performing microwave treatment at a temperature range of higher than or equal to 200° C. and lower than or equal to 300° C.

3. The method for manufacturing a semiconductor device, according to claim 2, wherein the fourth insulating film comprises a region having a larger thickness than the third insulating film.

4. The method for manufacturing a semiconductor device, according to claim 1, wherein the microwave treatment is performed using an oxygen gas and an argon gas, and wherein a proportion of a flow rate of the oxygen gas to a total of the flow rate of the oxygen gas and a flow rate of the argon gas is greater than 0% and less than or equal to 50%.

5. The method for manufacturing a semiconductor device, according to claim 1, wherein the oxide semiconductor film is deposited by a sputtering method using a target comprising one or more selected from In, Ga, and Zn.

6. The method for manufacturing a semiconductor device, according to claim 1, wherein each of the first conductor and the second conductor comprises tantalum and nitrogen.

7. The method for manufacturing a semiconductor device, according to claim 1, wherein the first insulating film comprises one of aluminum oxide and silicon nitride.

8. The method for manufacturing a semiconductor device, according to claim 1, wherein by performing the microwave treatment, a hydrogen concentration in the fourth insulating film is reduced.

9. The method for manufacturing a semiconductor device, according to claim 1, further comprising the steps of:

depositing a silicon nitride film as a fifth insulating film over the fourth insulating film by an ALD method; and forming a gate electrode over the fifth insulating film.

10. The method for manufacturing a semiconductor device, according to claim 1, wherein the fourth insulating film comprises a region having a larger thickness than the third insulating film.

11. The method for manufacturing a semiconductor device, according to claim 2, wherein by performing the microwave treatment, a hydrogen concentration in the fourth insulating film is reduced.

12. The method for manufacturing a semiconductor device, according to claim 2, further comprising the steps of:

depositing a silicon nitride film as a fifth insulating film over the fourth insulating film by an ALD method; and forming a gate electrode over the fifth insulating film.

13. The method for manufacturing a semiconductor device, according to claim 2, wherein the oxide semiconductor film is deposited by a sputtering method using a target comprising one or more selected from In, Ga, and Zn.

14. The method for manufacturing a semiconductor device, according to claim 2, wherein each of the first conductor and the second conductor comprises tantalum and nitrogen.

15. The method for manufacturing a semiconductor device, according to claim 2, wherein the first insulating film comprises one of aluminum oxide and silicon nitride.

* * * * *